US011557737B2

(12) United States Patent
Kim et al.

(10) Patent No.: US 11,557,737 B2
(45) Date of Patent: Jan. 17, 2023

(54) COMPOUND, COATING COMPOSITION COMPRISING SAME, ORGANIC LIGHT-EMITTING ELEMENT USING SAME, AND MANUFACTURING METHOD THEREFOR

(71) Applicant: LG Chem, Ltd., Seoul (KR)

(72) Inventors: Young Kwang Kim, Daejeon (KR); Jaesoon Bae, Daejeon (KR); Jaechol Lee, Daejeon (KR); Yongwook Kim, Daejeon (KR); Jiyeon Shin, Daejeon (KR); Beomshin Cho, Daejeon (KR)

(73) Assignee: LG Chem, Ltd.

( * ) Notice: Subject to any disclaimer, the term of this patent is extended or adjusted under 35 U.S.C. 154(b) by 284 days.

(21) Appl. No.: 16/772,920

(22) PCT Filed: Aug. 23, 2019

(86) PCT No.: PCT/KR2019/010744
§ 371 (c)(1),
(2) Date: Jun. 15, 2020

(87) PCT Pub. No.: WO2020/040585
PCT Pub. Date: Feb. 27, 2020

(65) Prior Publication Data
US 2020/0313099 A1    Oct. 1, 2020

(30) Foreign Application Priority Data

Aug. 24, 2018 (KR) .................. 10-2018-0099181

(51) Int. Cl.
*H01L 51/00* (2006.01)
*C07F 7/08* (2006.01)
(Continued)

(52) U.S. Cl.
CPC ........ *H01L 51/0094* (2013.01); *C07F 7/0812* (2013.01); *C09D 5/22* (2013.01);
(Continued)

(58) Field of Classification Search
CPC ............. H01L 51/0094; H01L 51/0003; H01L 51/0005; H01L 51/0054; H01L 51/006;
(Continued)

(56) References Cited

U.S. PATENT DOCUMENTS 10,316,013 B2 *   6/2019   Kim .................... H01L 51/0072
2004/0067387 A1   4/2004   Kim et al.
(Continued)

FOREIGN PATENT DOCUMENTS

CN         110156824 A      8/2019
KR         20040028954 A    4/2004
(Continued)

OTHER PUBLICATIONS

International Search Report for Application No. PCT/KR2019/010744 dated Nov. 28, 2019, 2 pages.

*Primary Examiner* — Vu A Vu
(74) *Attorney, Agent, or Firm* — Lerner, David, Littenberg, Krumholz & Mentlik, LLP

(57) ABSTRACT

The present specification relates to a compound of Formula 1, a coating composition including the compound, an organic light emitting device formed by using the coating composition, and a manufacturing method thereof.

18 Claims, 2 Drawing Sheets

(51) Int. Cl.
  *C09D 5/22* (2006.01)
  *C09D 5/24* (2006.01)
  *C09K 11/06* (2006.01)
  *H01L 51/50* (2006.01)

(52) U.S. Cl.
  CPC ............. C09D 5/24 (2013.01); C09K 11/06 (2013.01); *C09K 2211/1018* (2013.01); *H01L 51/0003* (2013.01); *H01L 51/0005* (2013.01); *H01L 51/006* (2013.01); *H01L 51/0054* (2013.01); *H01L 51/0061* (2013.01); *H01L 51/0073* (2013.01); *H01L 51/5012* (2013.01); *H01L 51/5016* (2013.01)

(58) Field of Classification Search
  CPC ............ H01L 51/0061; H01L 51/0073; H01L 51/5012; H01L 51/5016; H01L 51/00; H01L 51/50; H01L 51/56; C07F 7/0812; C09D 5/22; C09D 5/24; C09D 4/00; C09K 11/06; C09K 2211/1018; C09K 2211/1022; C09K 2211/1088
  USPC .......................................................... 257/40
  See application file for complete search history.

(56) References Cited

U.S. PATENT DOCUMENTS

| | | |
|---|---|---|
| 2009/0153039 A1 | 6/2009 | Kim et al. |
| 2012/0112169 A1 | 5/2012 | Mizuki et al. |
| 2014/0151666 A1 | 6/2014 | Miyata |
| 2014/0346464 A1 | 11/2014 | Kim et al. |
| 2015/0041775 A1 | 2/2015 | Jeong et al. |
| 2015/0179956 A1 | 6/2015 | Miyata et al. |
| 2016/0351817 A1 | 12/2016 | Kim et al. |
| 2016/0365516 A1* | 12/2016 | Funahashi ............ C09K 11/025 |

FOREIGN PATENT DOCUMENTS

| | | |
|---|---|---|
| KR | 20090051647 A | 5/2009 |
| KR | 20110002155 A | 1/2011 |
| KR | 20110041725 A | 4/2011 |
| KR | 20120003968 A | 1/2012 |
| KR | 20150010016 A | 1/2015 |
| KR | 20150018230 A | 2/2015 |
| KR | 20150073063 A | 6/2015 |
| KR | 20150090021 A | 8/2015 |
| KR | 20150124677 A | 11/2015 |
| KR | 20160132822 A | 11/2016 |
| KR | 20160141361 A | 12/2016 |

* cited by examiner

[Fig. 1]
[Fig. 2]
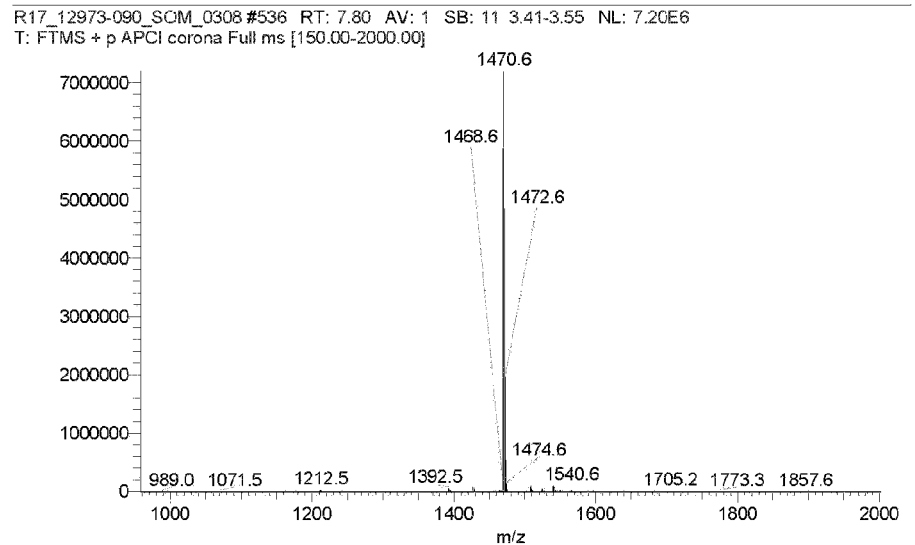

[Fig. 3]
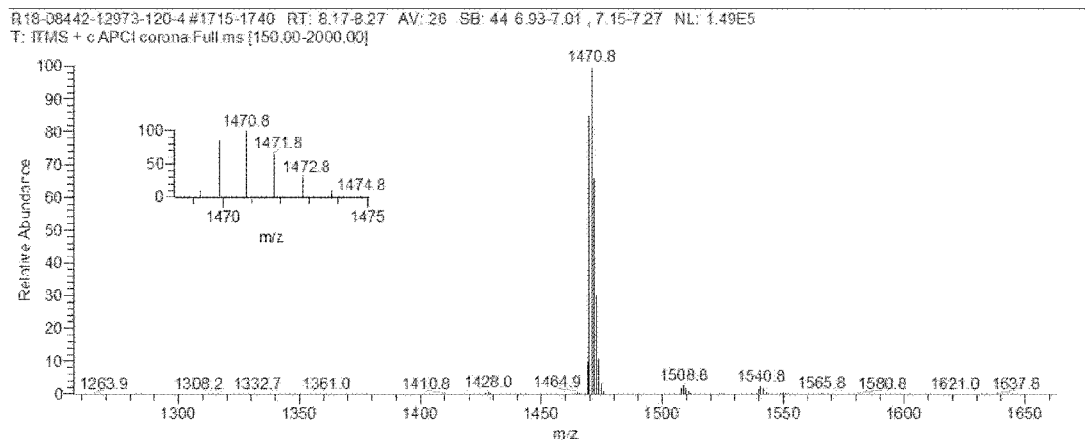
[Fig. 4]
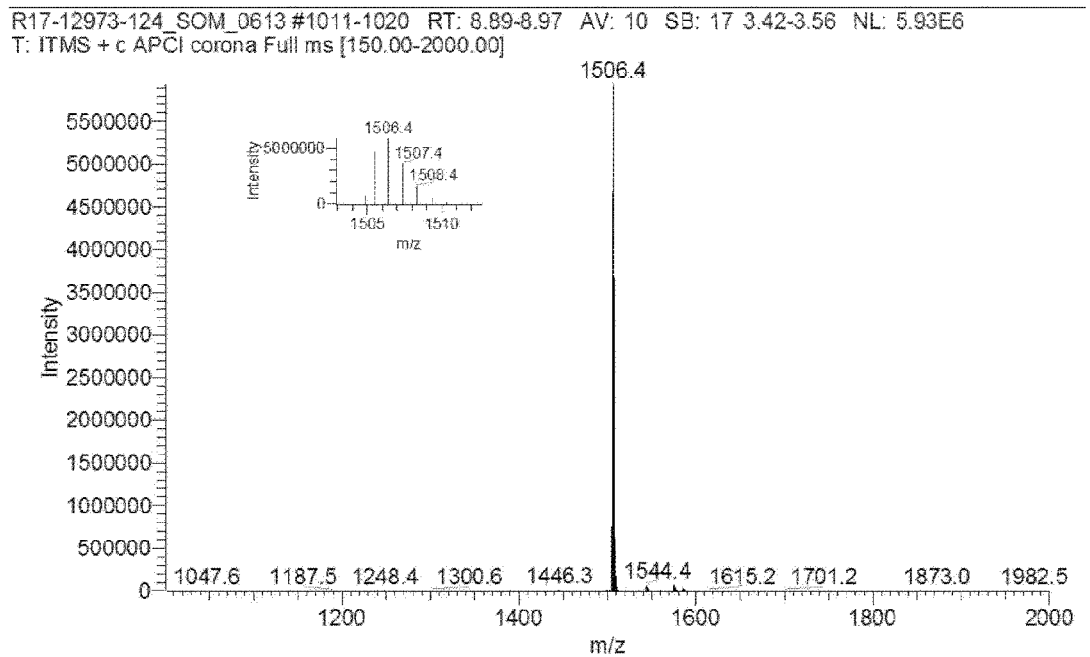

COMPOUND, COATING COMPOSITION COMPRISING SAME, ORGANIC LIGHT-EMITTING ELEMENT USING SAME, AND MANUFACTURING METHOD THEREFOR

CROSS-REFERENCE TO RELATED APPLICATIONS

This application is a national phase entry under 35 U.S.C. § 371 of International Application No. PCT/KR2019/010744 filed Aug. 23, 2019, which claims priority from Korean Patent Application No. 10-2018-0099181 filed Aug. 24, 2018, all of which are incorporated herein by reference.

TECHNICAL FIELD

The present specification relates to a compound, a coating composition including the compound, an organic light emitting device formed by using the coating composition, and a manufacturing method thereof.

BACKGROUND ART

An organic light emission phenomenon is one of the examples in which an electric current is converted into visible rays through an internal process of a specific organic molecule. The principle of the organic light emission phenomenon is as follows. When an organic material layer is disposed between an anode and a cathode, if an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic light emitting device using the principle may be generally composed of a cathode, an anode, and an organic material layer disposed therebetween, for example, an organic material layer including a hole injection layer, a hole transport layer, a light emitting layer, an electron transport layer, and an electron injection layer.

In order to manufacture an organic light emitting device in the related art, a deposition process has been usually used. However, when an organic light emitting device is manufactured by a deposition process, there is a problem in that the loss of materials frequently occurs, so that in order to solve the problem, a technology of manufacturing a device by a solution process capable of increasing the production efficiency due to the low loss of materials has been developed, and there is a need for developing a material that may be used during the solution process.

A material used in an organic light emitting device for a solution process needs to have properties described below.

First, the material used in the organic light emitting device needs to be able to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, a material used for a solution process needs to be excellent in coatability such that during the formation of a thin film, a thin film having a uniform thickness may be formed without the occurrence of holes or an aggregation phenomenon, and when an organic light emitting device is manufactured, the material needs to have excellent current efficiency and excellent service life characteristics.

[Prior Art Document] Korean Patent Application Laid-Open No. 10-2004-0028954

DETAILED DESCRIPTION OF INVENTION

Technical Problem

The present specification has been made in an effort to provide a compound, a coating composition including the compound, an organic light emitting device formed by using the coating composition, and a manufacturing method thereof.

Technical Solution

An exemplary embodiment of the present specification provides a compound represented by the following Formula 1.

[Formula 1]

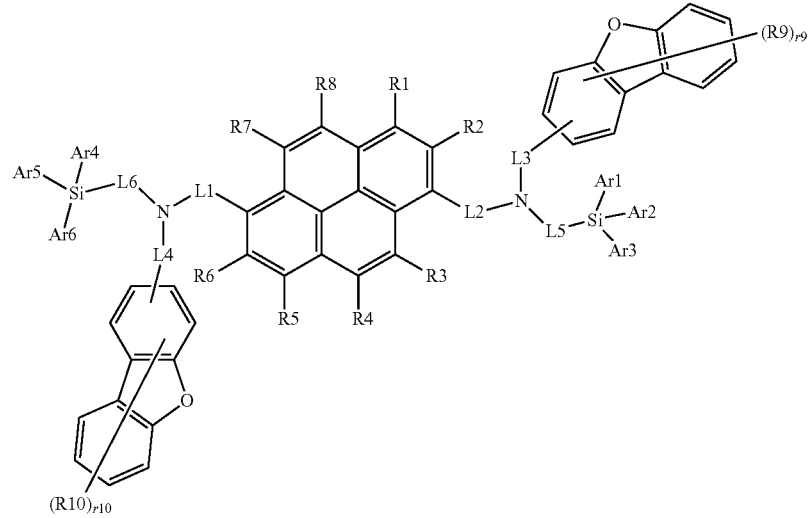

In Formula 1,

L1 to L4 are the same as or different from each other, and are each independently a direct bond; or a substituted or unsubstituted arylene group, L5 and L6 are the same as or different from each other, and are each independently a substituted or unsubstituted arylene group, Ar1 to Ar6 are the same as or different from each other, and are each independently a substituted or unsubstituted aryl group, R1 to R10 are the same as or different from each other, and are each independently hydrogen; or a substituted or unsubstituted alkyl group, r9 and r10 are each an integer from 1 to 7, when r9 is 2 or more, two or more R9's are the same as or different from each other, and when r10 is 2 or more, two or more R10's are the same as or different from each other.

An exemplary embodiment of the present specification provides a coating composition including the compound.

An exemplary embodiment of the present specification provides an organic light emitting device including: a first electrode; a second electrode provided to face the first electrode; and an organic material layer having one or more layers provided between the first electrode and the second electrode, in which one or more layers of the organic material layer include a cured product of the coating composition.

Further, an exemplary embodiment of the present specification provides a method for manufacturing an organic light emitting device, the method including: preparing a substrate; forming a first electrode on the substrate; forming an organic material layer having one or more layers on the first electrode; and forming a second electrode on the organic material layer, in which the forming of the organic material layer includes forming the organic material layer having one or more layers by using the coating composition.

Advantageous Effects

A compound according to an exemplary embodiment of the present specification can be subjected to a solution process, can achieve a large area of a device, and can be used as a material for an organic material layer of an organic light emitting device.

Further, the compound according to an exemplary embodiment of the present specification can be used as a material for an organic material layer of an organic light emitting device and can lower a driving voltage of the organic light emitting device.

In addition, the compound according to an exemplary embodiment of the present specification can be used as a material for an organic material layer of an organic light emitting device and can improve the light efficiency.

Furthermore, the compound according to an exemplary embodiment of the present specification can be used as a material for an organic material layer of an organic light emitting device and can improve service life characteristics of the device due to the thermal stability of the compound.

Further, the compound according to an exemplary embodiment of the present specification can be used as a material for an organic material layer of an organic light emitting device and can improve the solubility.

BRIEF DESCRIPTION OF DRAWINGS

FIG. 1 is a view illustrating an example of an organic light emitting device according to an exemplary embodiment of the present specification.

FIG. 2 is a view illustrating LC-MS data of Compound BD-5 according to an exemplary embodiment of the present specification.

FIG. 3 is a view illustrating LC-MS data of Compound BD-10 according to an exemplary embodiment of the present specification.

FIG. 4 is a view illustrating LC-MS data of Compound BD-24 according to an exemplary embodiment of the present specification.

EXPLANATION OF REFERENCE NUMERALS AND SYMBOLS

101: Substrate
201: First electrode
301: Hole injection layer
401: Hole transport layer
501: Light emitting layer
601: Electron transport layer
701: Second electrode

BEST MODE

Hereinafter, the present specification will be described in more detail.

The present specification provides a compound represented by the following Formula 1.

When pyrene is used for an organic light emitting device in the related art, the organic light emitting device has an excellent effect as a high brightness illuminant, but there is a disadvantage in that the solubility is reduced. The compound represented by Formula 1 of the present specification may effectively lower the y value of the color coordinate by including a dibenzofuran group in a core structure of pyrene.

Further, the compound represented by Formula 1 of the present specification effectively inhibits the n-n bond by including a silyl group in the core structure of pyrene, without affecting light emitting characteristics of the core structure of pyrene, so that the solubility may be increased by alleviating the intermolecular aggregation phenomenon. Therefore, the compound represented by Formula 1 of the present specification has an advantage in that the compound does not change the color coordinate of a substituent while being able to sufficiently secure the solubility of a pyrene derivative.

In addition, the compound of Formula 1 has an increased oscillator strength by including two amine groups, as compared to a structure in which no amine group is included or one amine group is included, so that the light emitting efficiency of the device is high.

In the present specification, the "solubility" means a property in which a solute is dissolved in a specific solvent, and may be denoted as a g value of the solute that may be dissolved in 100 g of the solvent at a predetermined temperature.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

Examples of the substituents in the present specification will be described below, but are not limited thereto.

In the present specification,

means a moiety to be linked.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a cyano group; a hydroxyl group (—OH); a carboxyl group (—COOH); an alkyl group; an alkoxy group; a haloalkyl group; a haloalkoxy group; a silyl group; an aryl group; and a heterocyclic group including one or more of N, O, S, Se, and Si atoms, being substituted with a substituent to which two or more substituents among the substituents exemplified above are linked, or having no substituent.

In the present specification, examples of a halogen group include fluorine, chlorine, bromine or iodine.

In the present specification, an alkyl group may be straight-chained or branched, and the number of carbon atoms thereof is not particularly limited, but is preferably 1 to 50, and more preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 4-methylhexyl, 5-methylhexyl, and the like, but are not limited thereto.

In the present specification, an alkoxy group may be straight-chained, branched, or cyclic. The number of carbon atoms of the alkoxy group is not particularly limited, but is preferably 1 to 30. Specific examples thereof include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, a haloalkyl group means that a halogen group is substituted instead of hydrogen of an alkyl group, and an example of the alkyl group may be applied to the haloalkyl group, except that H in the alkyl group is a halogen group. Examples thereof include —CF$_3$, —CHF$_2$, —CH$_2$F, and the like, but are not limited thereto.

In the present specification, a haloalkoxy group means that a halogen group is substituted instead of hydrogen of an alkoxy group, and an example of the alkoxy group may be applied to the haloalkoxy group, except that H in the alkoxy group is a halogen group. Examples thereof include —OCF$_3$, —OCHF$_2$, —OCH$_2$F, and the like, but are not limited thereto.

In the present specification, a silyl group includes Si and is a substituent to which the Si atom is directly linked as a radical, and is represented by —SiR$_{201}$R$_{202}$R$_{203}$, and R$_{201}$ to R$_{203}$ are the same as or different from each other, and may be each independently a substituent composed of at least one of hydrogen; deuterium; a halogen group; an alkyl group; an alkenyl group; an alkoxy group; a cycloalkyl group; an aryl group; or a heterocyclic group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, an aryl group may be a monocyclic aryl group or a polycyclic aryl group.

In the present specification, when the aryl group is a monocyclic aryl group, the number of carbon atoms thereof is not particularly limited, but is preferably 6 to 50, and more preferably 6 to 30. Specific examples of the monocyclic aryl group include a phenyl group, a biphenyl group, a terphenyl group, a quarterphenyl group, and the like, but are not limited thereto.

In the present specification, when the aryl group is a polycyclic aryl group, the number of carbon atoms thereof is not particularly limited, but is preferably 10 to 50, and more preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the substituent may be

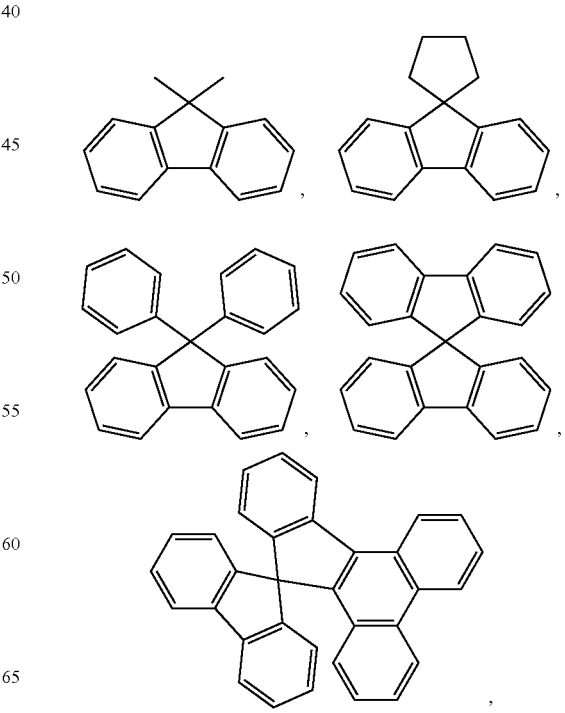

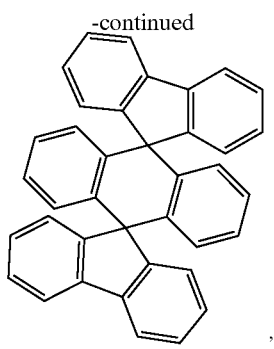

and the like, but is not limited thereto.

In the present specification, the "adjacent" group may mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, a heterocyclic group includes one or more of N, O, S, Si, and Se as a heteroatom, and the number of carbon atoms thereof is not particularly limited, but is preferably 2 to 60, and more preferably 2 to 30. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridine group, a pyridazine group, a pyrazine group, a qinolinyl group, a quinazoline group, a quinoxalinyl group, a phthalazinyl group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, a pteridine group, a thiazolyl group, an isoxazolyl group, an oxadiazolyl group, a thiadiazolyl group, a dibenzofuran group, and the like, but are not limited thereto.

In the present specification, a heteroaryl group may be selected from the examples of the heterocyclic group except for an aromatic heteroaryl group, but is not limited thereto.

In the present specification, an arylene group means a group having two bonding positions in an aryl group, that is, a divalent group. The above-described description on the aryl group may be applied to the arylene group, except for a divalent arylene group.

According to an exemplary embodiment of the present specification, in Formula 1, L5 and L6 are the same as or different from each other, and are each independently a substituted or unsubstituted arylene group having 6 to 20 carbon atoms.

According to an exemplary embodiment of the present specification, in Formula 1, L5 and L6 are the same as or different from each other, and are each independently a substituted or unsubstituted biphenylene group.

According to an exemplary embodiment of the present specification, Formula 1 is represented by the following Formula 1-1.

[Formula 1-1]

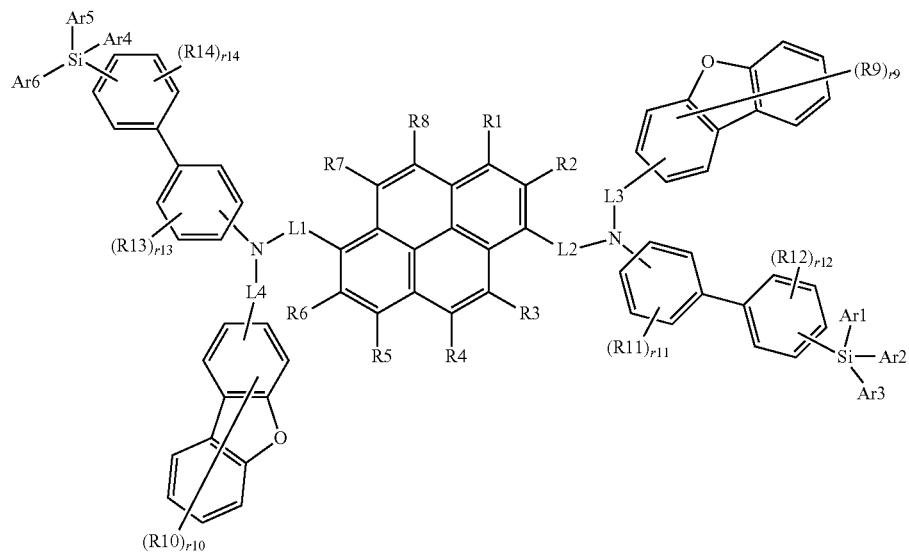

In Formula 1-1, the definitions of L1 to L4, Ar1 to Ar6, R1 to R10, r9, and r10 are the same as those defined in Formula 1, R11 to R14 are the same as or different from each other, and are each independently hydrogen; a halogen group; a cyano group; a hydroxyl group; a carboxyl group; a haloalkyl group; or a haloalkoxy group, r11 to r14 are each an integer from 1 to 4, when r11 is 2 or more, two or more R11's are the same as or different from each other, when r12 is 2 or more, two or more R12's are the same as or different from each other, when r13 is 2 or more, two or more R13's are the same as or different from each other, and when r14 is 2 or more, two or more R14's are the same as or different from each other.

According to an exemplary embodiment of the present specification, Formula 1 is represented by any one of the following Formulae 1-2 to 1-10.

[Formula 1-2]
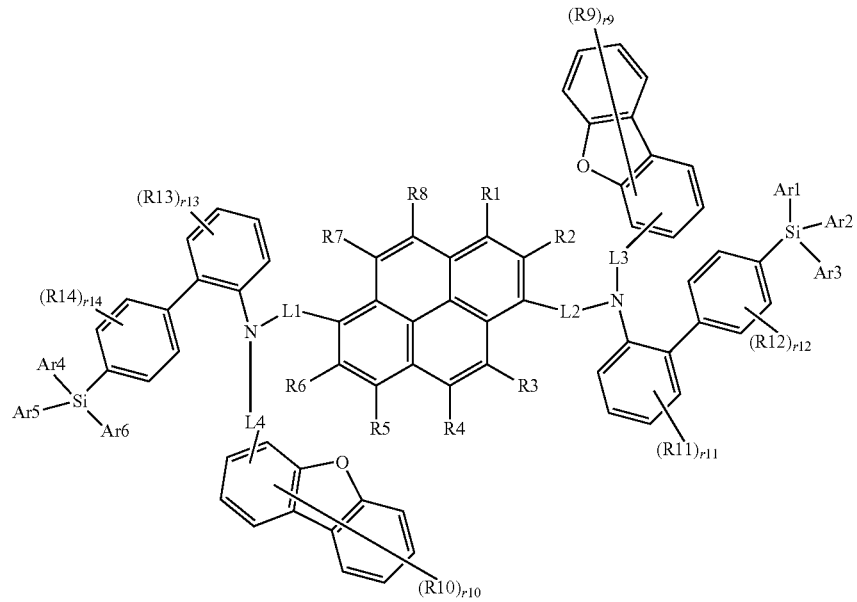
[Formula 1-3]
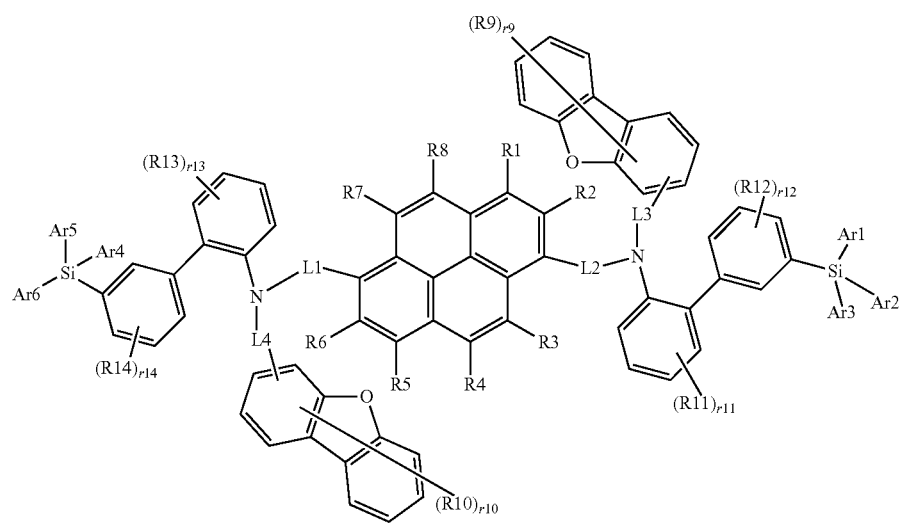
[Formula 1-4]
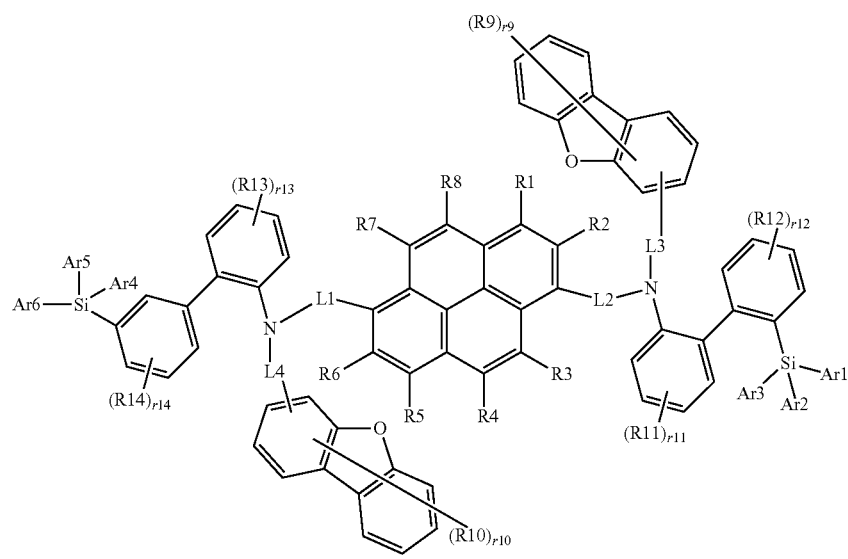

[Formula 1-5]
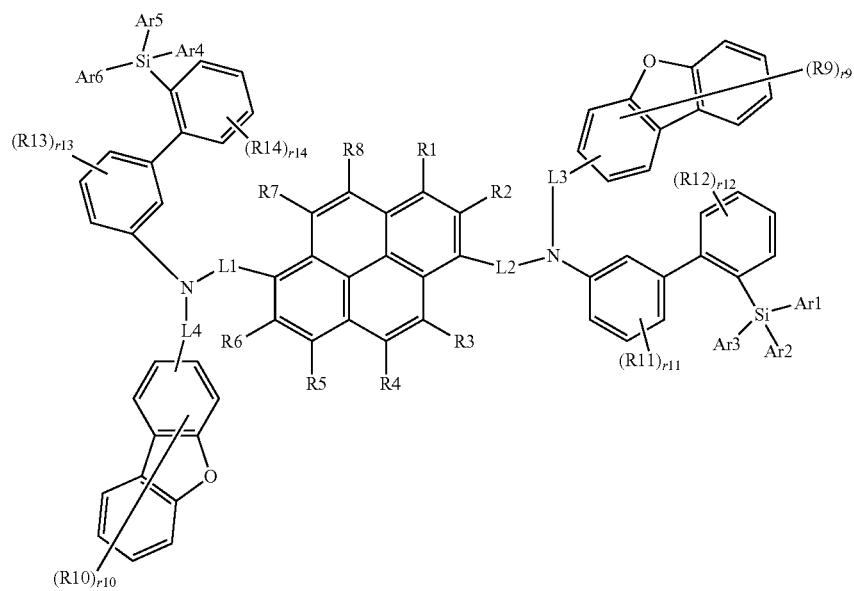
[Formula 1-6]
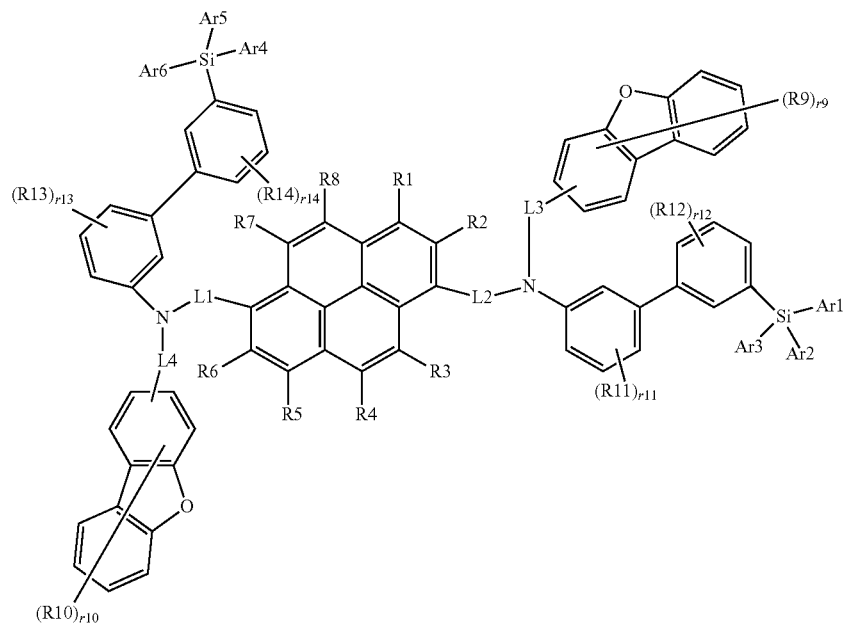

[Formula 1-7]
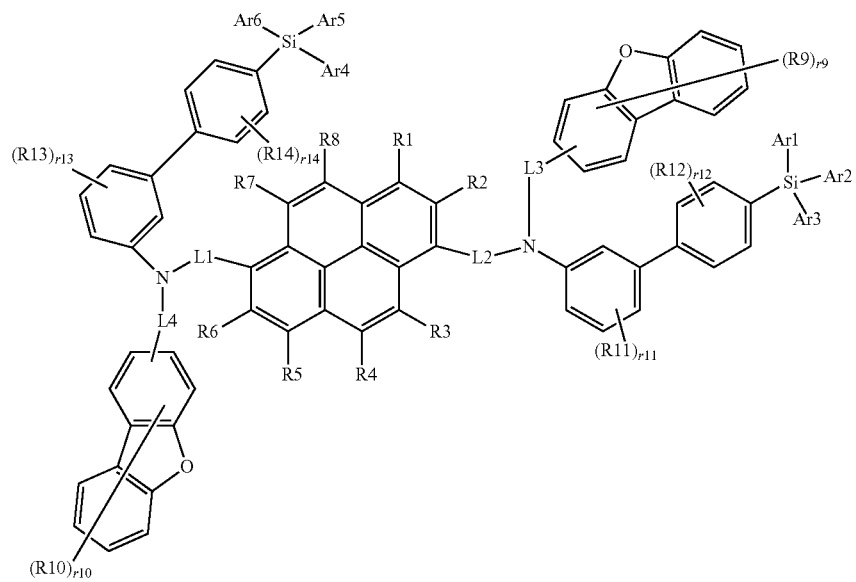
[Formula 1-8]
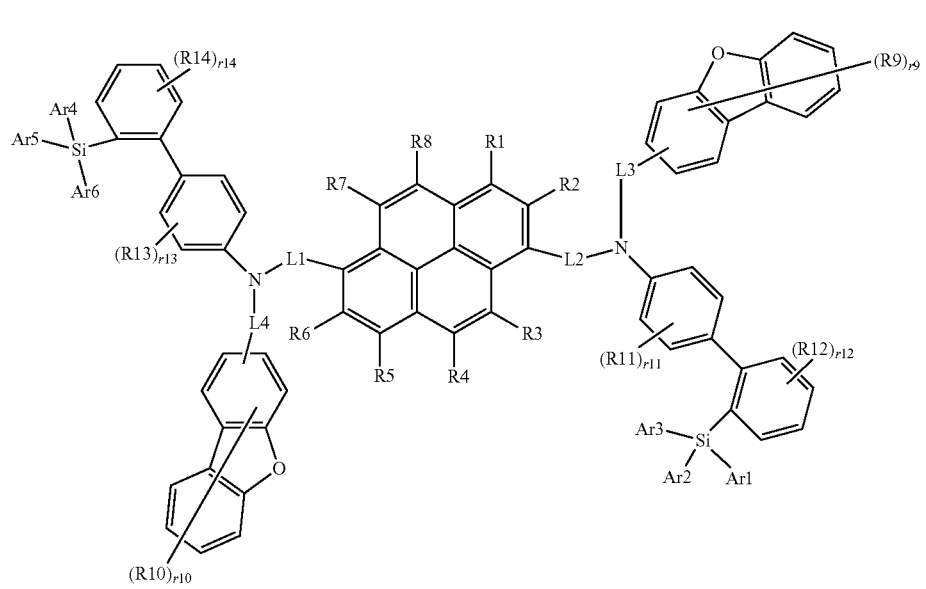

[Formula 1-9]

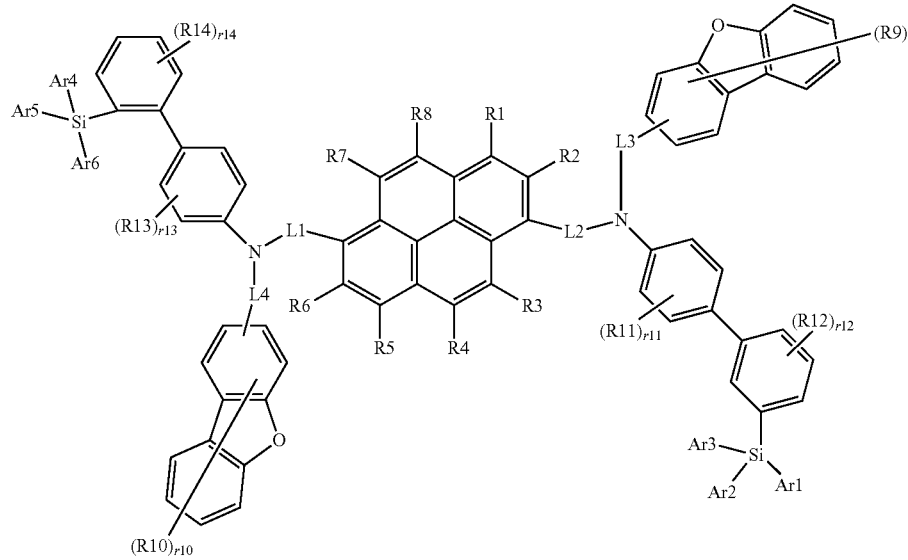

[Formula 1-10]

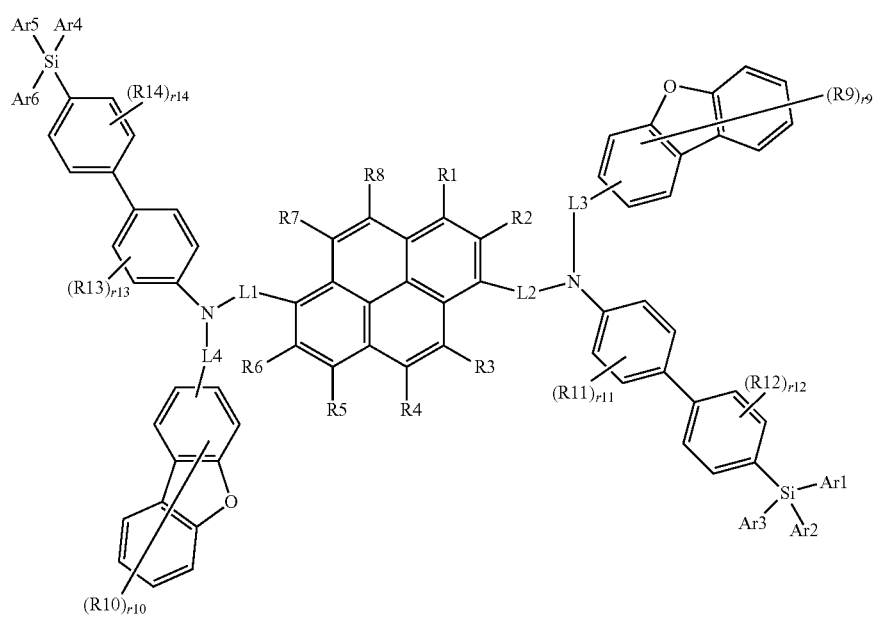

In Formulae 1-2 to 1-10, the definitions of L1 to L4, Ar1 to Ar6, R1 to R10, r9, and r10 are the same as those defined in Formula 1, R11 to R14 are the same as or different from each other, and are each independently hydrogen; a halogen group; a cyano group; a hydroxyl group; a carboxyl group; a haloalkyl group; or a haloalkoxy group, r11 to r14 are each an integer from 1 to 4, when r11 is 2 or more, two or more R11's are the same as or different from each other, when r12 is 2 or more, two or more R12's are the same as or different from each other, when r13 is 2 or more, two or more R13's are the same as or different from each other, and when r14 is 2 or more, two or more R14's are the same as or different from each other.

According to an exemplary embodiment of the present specification, Formula 1-2 is represented by the following Formula 1-2-1.

[Formula 1-2-1]

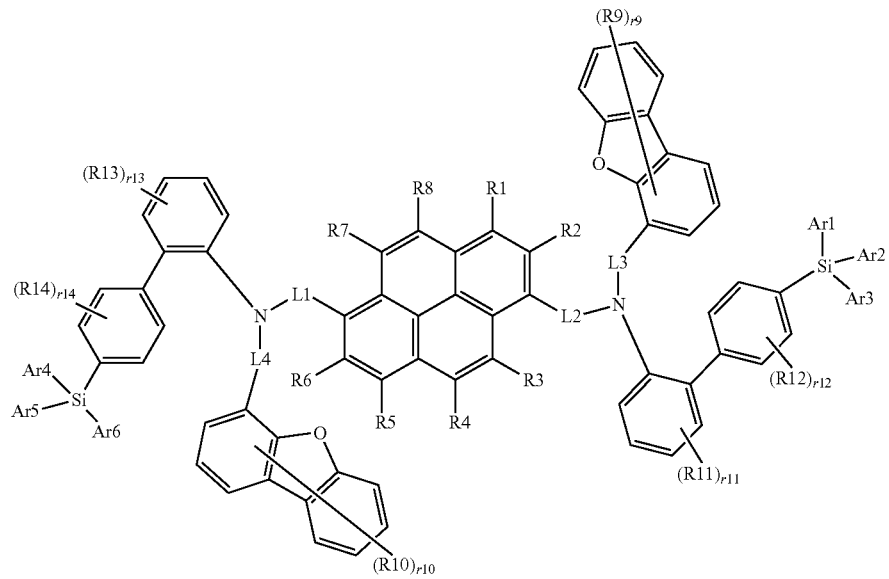

In Formula 1-2-1, the definitions of L1 to L4, Ar1 to Ar6, R1 to R14, and r9 to r14 are the same as those defined in Formula 1-2.

According to an exemplary embodiment of the present specification, Formula 1-3 is represented by the following Formula 1-3-1.

[Formula 1-3-1]

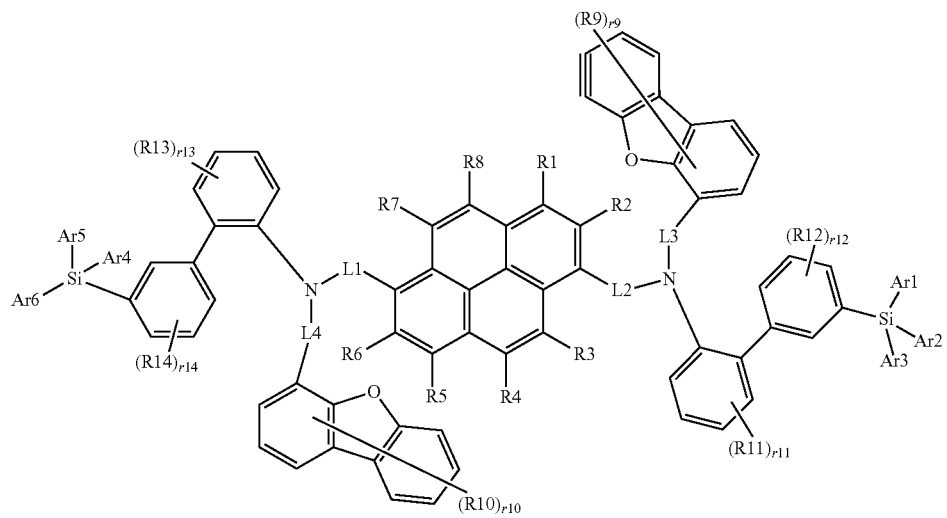

In Formula 1-3-1, the definitions of L1 to L4, Ar1 to Ar6, R1 to R14, and r9 to r14 are the same as those defined in Formula 1-3.

According to an exemplary embodiment of the present specification, Formula 1-4 is represented by the following Formula 1-4-1.

[Formula 1-4-1]

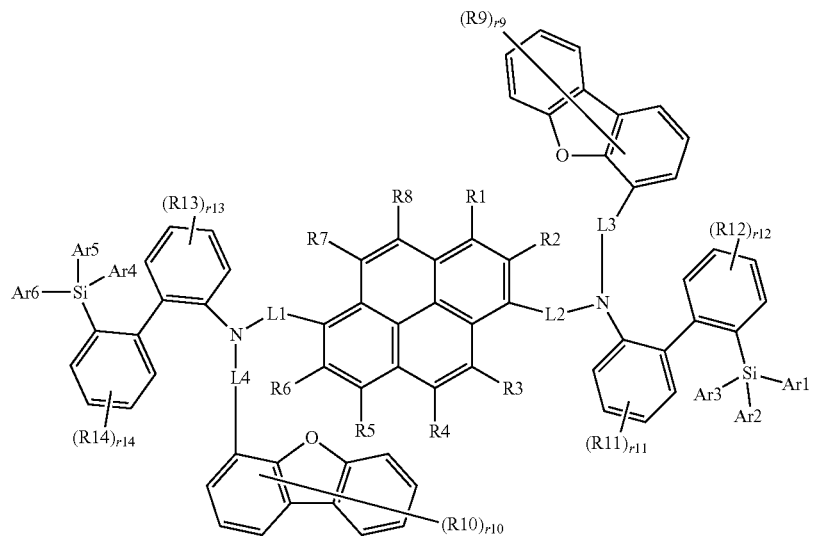

In Formula 1-4-1, the definitions of L1 to L4, Ar1 to Ar6, R1 to R14, and r9 to r14 are the same as those defined in Formula 1-4.

According to an exemplary embodiment of the present specification, in Formula 1, the dibenzofuran

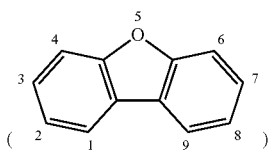 [SMILES: c1ccc2c(c1)oc1ccccc12]

is linked to L3 or L4 via No. 3 or 4 carbon.

According to an exemplary embodiment of the present specification, in Formula 1-1, the dibenzofuran

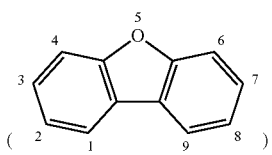

is linked to L3 or L4 via No. 3 or 4 carbon.

According to an exemplary embodiment of the present specification, in Formulae 1-2 to 1-10, the dibenzofuran

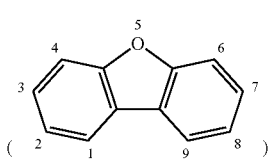 [SMILES: c1ccc2c(c1)oc1ccccc12]

is linked to L3 or L4 via No. 3 or 4 carbon.

According to an exemplary embodiment of the present specification, in Formula 1, L1 to L4 are the same as or different from each other, and are each independently a direct bond; or a substituted or unsubstituted monocyclic or polycyclic arylene group having 6 to 30 carbon atoms.

According to an exemplary embodiment of the present specification, in Formula 1, L1 to L4 are the same as or different from each other, and are each independently a direct bond; or a monocyclic or polycyclic arylene group having 6 to 30 carbon atoms.

According to an exemplary embodiment of the present specification, in Formula 1, L1 to L4 are the same as or different from each other, and are each independently a direct bond; or a monocyclic or polycyclic arylene group having 6 to 10 carbon atoms.

According to an exemplary embodiment of the present specification, in Formula 1, L1 to L4 are the same as or different from each other, and are each independently a direct bond; or a phenylene group.

According to an exemplary embodiment of the present specification, in Formula 1, L1 and L2 are the same as or different from each other, and are each independently a direct bond; or a substituted or unsubstituted monocyclic or polycyclic arylene group having 6 to 30 carbon atoms.

According to an exemplary embodiment of the present specification, in Formula 1, L1 and L2 are the same as or different from each other, and are each independently a direct bond; or a monocyclic or polycyclic arylene group having 6 to 30 carbon atoms.

According to an exemplary embodiment of the present specification, in Formula 1, L1 and L2 are the same as or different from each other, and are each independently a direct bond; or a monocyclic or polycyclic arylene group having 6 to 10 carbon atoms.

According to an exemplary embodiment of the present specification, in Formula 1, L1 and L2 are the same as or different from each other, and are each independently a direct bond; or a phenylene group.

According to an exemplary embodiment of the present specification, in Formula 1, L1 and L2 are a direct bond.

According to an exemplary embodiment of the present specification, in Formula 1, L1 and L2 are a phenylene group.

According to an exemplary embodiment of the present specification, in Formula 1, L3 and L4 are a direct bond.

According to an exemplary embodiment of the present specification, in Formula 1, Ar1 to Ar6 are the same as or different from each other, and are each independently a substituted or unsubstituted monocyclic or polycyclic aryl group having 6 to 30 carbon atoms.

According to an exemplary embodiment of the present specification, in Formula 1, Ar1 to Ar6 are the same as or different from each other, and are each independently a monocyclic or polycyclic aryl group having 6 to 30 carbon atoms, which is unsubstituted or substituted with a straight-chained or branched alkyl group having 1 to 30 carbon atoms.

According to an exemplary embodiment of the present specification, in Formula 1, Ar1 to Ar6 are the same as or different from each other, and are each independently a monocyclic or polycyclic aryl group having 6 to 10 carbon atoms, which is unsubstituted or substituted with a straight-chained or branched alkyl group having 1 to 10 carbon atoms.

According to an exemplary embodiment of the present specification, in Formula 1, Ar1 to Ar6 are the same as or different from each other, and are each independently a phenyl group which is unsubstituted or substituted with a methyl group.

According to an exemplary embodiment of the present specification, in Formula 1, Ar1 to Ar6 are each a phenyl group.

According to an exemplary embodiment of the present specification, in Formula 1, Ar1 to Ar6 are each a phenyl group which is substituted with a methyl group.

According to an exemplary embodiment of the present specification, in Formula 1, R1 and R5 are the same as or different from each other, and are each independently a substituted or unsubstituted straight-chained or branched alkyl group having 1 to 30 carbon atoms.

According to an exemplary embodiment of the present specification, in Formula 1, R1 and R5 are the same as or different from each other, and are each independently a straight-chained or branched alkyl group having 1 to 30 carbon atoms.

According to an exemplary embodiment of the present specification, in Formula 1, R1 and R5 are the same as or different from each other, and are each independently a straight-chained or branched alkyl group having 1 to 10 carbon atoms.

According to an exemplary embodiment of the present specification, in Formula 1, R1 and R5 are the same as or different from each other, and are each independently a branched alkyl group having 3 to 10 carbon atoms.

According to an exemplary embodiment of the present specification, in Formula 1, R1 and R5 are each an i-propyl group.

According to an exemplary embodiment of the present specification, in Formula 1, R2 to R4 and R6 to R10 are each hydrogen.

According to an exemplary embodiment of the present specification, in Formula 1, L5 and L6 are the same as or different from each other, and are each independently a biphenylene group which is unsubstituted or substituted with a halogen group, a cyano group, a hydroxyl group, a carboxyl group, a haloalkyl group, or a haloalkoxy group.

According to an exemplary embodiment of the present specification, in Formula 1, L5 and L6 are the same as or different from each other, and are each independently a biphenylene group which is unsubstituted or substituted with fluorine, a cyano group, a hydroxyl group, a carboxyl group, —$CF_3$, or —$OCF_3$.

According to an exemplary embodiment of the present specification, in Formula 1, L5 and L6 are the same as or different from each other, and are each independently a biphenylene group which is unsubstituted or substituted with a halogen group or a cyano group.

According to an exemplary embodiment of the present specification, in Formula 1, L5 and L6 are the same as or different from each other, and are each independently a biphenylene group which is unsubstituted or substituted with fluorine or a cyano group.

According to an exemplary embodiment of the present specification, R2 to R4 and R6 to R14 are each hydrogen.

According to an exemplary embodiment of the present specification, in Formula 1-1, R11 is hydrogen.

According to an exemplary embodiment of the present specification, in Formula 1-1, R11 is a halogen group; a cyano group; a hydroxyl group; a carboxyl group; a haloalkyl group; or a haloalkoxy group.

According to an exemplary embodiment of the present specification, in Formula 1-1, R11 is fluorine; a cyano group; a hydroxyl group; a carboxyl group; —$CF_3$; or —$OCF_3$.

According to an exemplary embodiment of the present specification, in Formula 1-1, R11 is hydrogen; a halogen group; or a cyano group.

According to an exemplary embodiment of the present specification, in Formula 1-1, R11 is hydrogen; fluorine; or a cyano group.

According to an exemplary embodiment of the present specification, in Formula 1-1, R13 is hydrogen.

According to an exemplary embodiment of the present specification, in Formula 1-1, R13 is a halogen group; a cyano group; a hydroxyl group; a carboxyl group; a haloalkyl group; or a haloalkoxy group.

According to an exemplary embodiment of the present specification, in Formula 1-1, R13 is fluorine; a cyano group; a hydroxyl group; a carboxyl group; —$CF_3$; or —$OCF_3$.

According to an exemplary embodiment of the present specification, in Formula 1-1, R13 is hydrogen; a halogen group; or a cyano group.

According to an exemplary embodiment of the present specification, in Formula 1-1, R13 is hydrogen; fluorine; or a cyano group.

According to an exemplary embodiment of the present specification, r11 is 4 and R11 is hydrogen.

According to an exemplary embodiment of the present specification, r11 is 1 and R11 is a halogen group; a cyano group; a hydroxyl group; a carboxyl group; a haloalkyl group; or a haloalkoxy group.

According to an exemplary embodiment of the present specification, r11 is 1 and R11 is fluorine; a cyano group; a hydroxyl group; a carboxyl group; —$CF_3$; or —$OCF_3$.

According to an exemplary embodiment of the present specification, r11 is 1 and R11 is a halogen group; or a cyano group.

According to an exemplary embodiment of the present specification, r11 is 1 and R11 is fluorine; or a cyano group.

According to an exemplary embodiment of the present specification, r13 is 4 and R13 is hydrogen.

According to an exemplary embodiment of the present specification, r13 is 1 and R13 is a halogen group; a cyano group; a hydroxyl group; a carboxyl group; a haloalkyl group; or a haloalkoxy group.

According to an exemplary embodiment of the present specification, r13 is 1 and R13 is fluorine; a cyano group; a hydroxyl group; a carboxyl group; —CF$_3$; or —OCF$_3$.

According to an exemplary embodiment of the present specification, r13 is 1 and R13 is a halogen group; or a cyano group.

According to an exemplary embodiment of the present specification, r13 is 1 and R13 is fluorine; or a cyano group.

According to an exemplary embodiment of the present specification, in Formula 1-1, R12 and R14 are each hydrogen.

According to an exemplary embodiment of the present specification, in Formula 1,

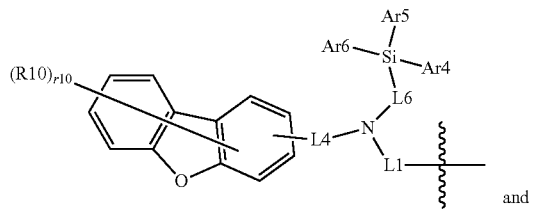

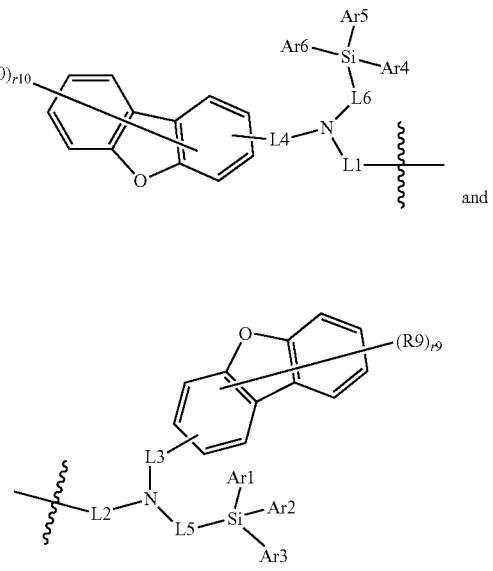

are the same as each other.

According to an exemplary embodiment of the present specification, in Formula 1,

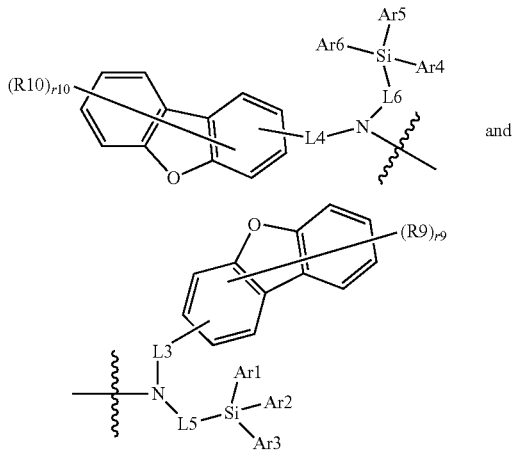

are the same as each other.

According to an exemplary embodiment of the present specification, in Formula 1-1,

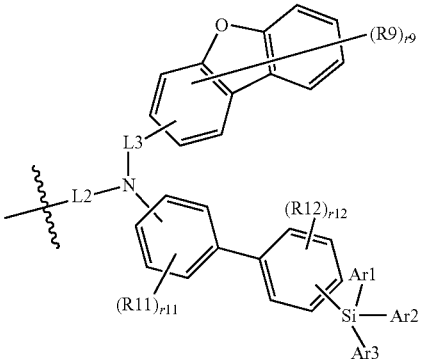

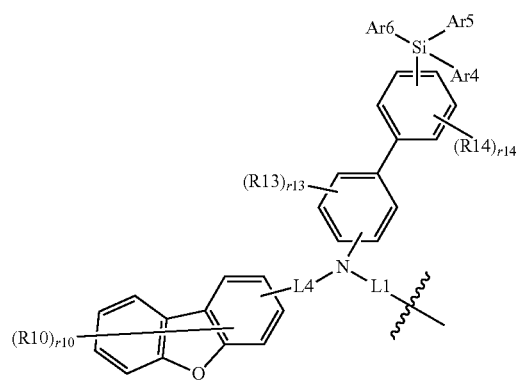

are the same as each other.

According to an exemplary embodiment of the present specification, Formula 1 is selected from the following compounds.

BD1

BD2

BD3

BD4
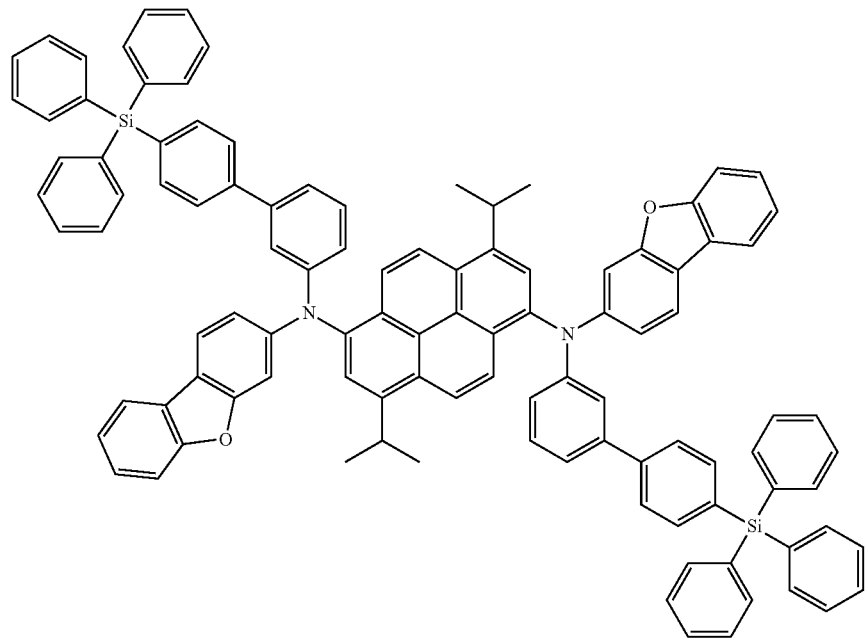
BD5
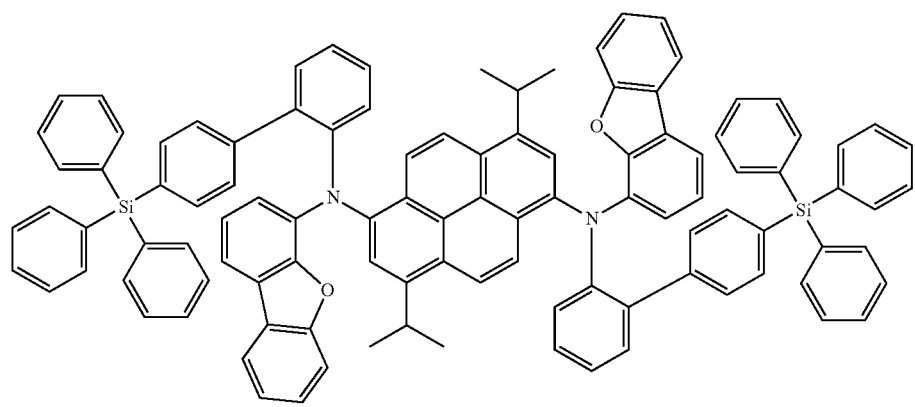
BD6
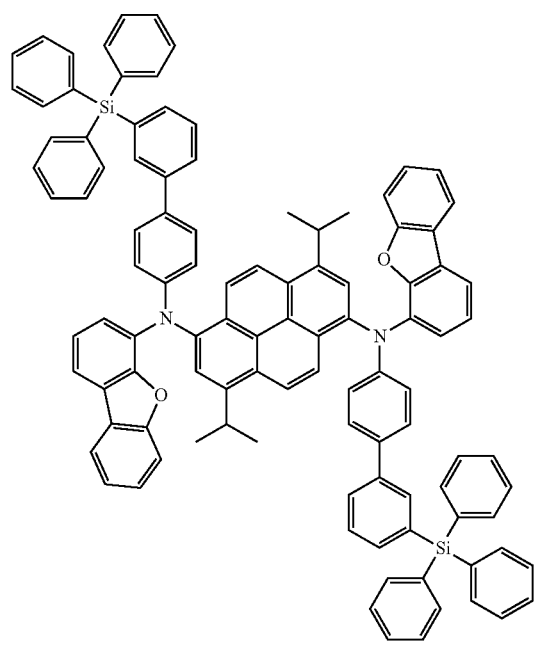

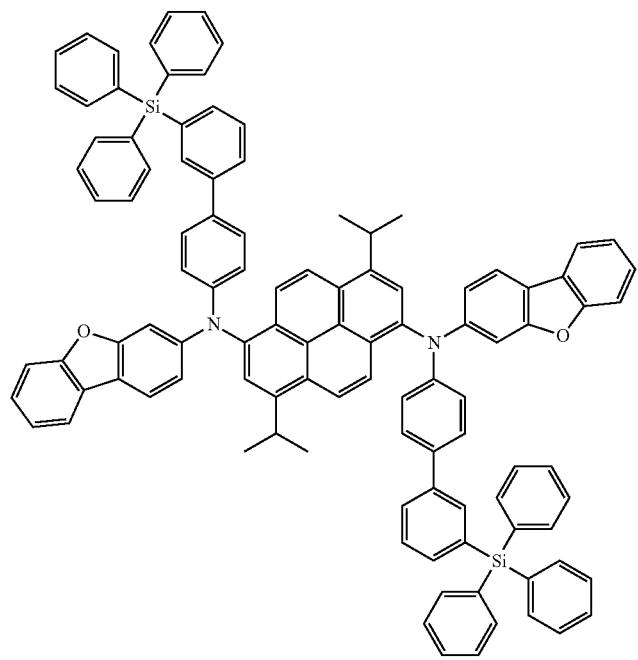
BD7
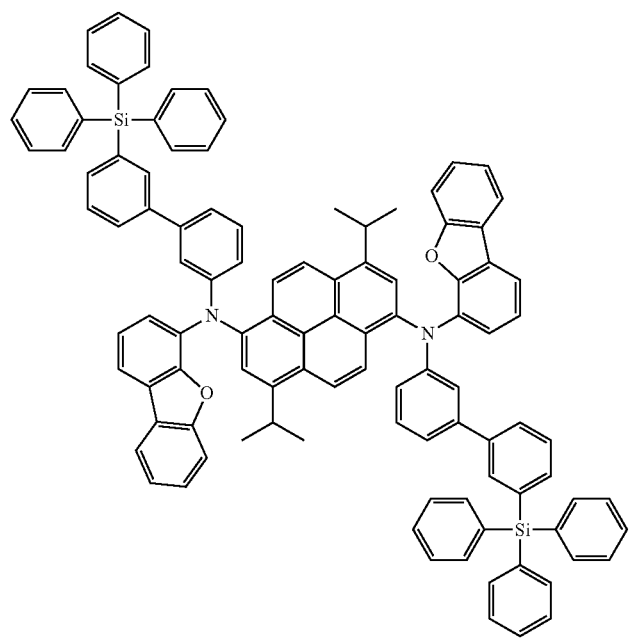
BD8

BD9
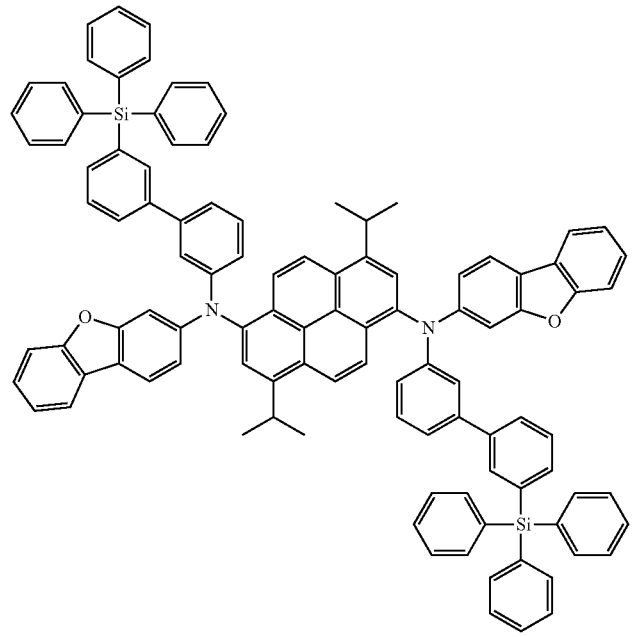
BD10
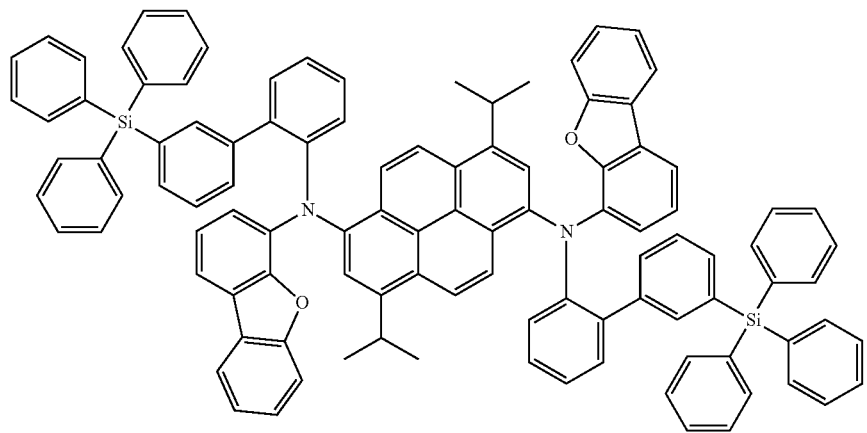

-continued
BD11
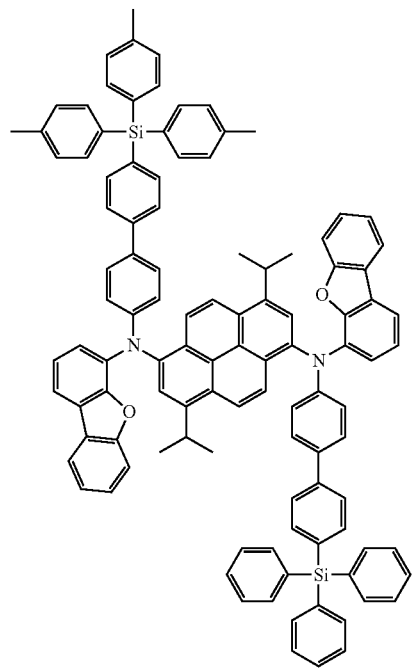
BD12
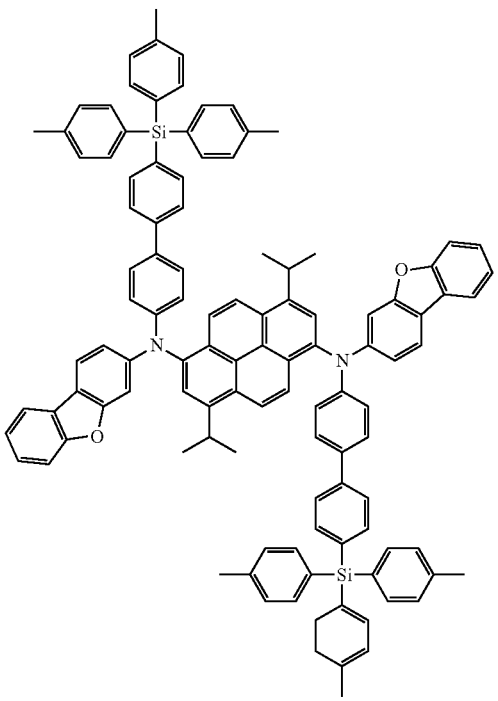
BD13
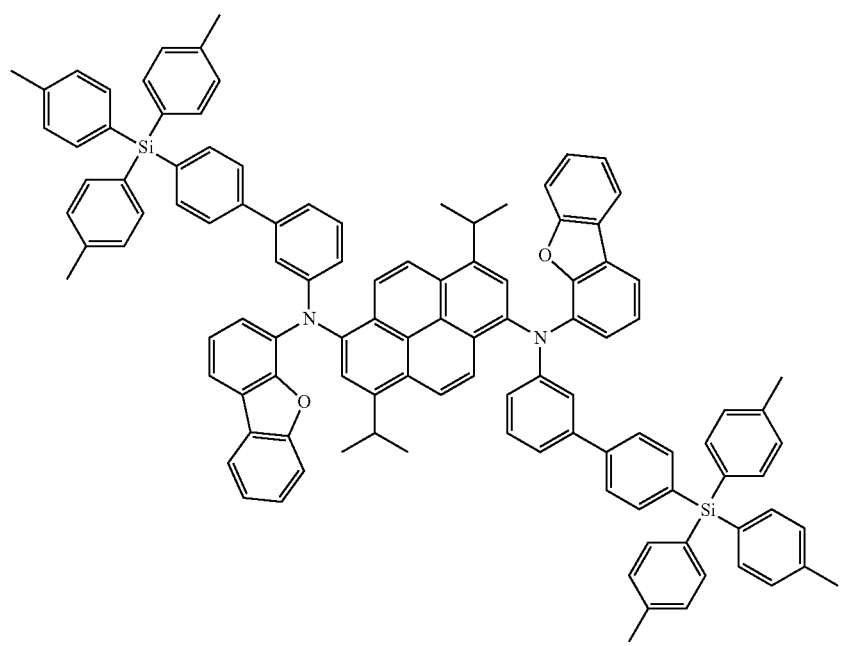

BD14
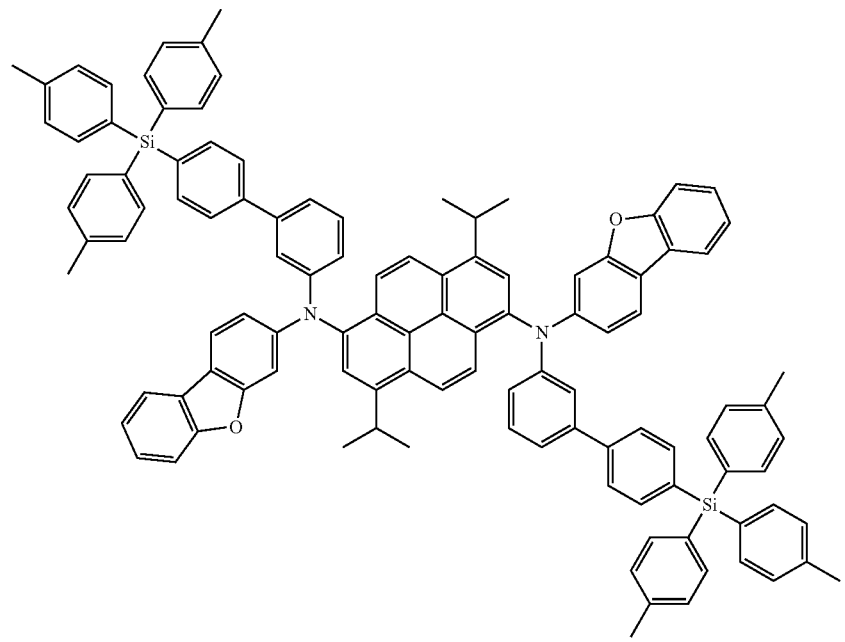
BD15
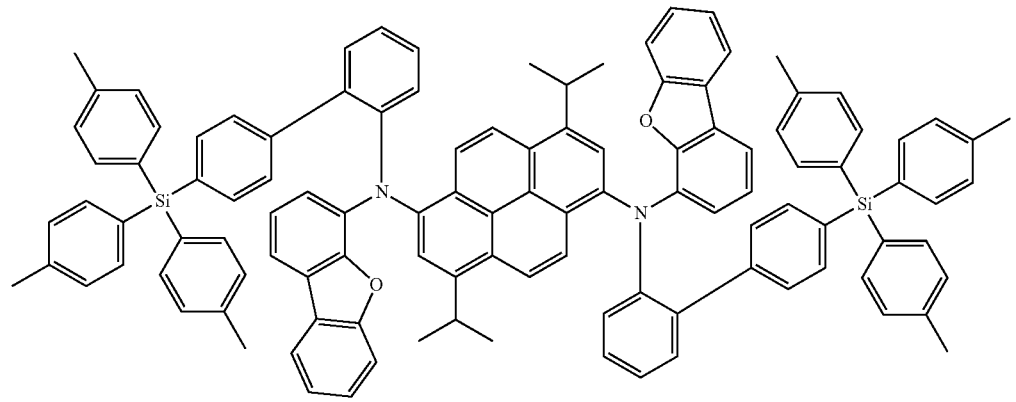

-continued
BD16
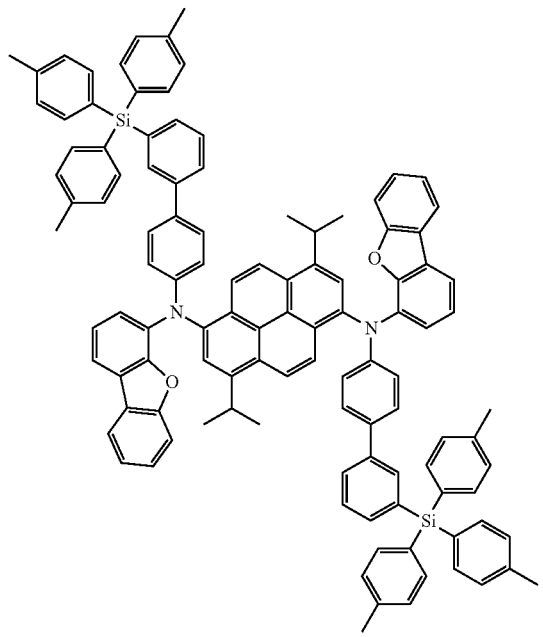
BD17
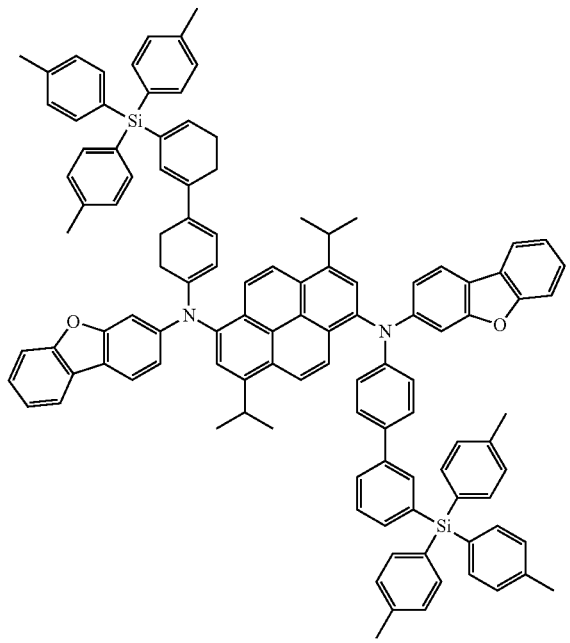
BD18
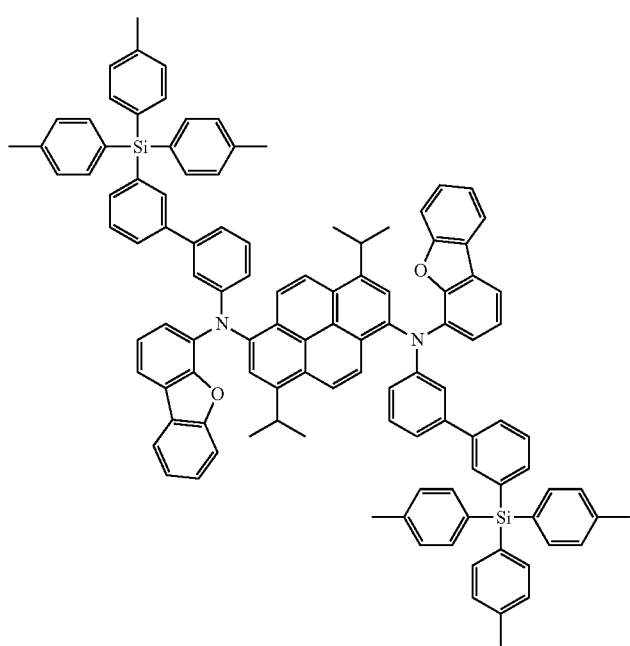

-continued
BD19
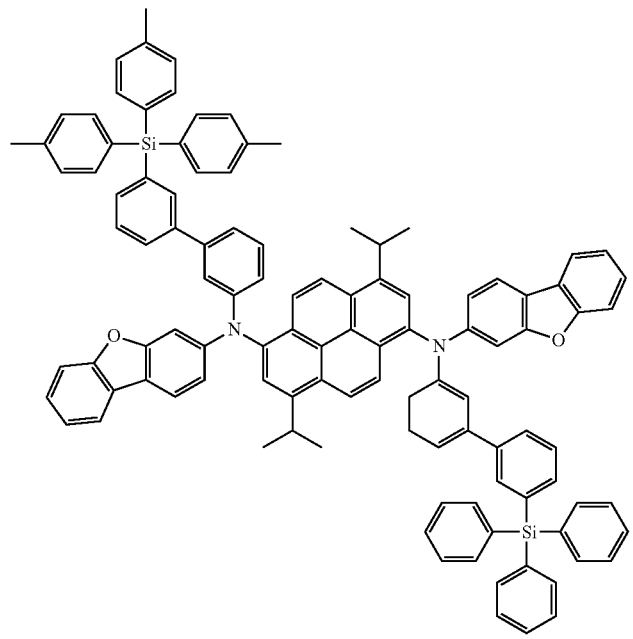
BD20
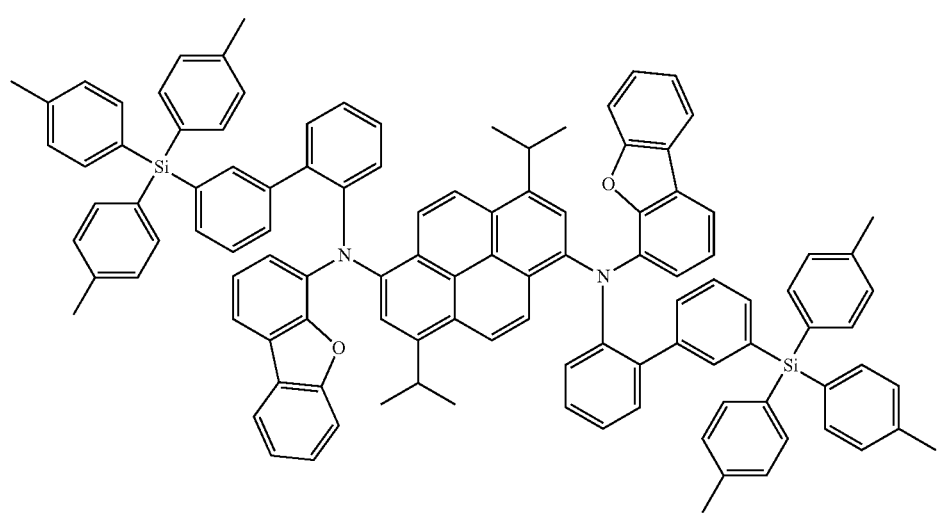

-continued
BD21
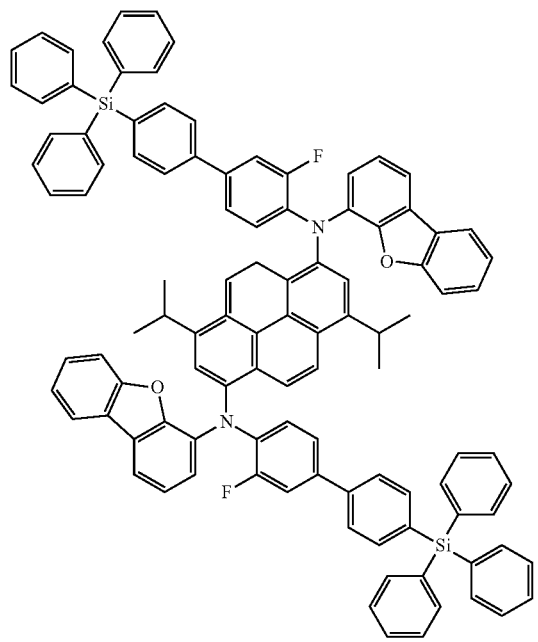
BD22
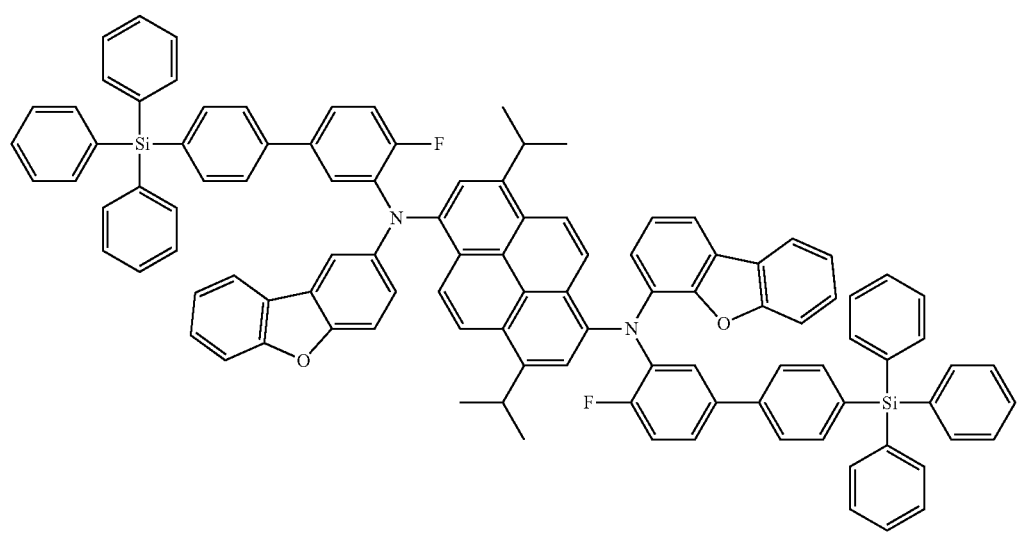
BD23
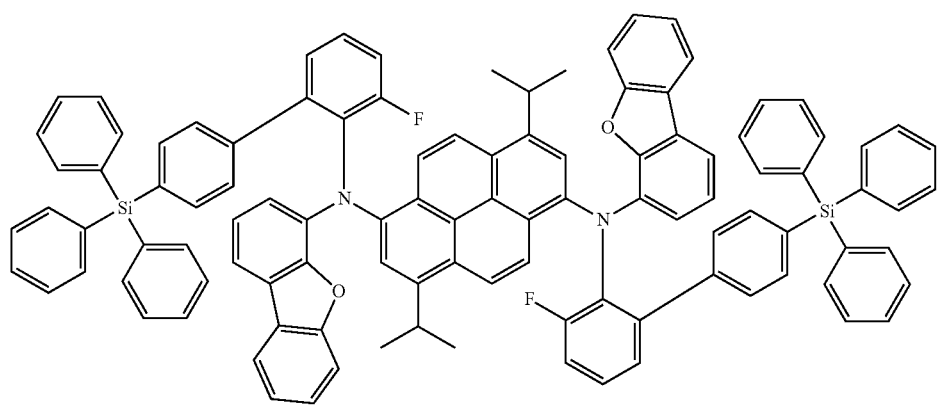

BD24
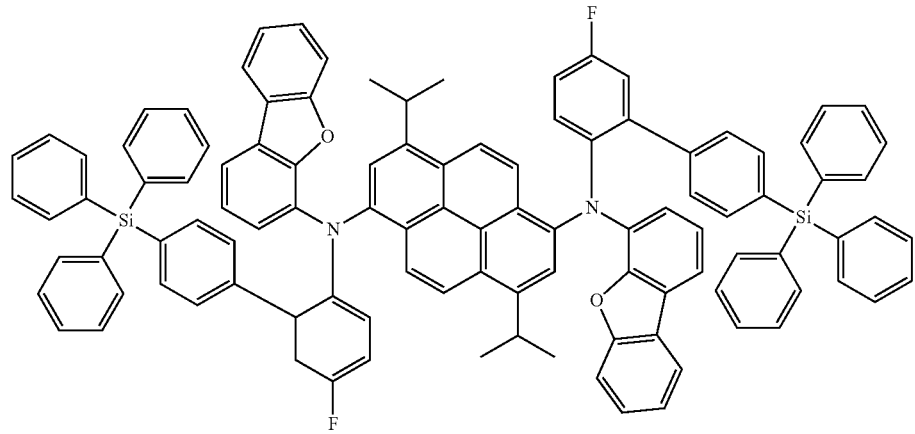
BD25
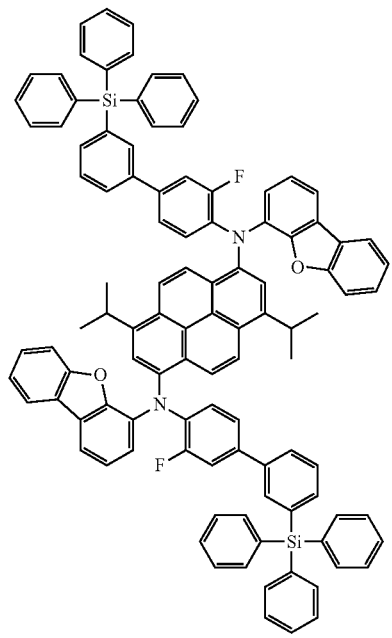
BD26
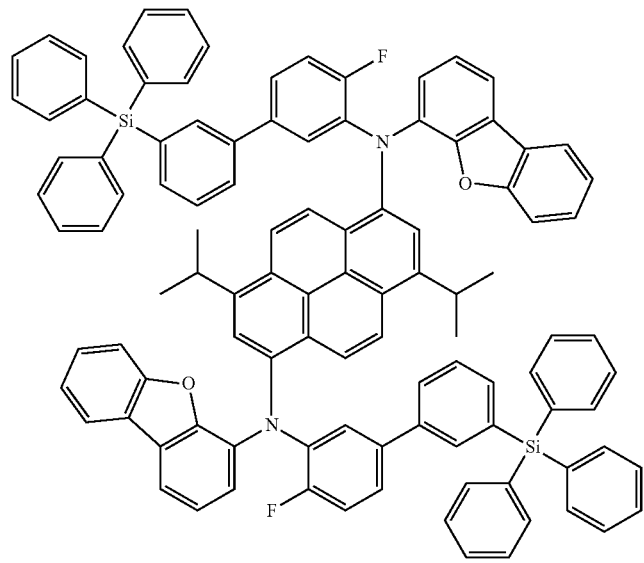

-continued
BD27
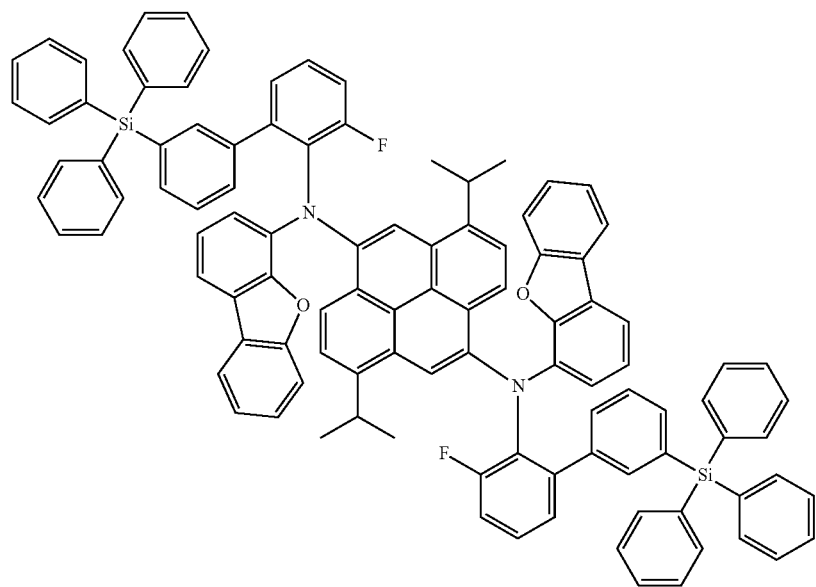
BD28
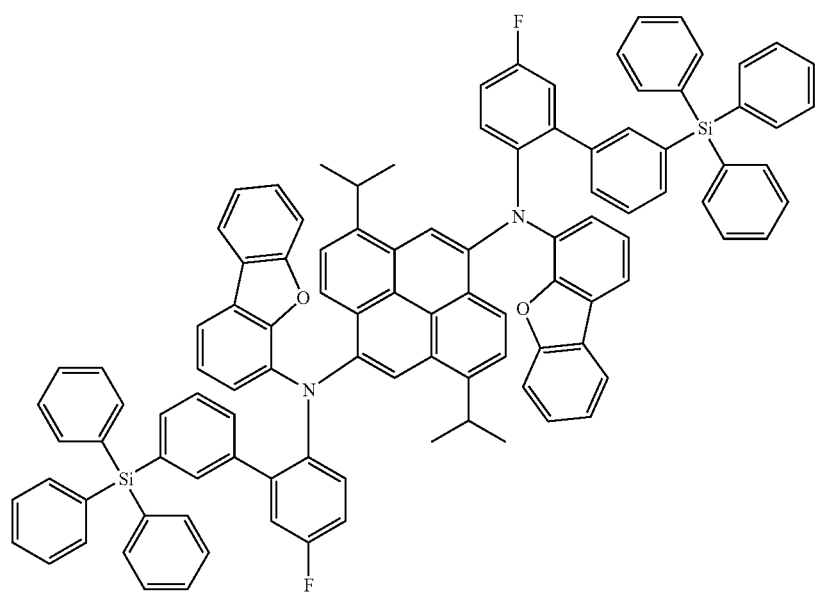

-continued
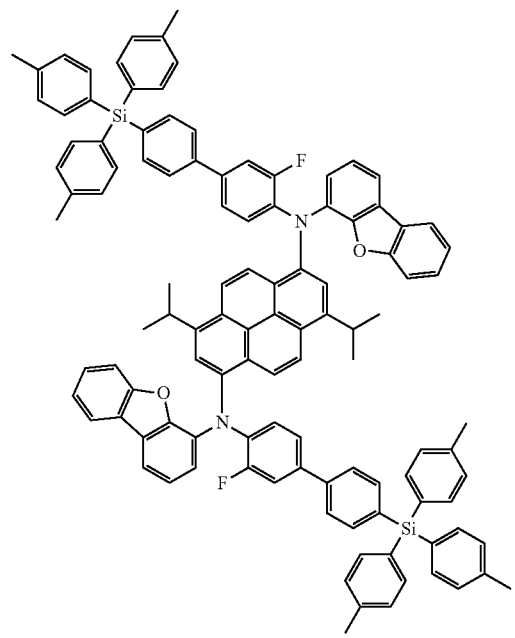
BD29
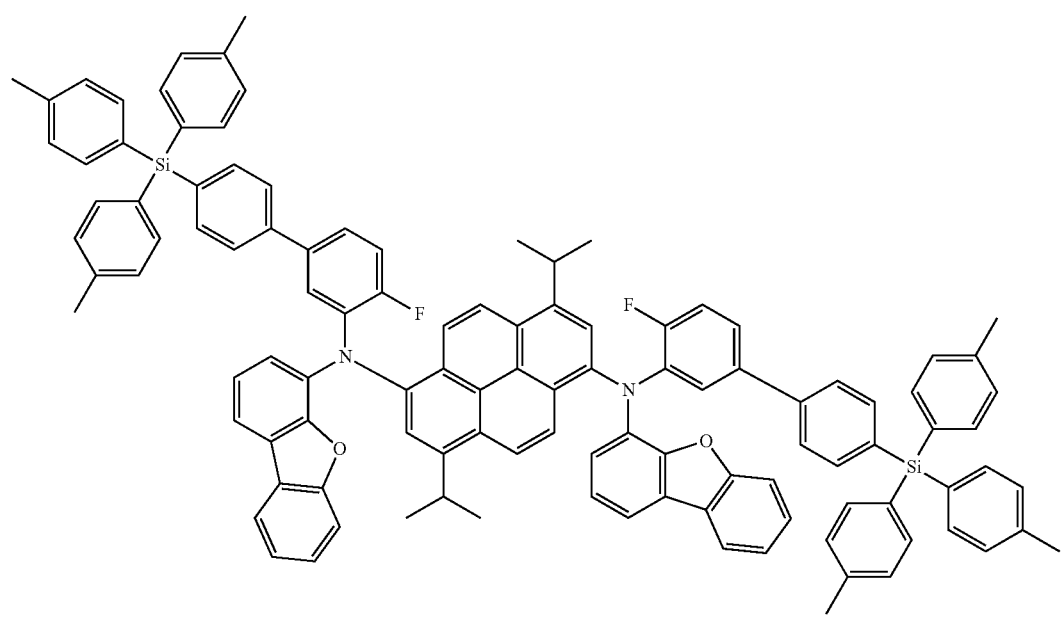
BD30

-continued
BD31
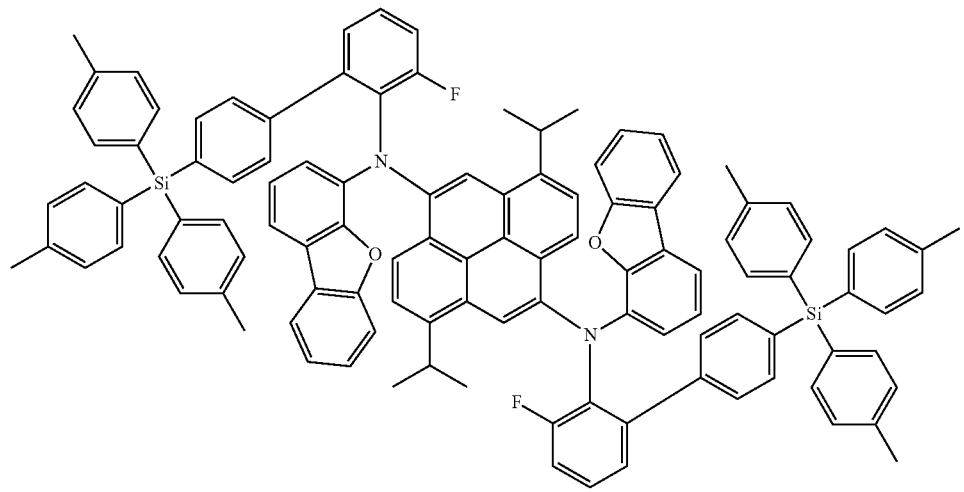
BD32
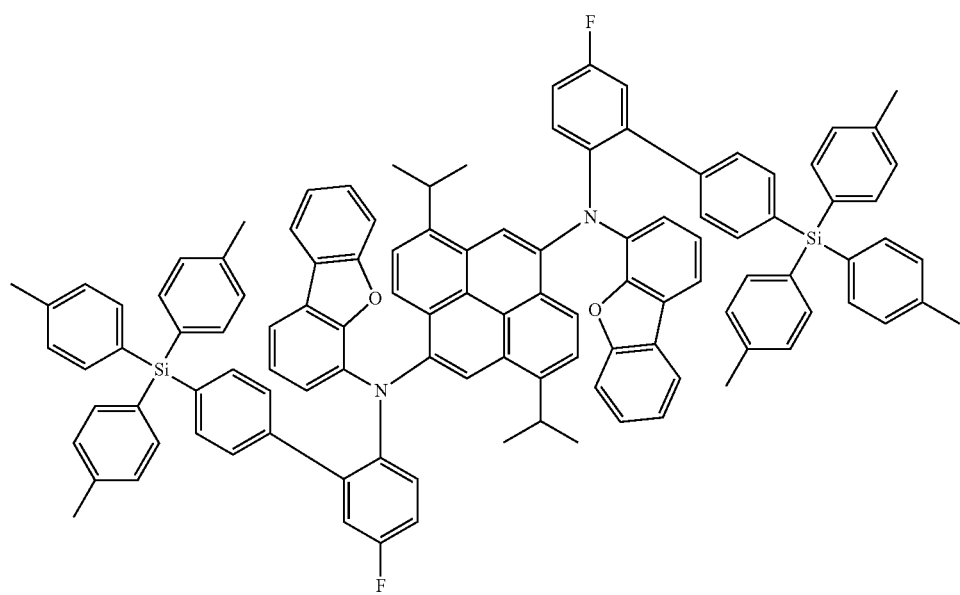

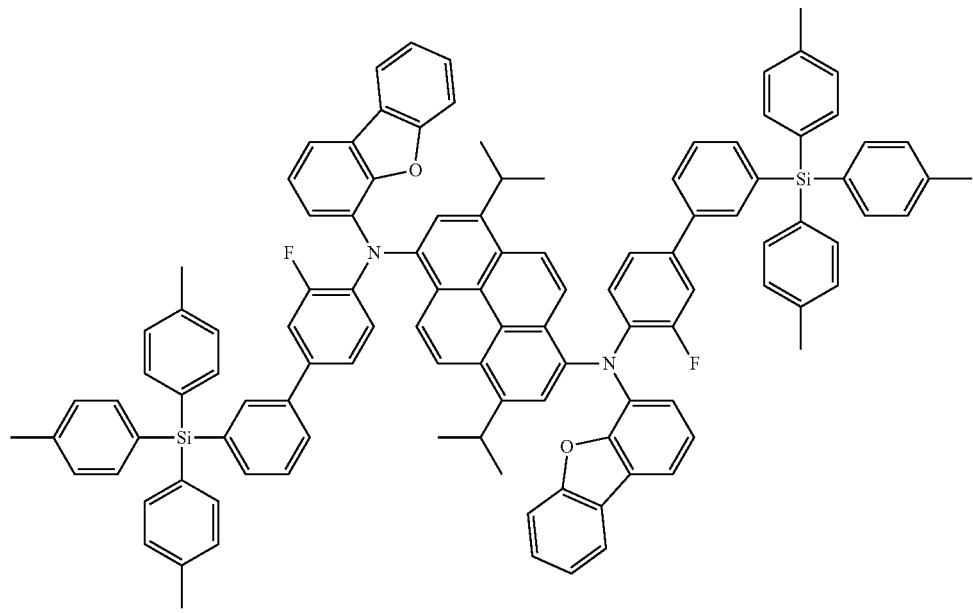
BD33
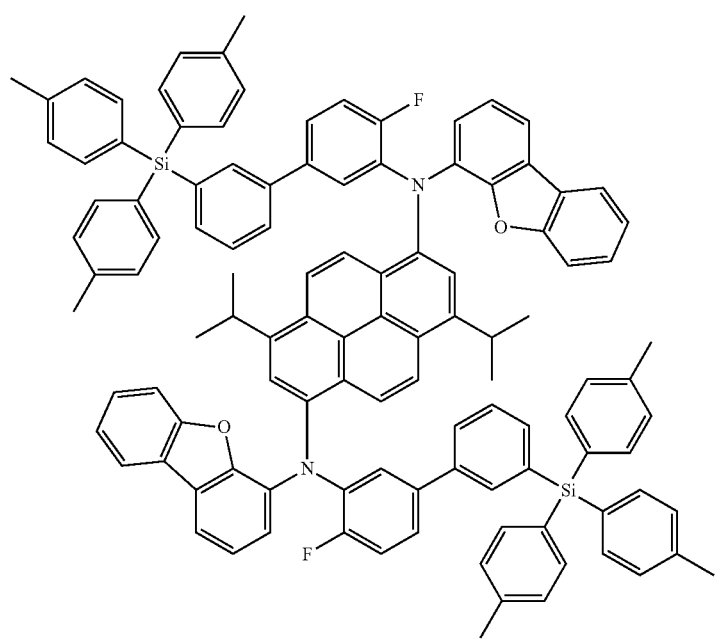
BD34

-continued
BD35
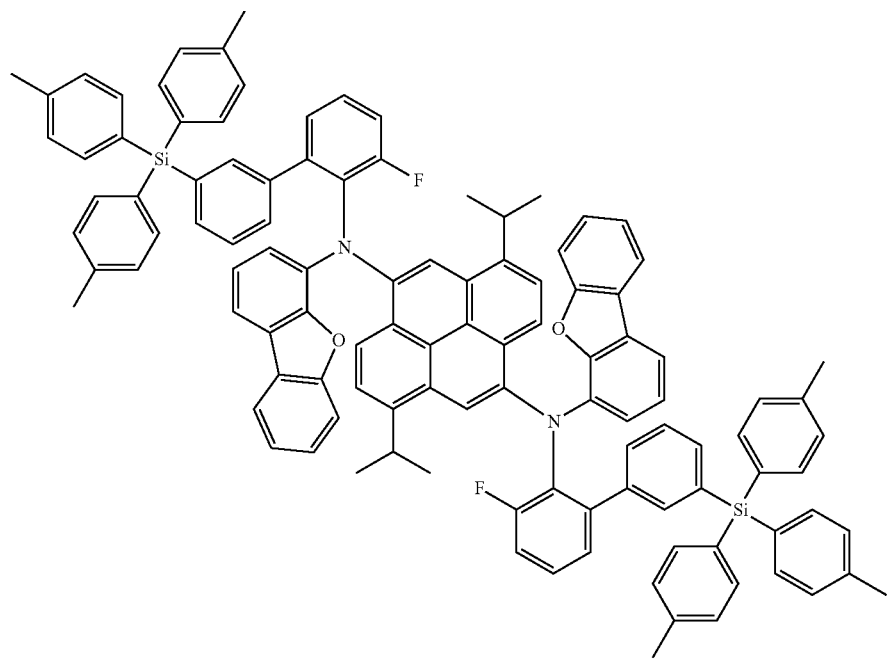
BD36
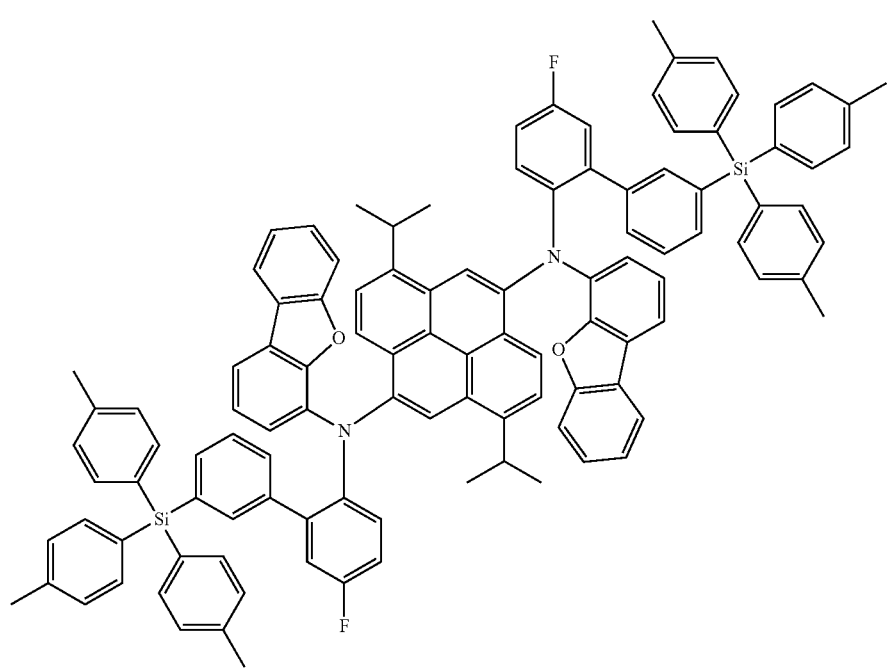

BD37
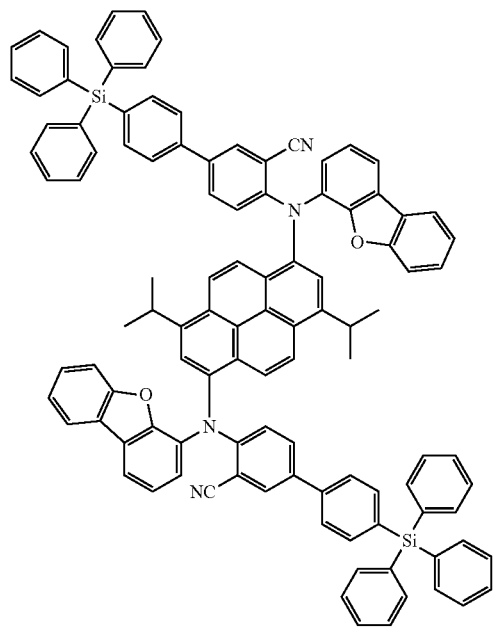
BD38
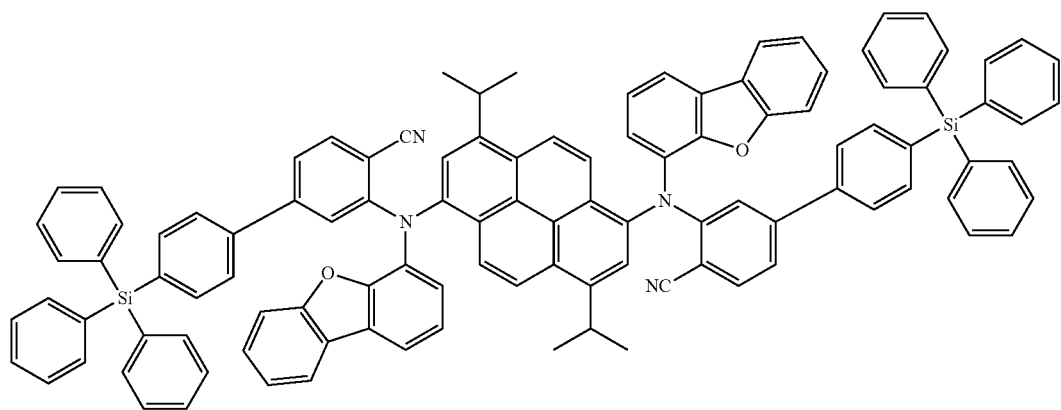
BD39
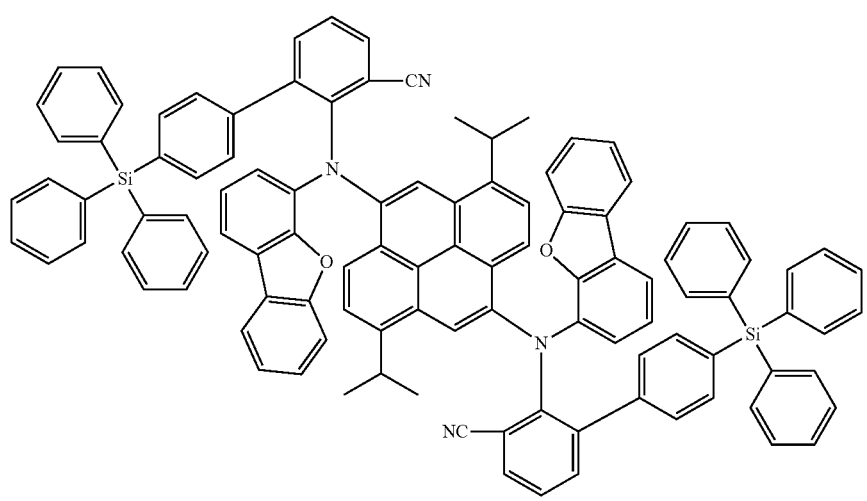

BD40
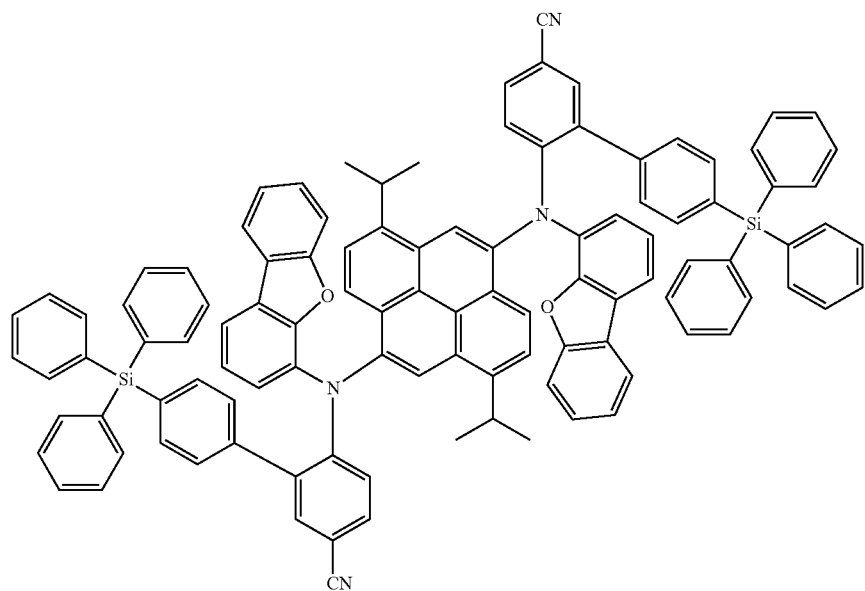
BD41
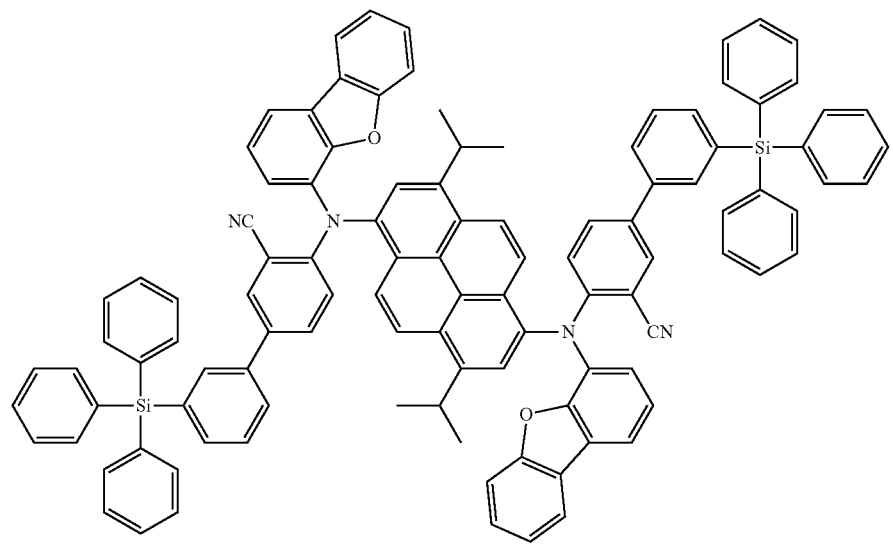

-continued
BD42
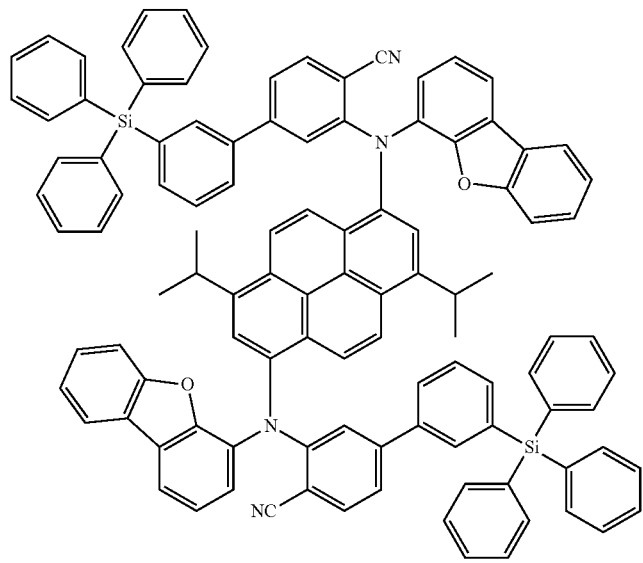
BD43
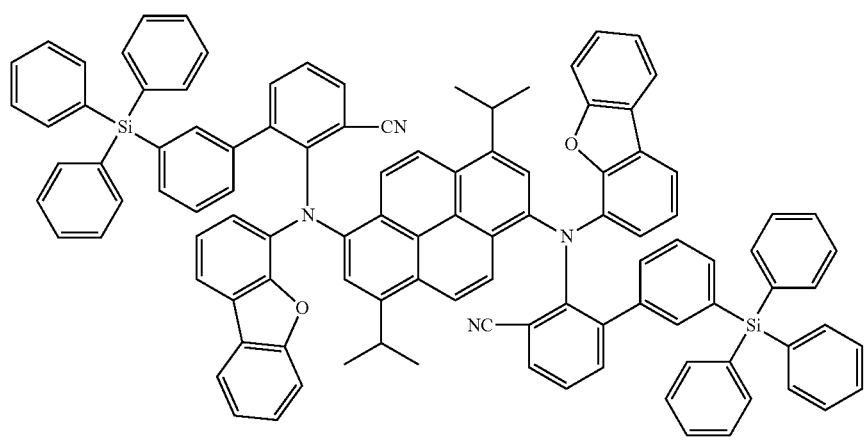
BD44
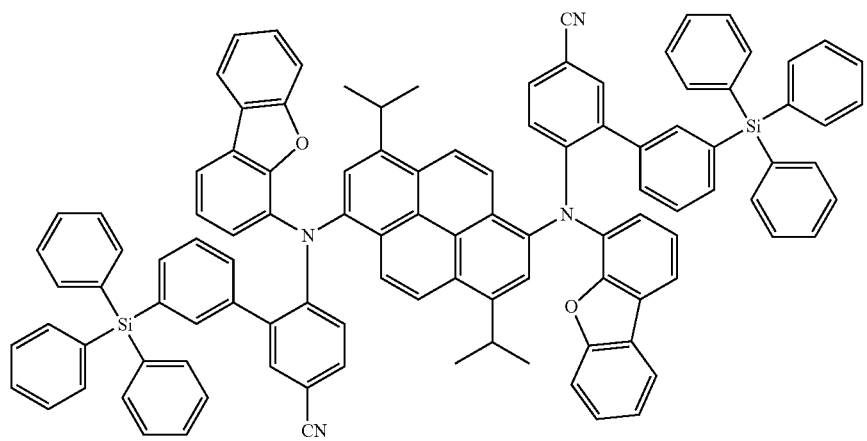

BD45
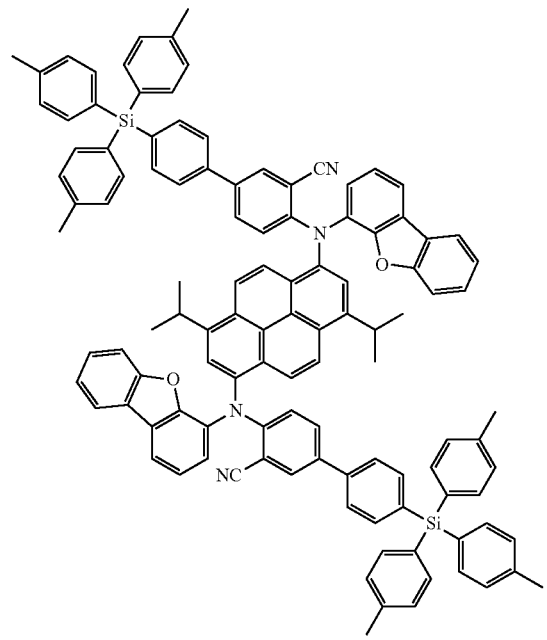
BD46
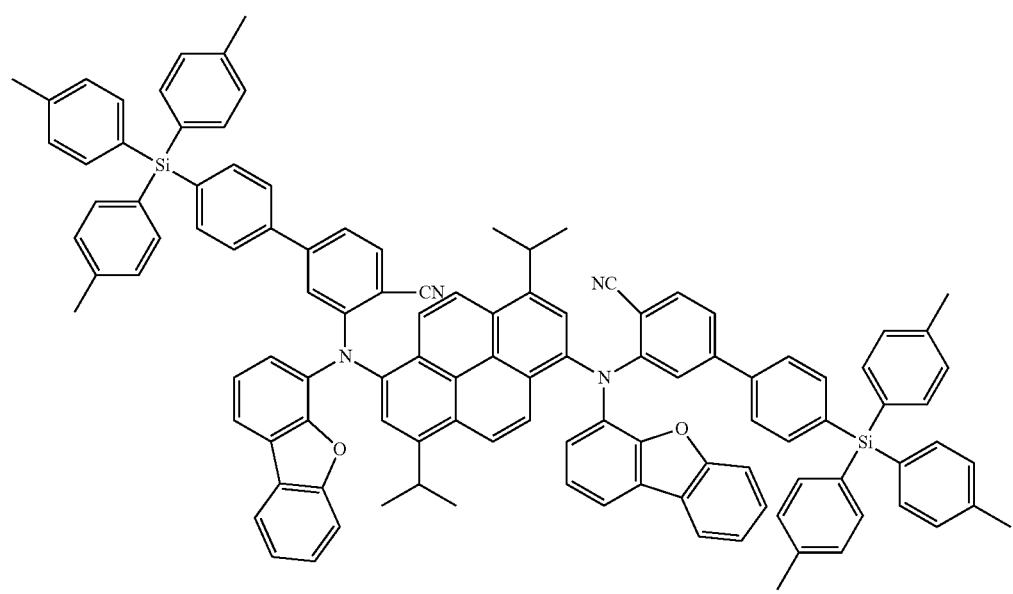
BD47
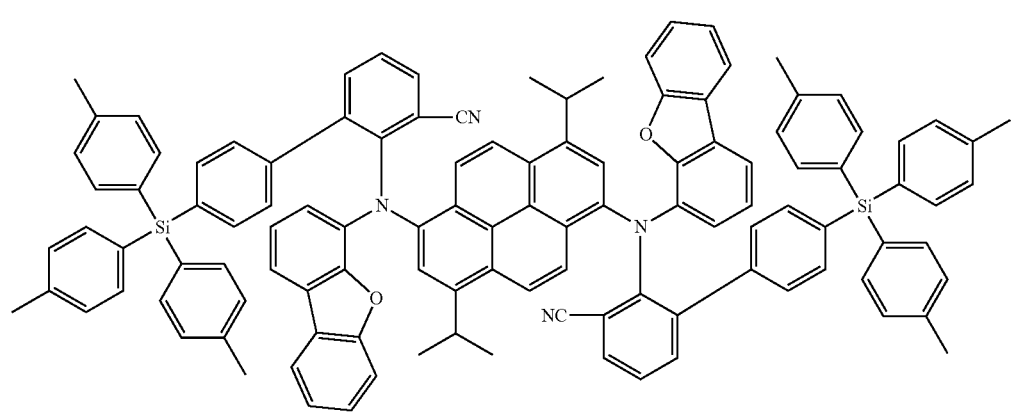

-continued
BD48
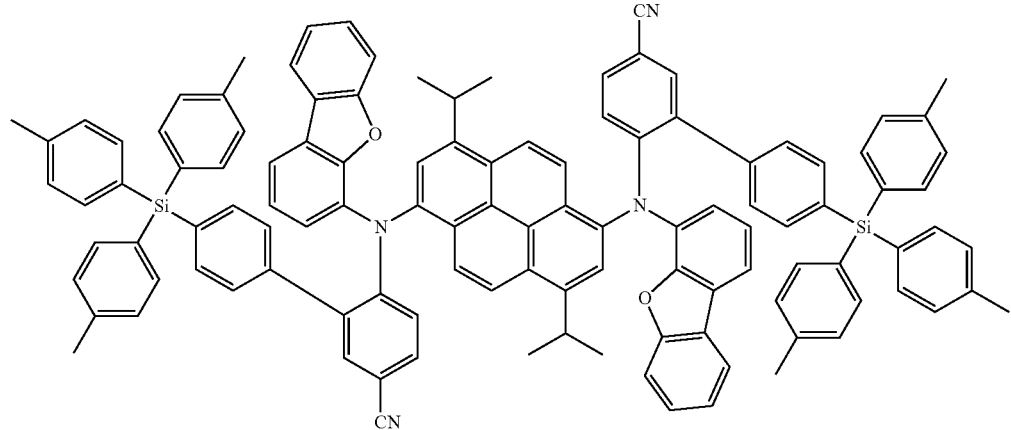
BD49
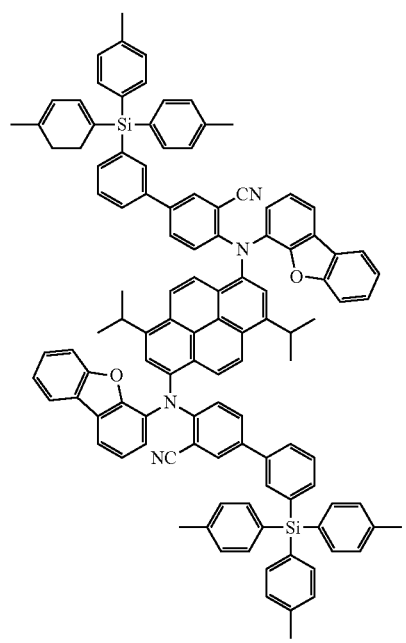
BD50
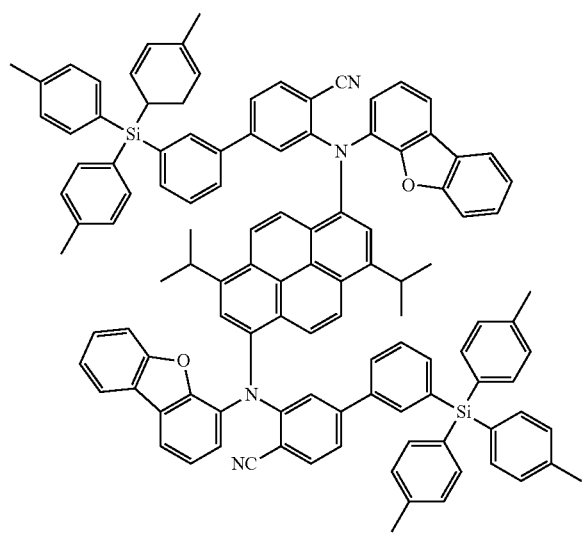
BD51
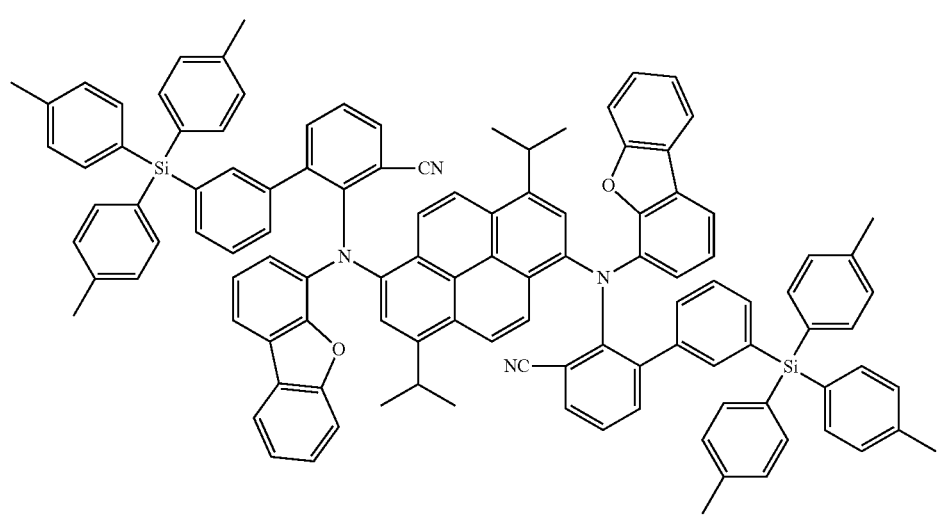

-continued
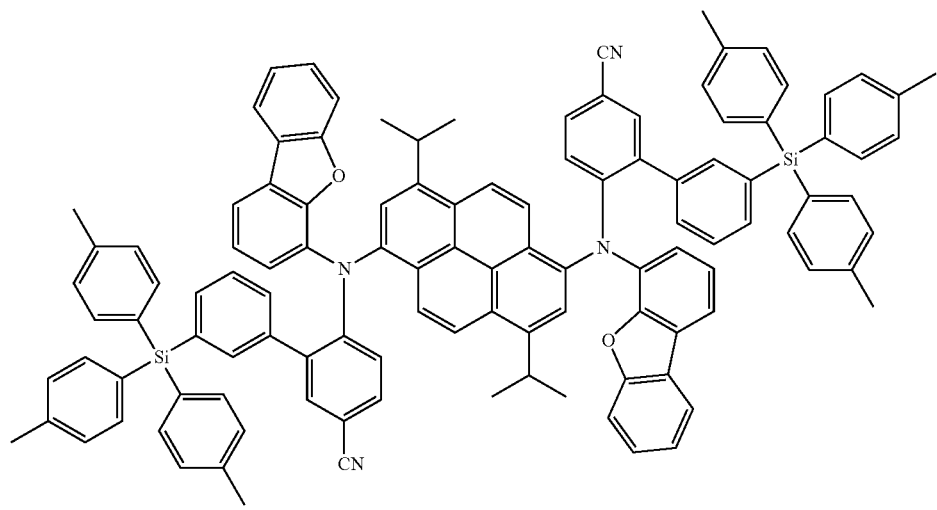
BD52
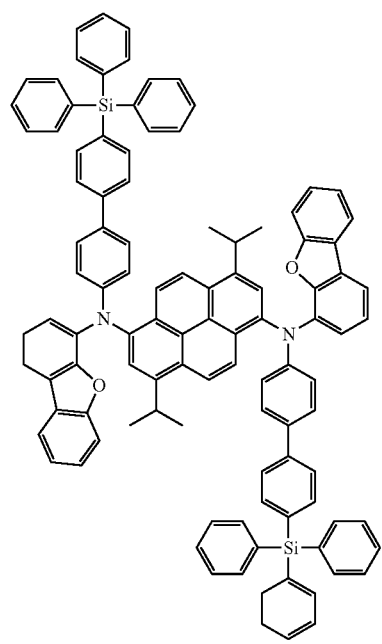
BD53
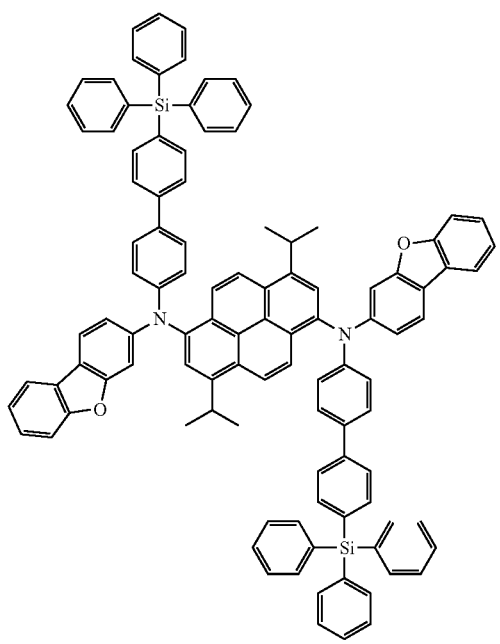
BD54

BD55
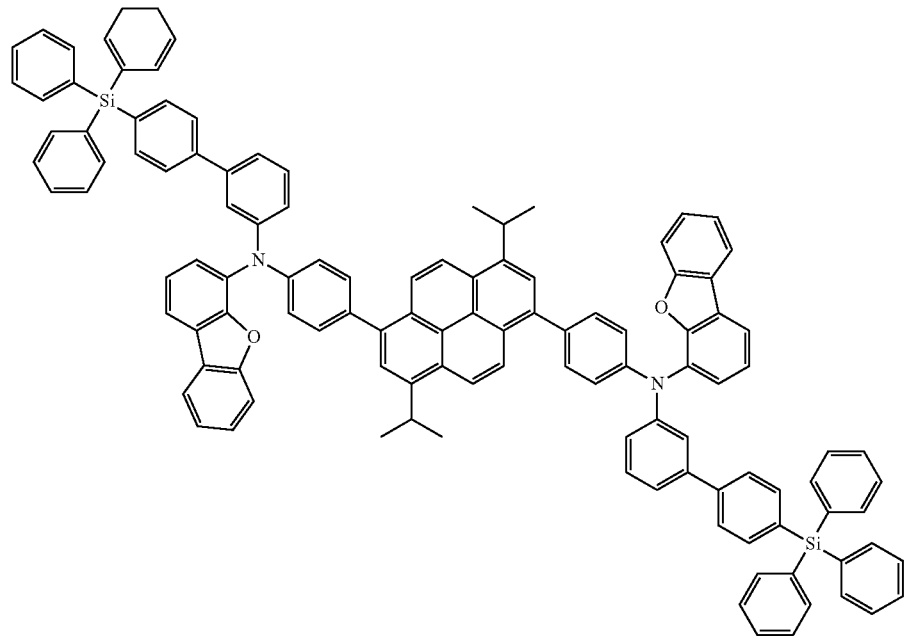
BD56
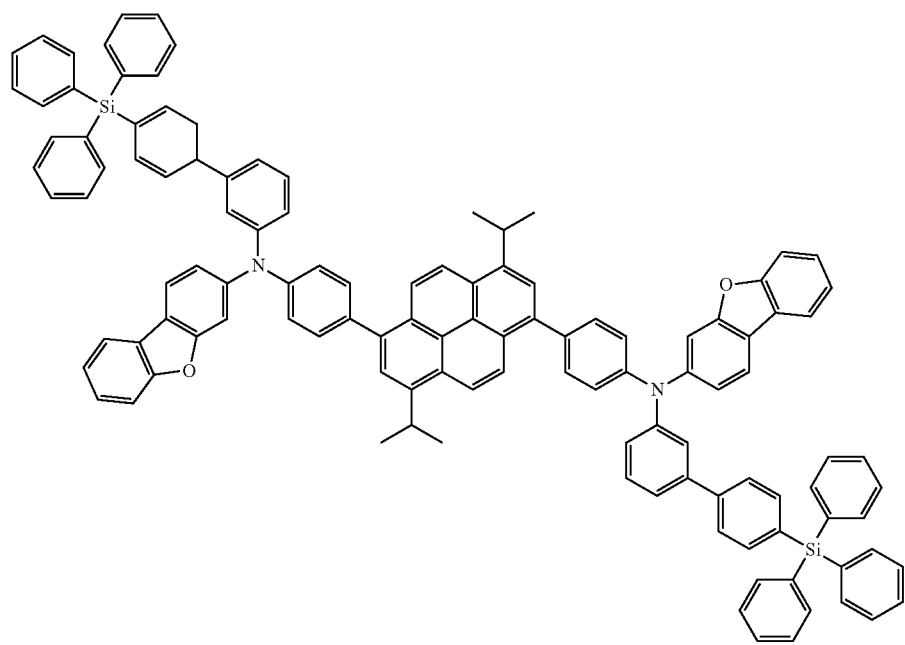

BD57
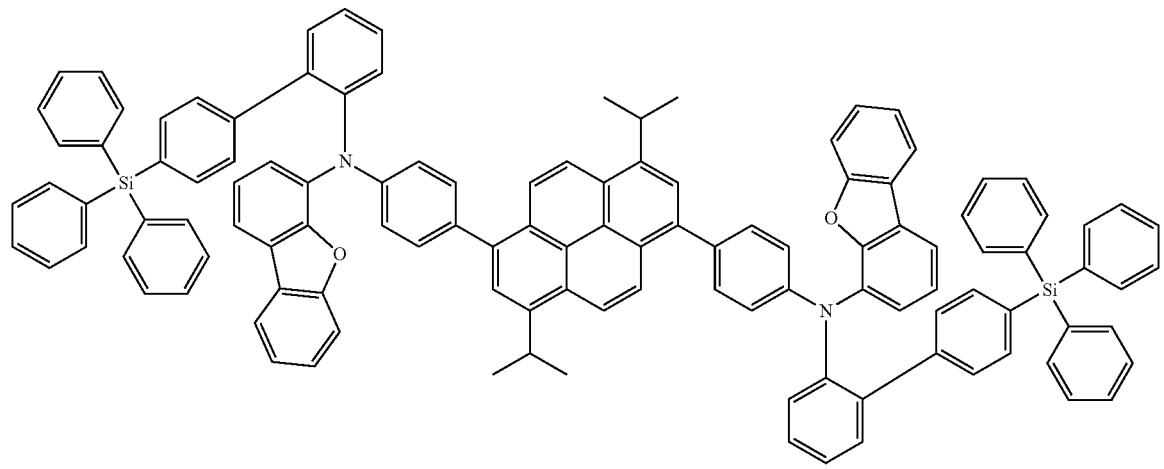
BD58
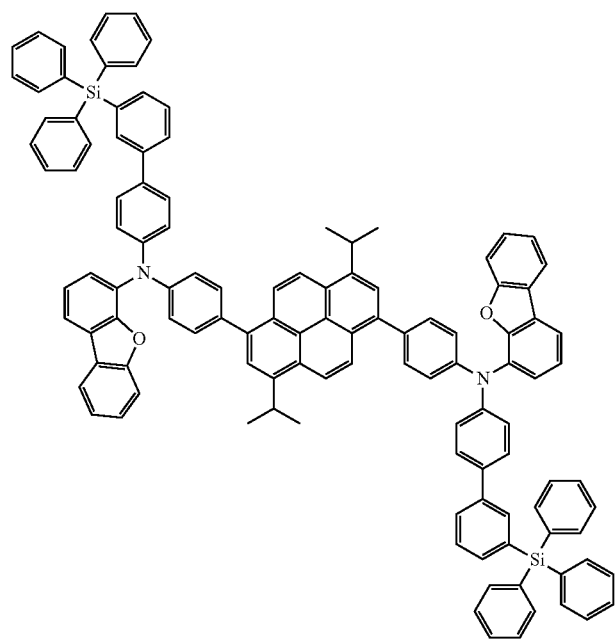

BD59
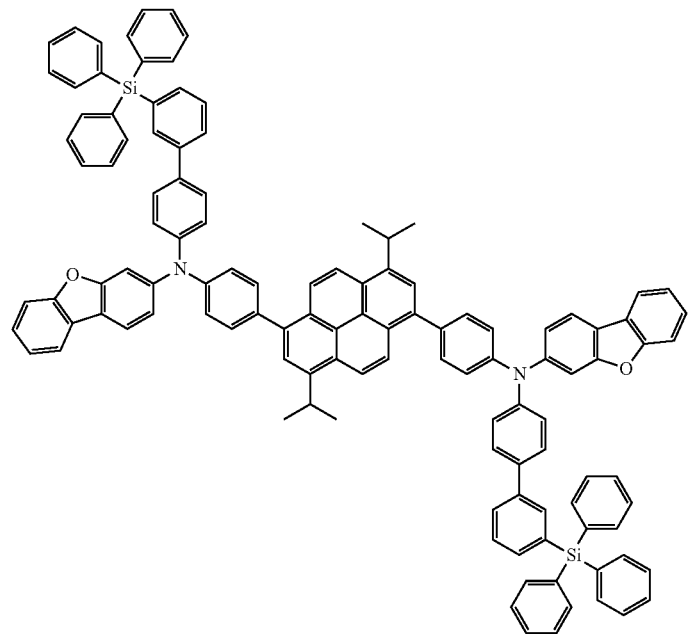
BD60
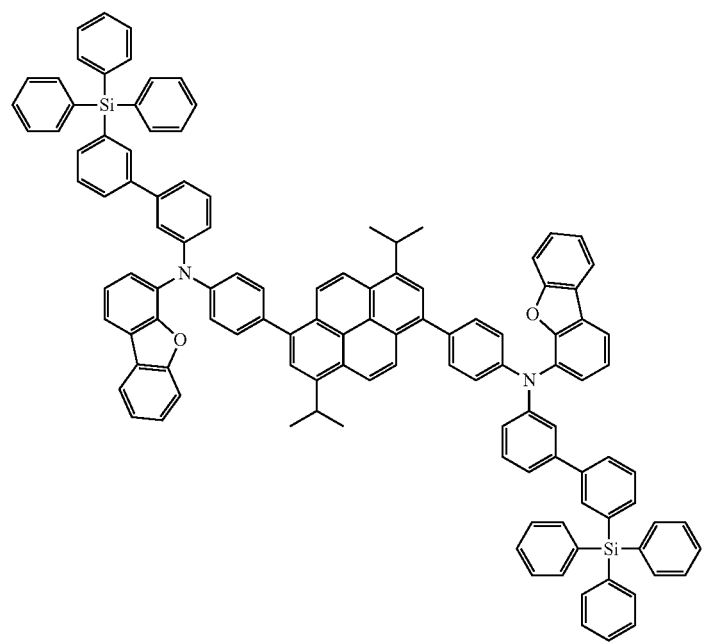

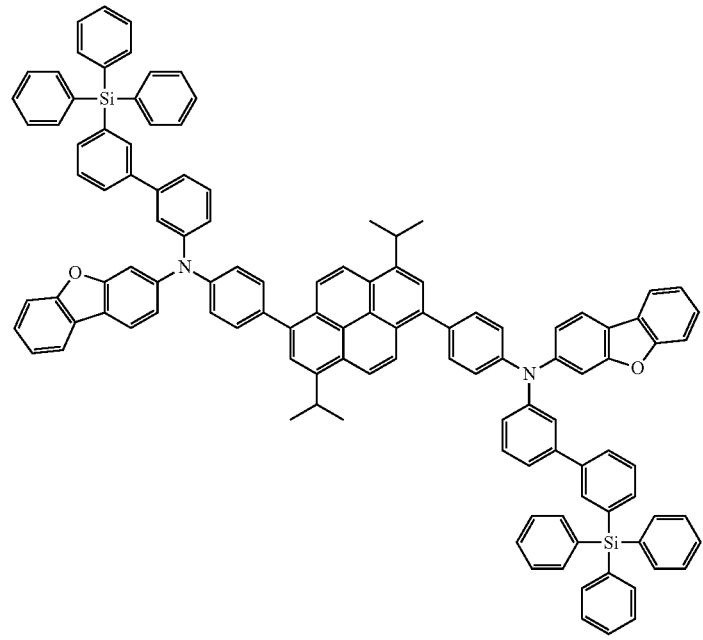
BD61
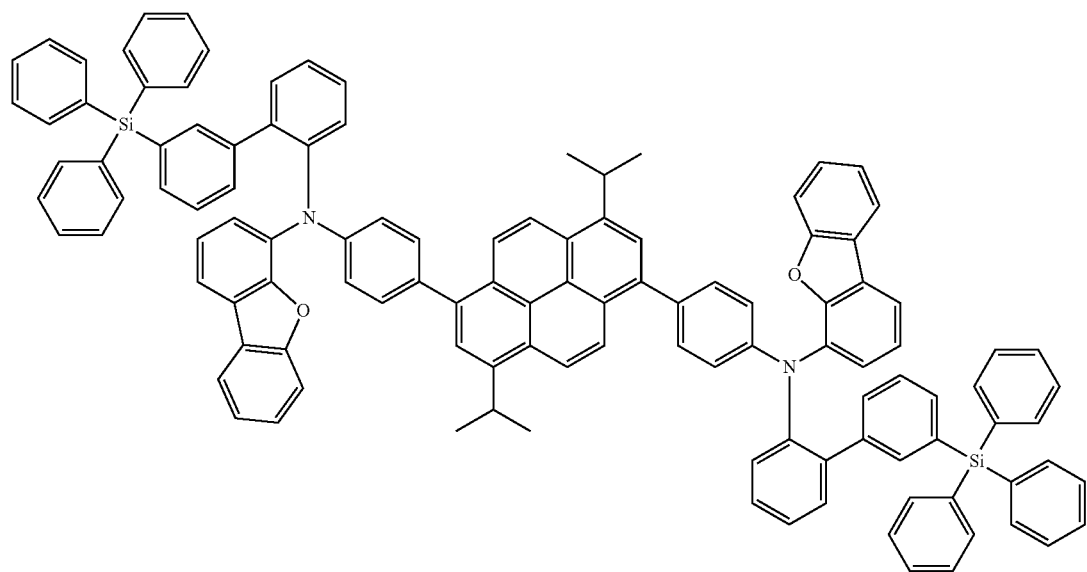
BD62

BD63
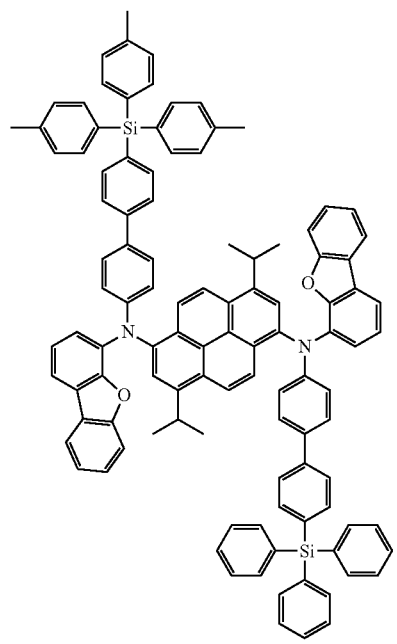
BD64
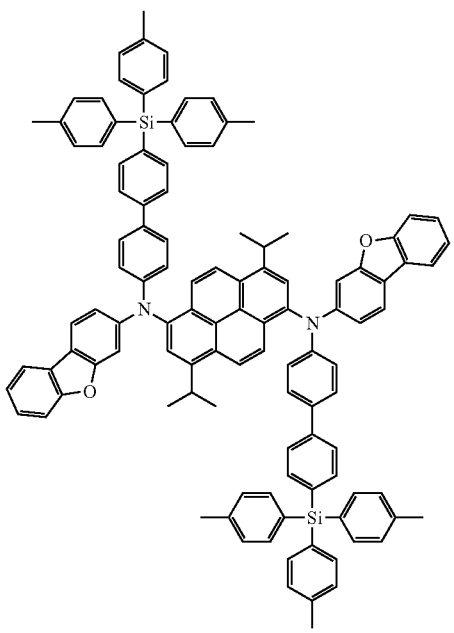
BD65
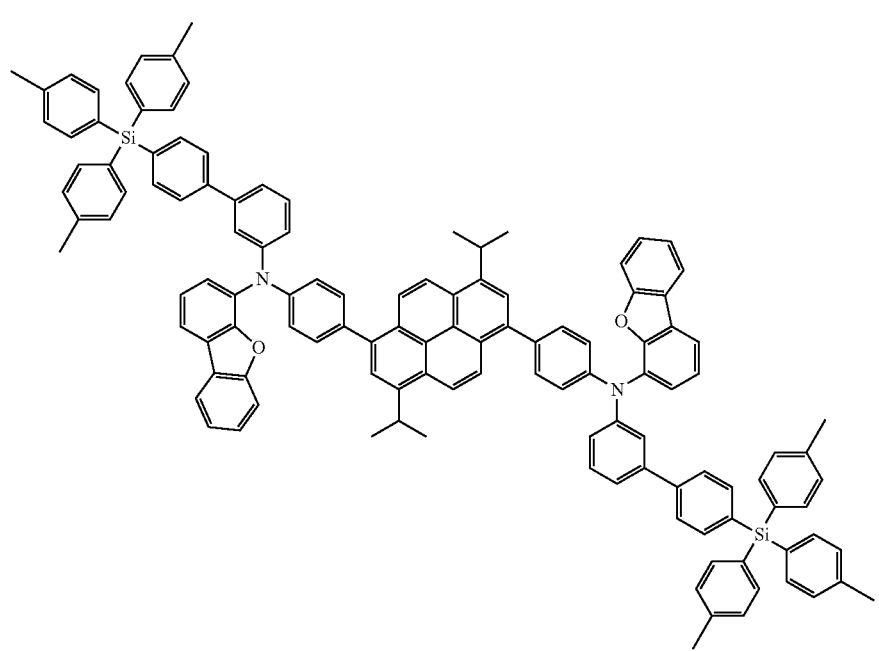

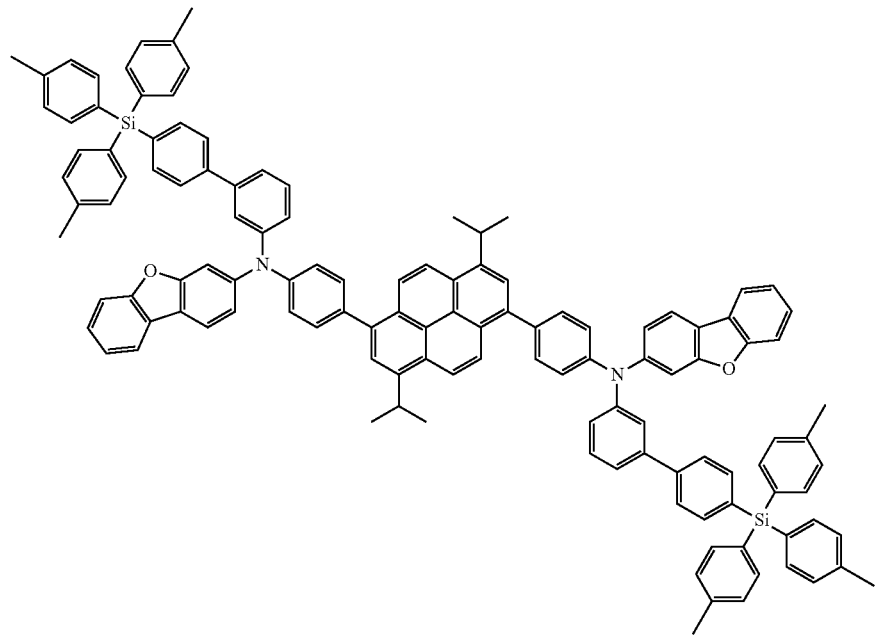
BD66
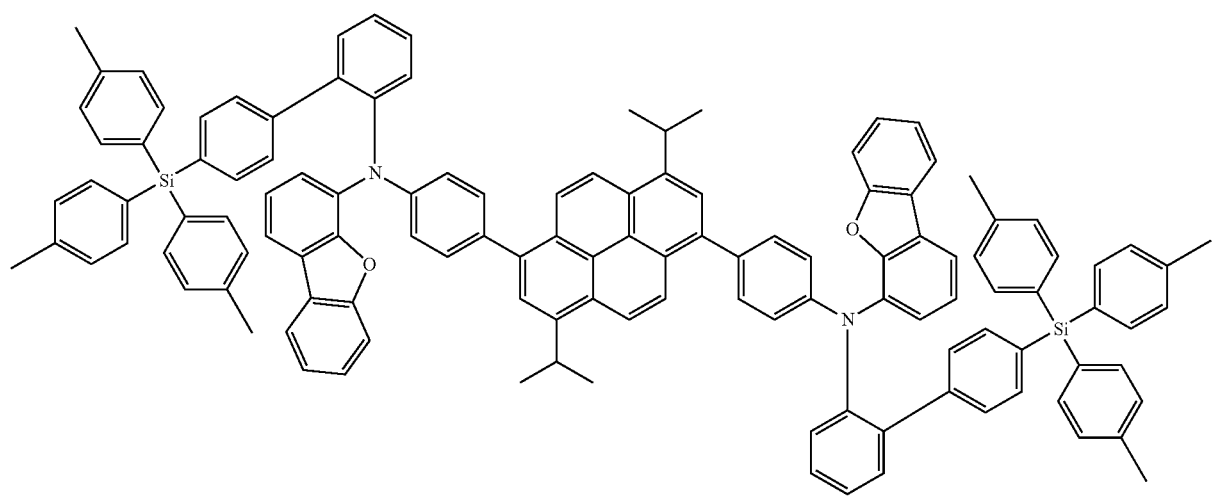
BD67

-continued
BD68
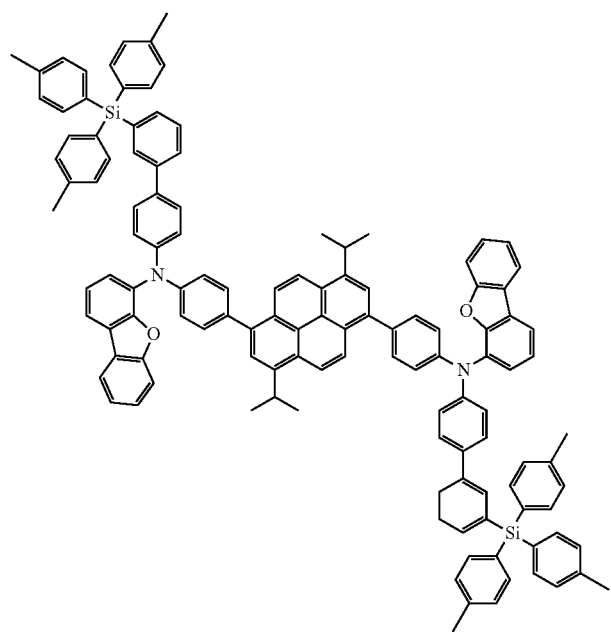
BD69
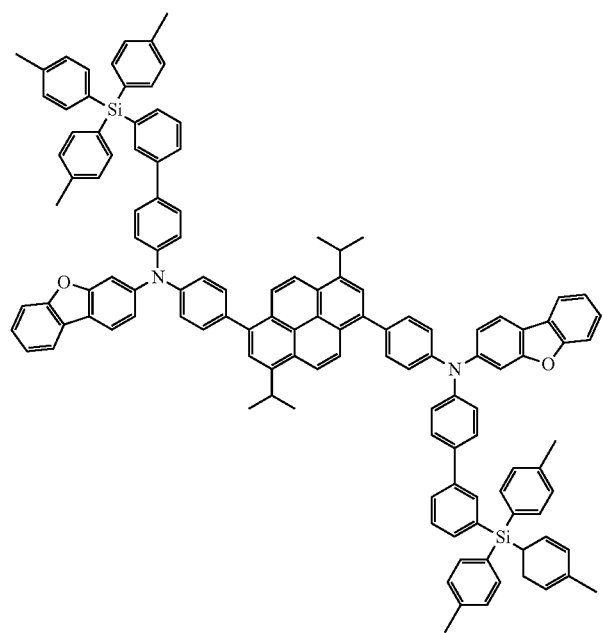

-continued
BD70
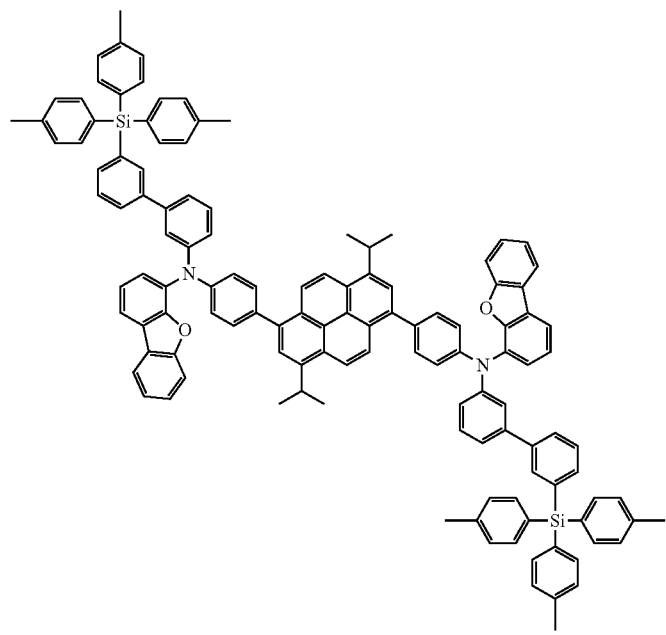
BD71
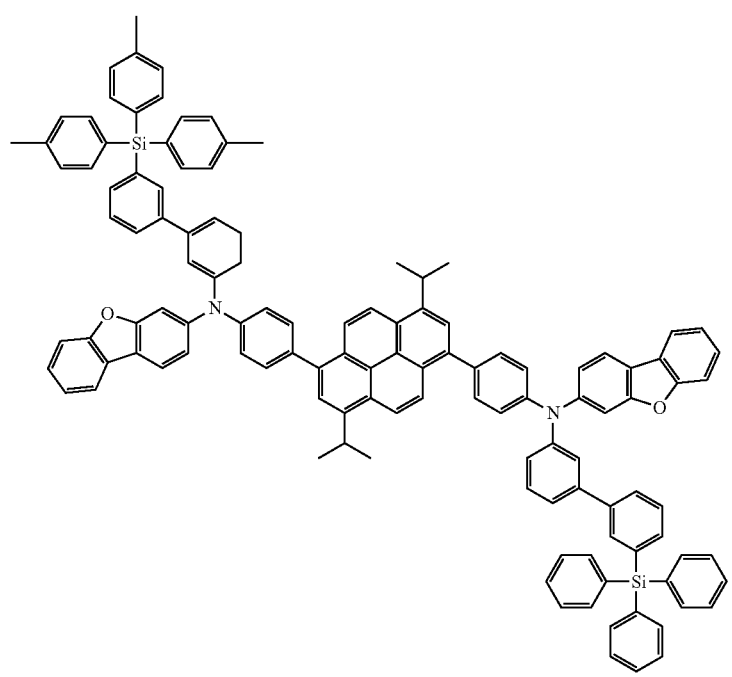

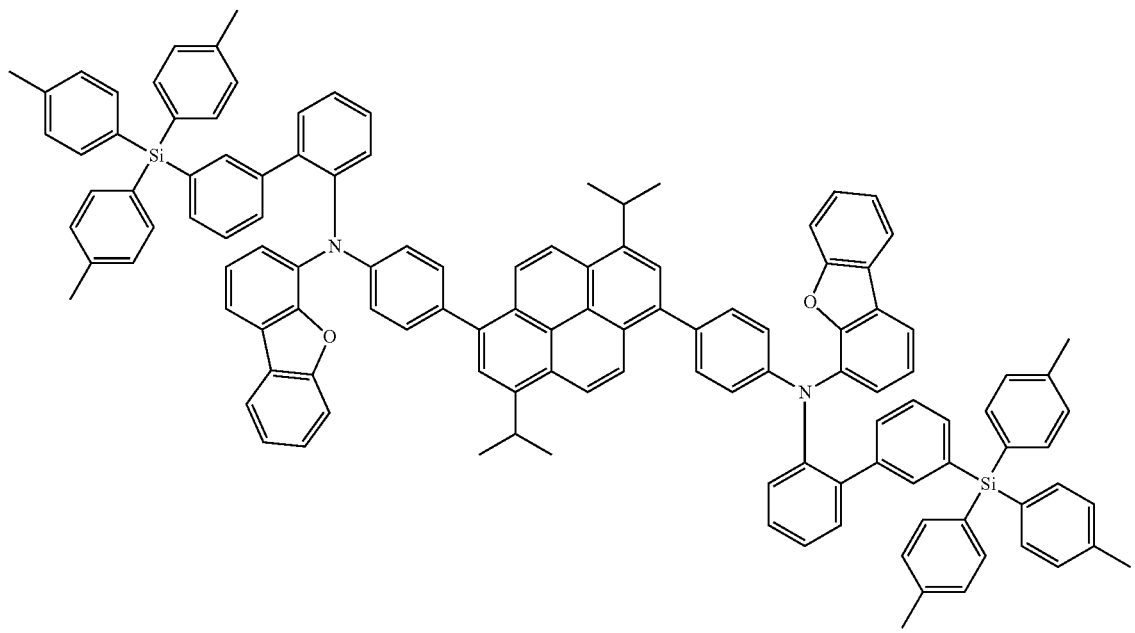

BD72

The present specification provides a coating composition including the compound.

According to an exemplary embodiment of the present specification, the coating composition may further include a solvent.

In an exemplary embodiment of the present specification, the coating composition may be in a liquid phase. The "liquid phase" means that the composition is in a liquid state at room temperature under atmospheric pressure.

In an exemplary embodiment of the present specification, examples of the solvent include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; an aliphatic hydrocarbon-based solvent such as cyclohexane, methylcyclohexane, n-pentane, n-hexane, n-heptane, n-octane, n-nonane, and n-decane; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but any solvent may be used as long as the solvent may dissolve or disperse the compound according to an exemplary embodiment of the present specification, and the examples are not limited thereto.

In an exemplary embodiment of the present specification, the solvent is an aromatic hydrocarbon-based solvent. Preferably, the solvent is toluene, but is not limited thereto.

In another exemplary embodiment, the solvents may be used either alone or in a mixture of two or more solvents.

In still another exemplary embodiment, a boiling point of the solvent is preferably 40° C. to 250° C., and more preferably 60° C. to 230° C., but is not limited thereto.

In yet another exemplary embodiment, a viscosity of the single solvent or the mixed solvent is preferably 1 CP to 10 CP, and more preferably 3 CP to 8 CP, but is not limited thereto.

In still yet another exemplary embodiment, a concentration of the coating composition is preferably 0.1 wt/v % to 20 wt/v %, and more preferably 0.5 wt/v % to 5 wt/v %, but is not limited thereto. When the concentration of the coating composition satisfies the above range, an organic material layer of an organic light emitting device is easily formed.

The present specification also provides an organic light emitting device formed by using the coating composition.

An exemplary embodiment of the present specification provides an organic light emitting device including: a first electrode; a second electrode; and an organic material layer having one or more layers provided between the first electrode and the second electrode, in which one or more layers of the organic material layer include a cured product of the coating composition.

In an exemplary embodiment of the present specification, the cured product of the coating composition is in a state in which the coating composition is cured by a heat treatment or a light treatment.

In an exemplary embodiment of the present specification, the first electrode is a cathode, and the second electrode is an anode.

In another exemplary embodiment, the first electrode is an anode, and the second electrode is a cathode.

In an exemplary embodiment of the present specification, the organic material layer including the cured product of the coating composition is a hole transport layer, a hole injection layer, or a layer which simultaneously transports and injects holes.

In an exemplary embodiment of the present specification, the organic material layer including the cured product of the coating composition is a light emitting layer.

In another exemplary embodiment, the organic material layer including the cured product of the coating composition includes a light emitting layer, and the light emitting layer includes the cured product of the coating composition as a dopant of the light emitting layer.

In still another exemplary embodiment, the organic material layer including the cured product of the coating composition may be a light emitting layer, the light emitting layer may include the compound represented by Formula 1 as a blue dopant of the light emitting layer, and a maximum emission wavelength of the dopant may be within a range of 420 nm to 520 nm.

According to yet another exemplary embodiment, the organic material layer including the cured product of the coating composition may be a light emitting layer, and the light emitting layer may include the compound represented by Formula 1 as a dopant of the light emitting layer, and may further include a host material. In this case, a mass ratio of a host to a dopant (host:dopant) is 80:20 to 99:1. Specifically, the mass ratio may be 90:10 to 99:1, and more specifically 90:10 to 95:5. When the mass ratio satisfies the above content, the efficiency and service life of the device may be improved.

In an exemplary embodiment of the present specification, the coating composition includes the compound represented by Formula 1 and a compound represented by the following Formula H. Specifically, the coating composition includes the compound represented by Formula 1 as a dopant, and includes a compound represented by the following Formula H as a host.

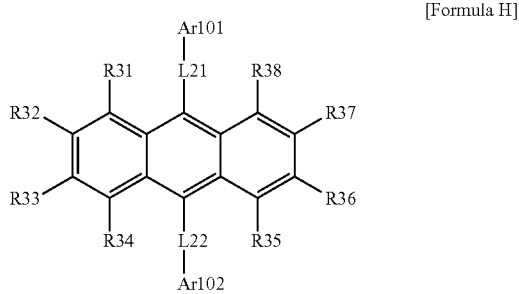

[Formula H]

In Formula H,

L21 and L22 are the same as or different from each other, and are each independently a direct bond; a substituted or unsubstituted arylene group; or a substituted or unsubstituted heteroarylene group, R31 to R38 are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heteroaryl group, and Ar101 and Ar102 are the same as or different from each other, and are each independently a substituted or unsubstituted aryl group; or a substituted or unsubstituted heteroaryl group.

In an exemplary embodiment of the present specification, L21 and L22 are the same as or different from each other, and are each independently a direct bond; a substituted or unsubstituted arylene group having 6 to 30 carbon atoms; or a substituted or unsubstituted heteroarylene group having 2 to 30 carbon atoms and including N, O, or S.

In an exemplary embodiment of the present specification, L21 and L22 are the same as or different from each other, and are each independently a direct bond; a substituted or unsubstituted phenylene group; a substituted or unsubstituted naphthylene group; or a substituted or unsubstituted thiophenylene group.

In an exemplary embodiment of the present specification, Ar101 and Ar102 are the same as or different from each other, and are each independently a substituted or unsubstituted aryl group having 6 to 50 carbon atoms; or a substituted or unsubstituted heteroaryl group having 2 to 50 carbon atoms.

In an exemplary embodiment of the present specification, Ar101 and Ar102 are the same as or different from each other, and are each independently a substituted or unsubstituted monocyclic to tetracyclic aryl group; or a substituted or unsubstituted monocyclic to tetracyclic heteroaryl group.

In an exemplary embodiment of the present specification, Ar101 and Ar102 are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted anthracene group; a substituted or unsubstituted phenanthryl group; a substituted or unsubstituted phenalene group; a substituted or unsubstituted fluorenyl group; a substituted or unsubstituted benzofluorenyl group; a substituted or unsubstituted furan group; a substituted or unsubstituted thiophene group; a substituted or unsubstituted dibenzofuran group; a substituted or unsubstituted naphthobenzofuran group; a substituted or unsubstituted dibenzothiophene group; or a substituted or unsubstituted naphthobenzothiophene group.

In an exemplary embodiment of the present specification, R31 to R38 are hydrogen.

In an exemplary embodiment of the present specification, Formula H is any one selected from the following compounds.

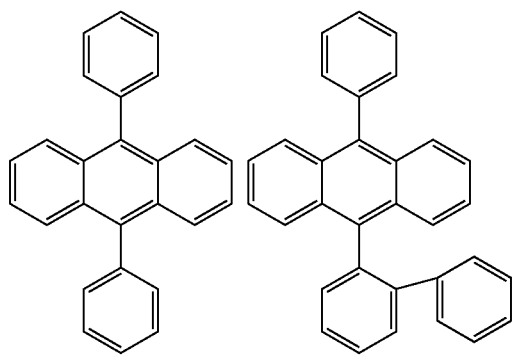

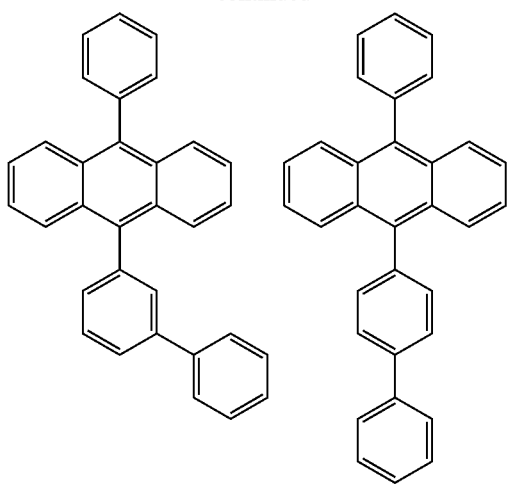
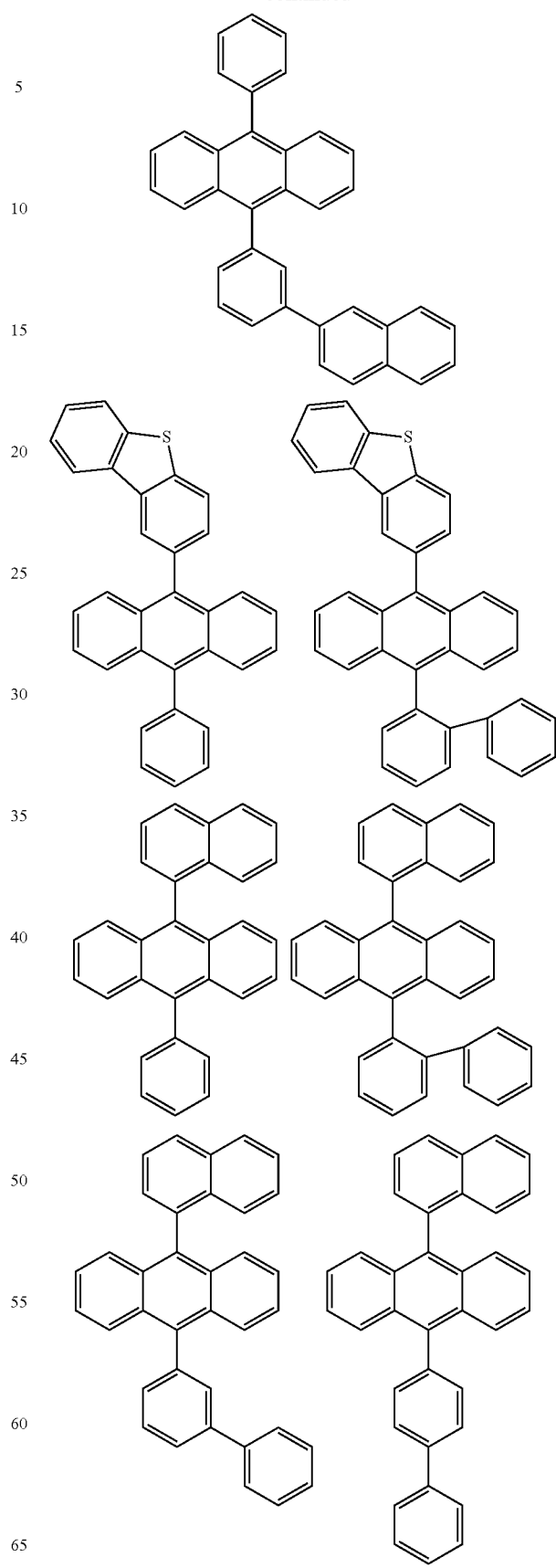

91
-continued
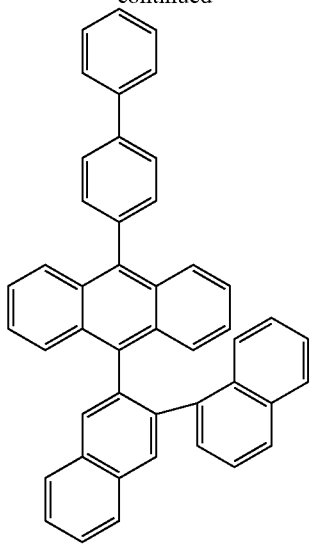
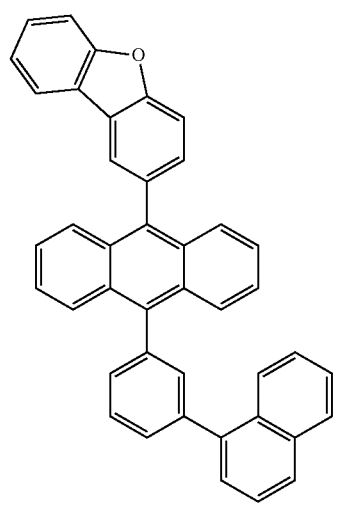
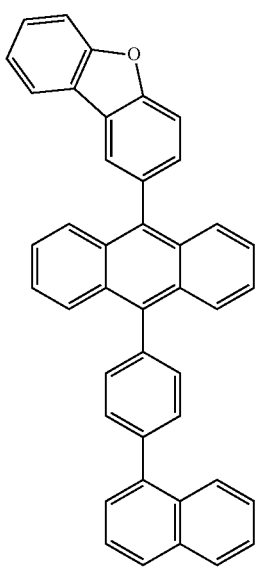
92
-continued
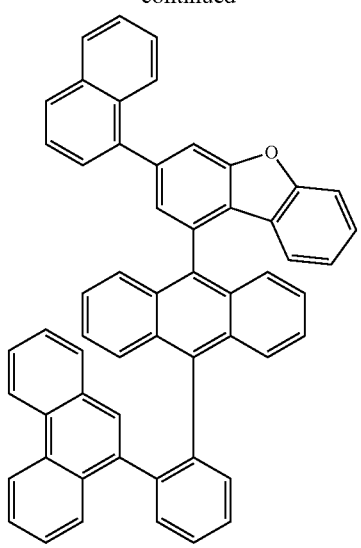
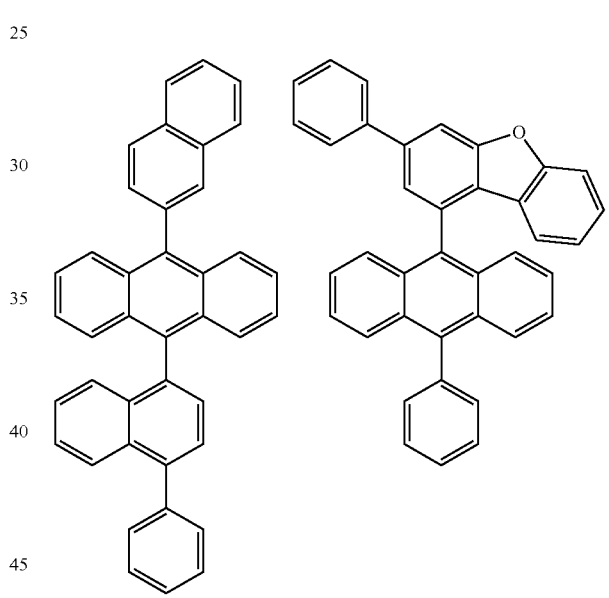
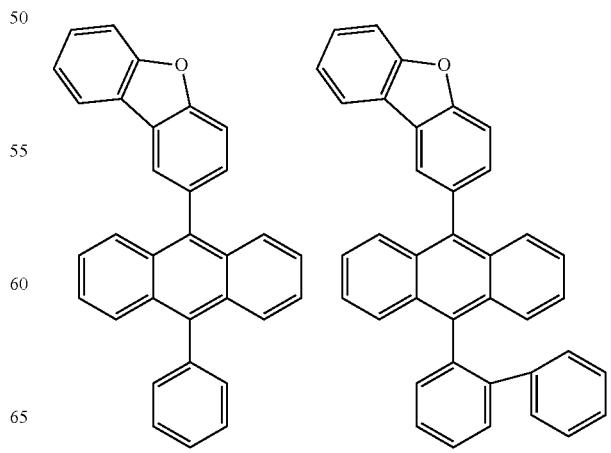

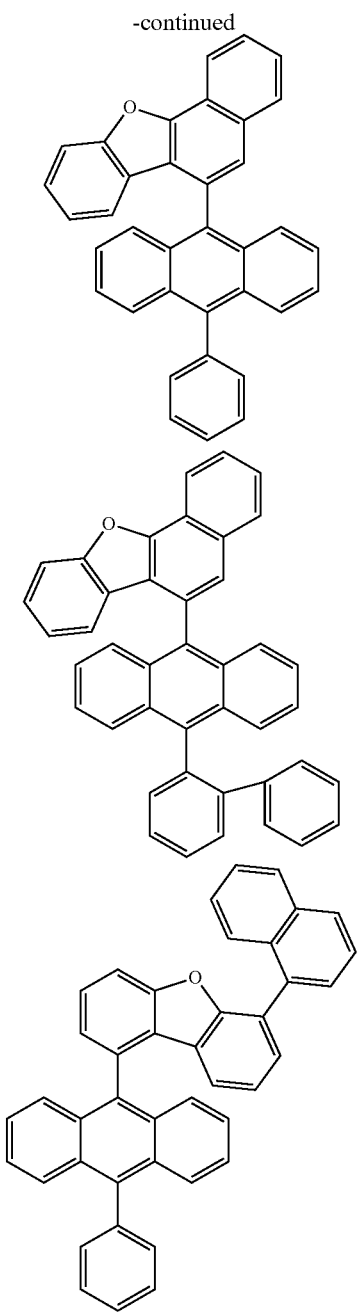

The host material is not limited to the compound represented by Formula H, those known in the art may be used, and examples thereof include a fused aromatic ring derivative, a hetero ring-containing compound, or the like. Specifically, examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

In an exemplary embodiment of the present specification, the organic light emitting device may further include one or two or more layers selected from the group consisting of a hole injection layer, a hole transport layer, an electron transport layer, an electron injection layer, an electron blocking layer, and a hole blocking layer.

In another exemplary embodiment, the organic light emitting device may be a normal type organic light emitting device in which an anode, an organic material layer having one or more layers, and a cathode are sequentially stacked on a substrate.

In still another exemplary embodiment, the organic light emitting device may be an inverted type organic light emitting device in which a cathode, an organic material layer having one or more layers, and an anode are sequentially stacked on a substrate.

The organic material layer of the organic light emitting device of the present specification may also be composed of a single-layered structure, but may be composed of a multi-layered structure in which an organic material layer having two or more layers is stacked. For example, the organic light emitting device of the present specification may have a structure including a hole injection layer, a hole transport layer, a light emitting layer, an electron transport layer, an electron injection layer, and the like as organic material layers. However, the structure of the organic light emitting device is not limited thereto, and may include a fewer number of organic material layers.

For example, the structure of the organic light emitting device according to an exemplary embodiment of the present specification is exemplified in FIG. 1.

FIG. 1 exemplifies a structure of an organic light emitting device in which a first electrode 201, a hole injection layer 301, a hole transport layer 401, a light emitting layer 501, an electron transport layer 601, and a second electrode 701 are sequentially stacked on a substrate 101.

In an exemplary embodiment of the present specification, the light emitting layer 501 in FIG. 1 may be formed by using the coating composition including the compound represented by Formula 1.

FIG. 1 exemplifies an organic light emitting device, and the organic light emitting device is not limited thereto.

When the organic light emitting device includes a plurality of organic material layers, the organic material layers may be formed of the same material or different materials.

The organic light emitting device of the present specification may be manufactured by the materials and methods known in the art, except that one or more layers of the organic material layer are formed by using the coating composition including the compound represented by Formula 1.

For example, the organic light emitting device of the present specification may be manufactured by sequentially stacking an anode, an organic material layer, and a cathode on a substrate. In this case, an anode is formed by depositing a metal or a metal oxide having conductivity, or an alloy thereof on a substrate using a physical vapor deposition (PVD) method such as sputtering or e-beam evaporation. The organic light emitting device may be manufactured by forming an organic material layer including a hole injection layer, a hole transport layer, a light emitting layer, an electron injection layer, and an electron transport layer thereon through a deposition or solution process, and then depositing a material, which may be used as a cathode, thereon. In addition to the method described above, an organic light emitting device may be manufactured by sequentially depositing a cathode material, a material for an organic material layer, and an anode material on a substrate.

As the anode material, materials having a high work function are usually preferred so as to facilitate the injection of holes into an organic material layer. Specific examples of the anode material which may be used in the present specification include a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as $ZnO:Al$ or $SnO_2:Sb$; a conductive polymer such as poly(3-methylthiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal such as barium, magnesium, calcium, sodium, potassium, titanium, indium, yttrium, lithium, gadolinium, aluminum, silver, tin, and lead, or an alloy thereof; a multi-layer structured material such as $LiF/Al$ or $LiO_2/Al$; and the like, but are not limited thereto.

The hole injection layer is a layer which injects holes from an electrode, and a hole injection material is preferably a material which has a capability of transporting holes and thus has an effect of injecting holes at an anode, or an excellent effect of injecting holes into a light emitting layer or a light emitting material. Further, the hole injection material is preferably a compound which prevents excitons produced from a light emitting layer from moving to an electron injection layer or an electron injection material, and is excellent in the ability to form a thin film. In addition, the highest occupied molecular orbital (HOMO) of the hole injection material is preferably a value between the work function of the anode material and the HOMO of the neighboring organic material layer. Specific examples of the hole injection material include metal porphyrin, oligothiophene, and arylamine-based organic materials; hexanitrile hexaazatriphenylene-based organic materials; quinacridone-based organic materials; perylene-based organic materials; anthraquinone, polyaniline-based and polythiophene-based conductive polymers, and the like, but are not limited thereto.

The hole transport layer is a layer which accepts holes from a hole injection layer and transports the holes to a light emitting layer, and a hole transport material is suitably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The light emitting material is a material which may receive holes and electrons from a hole transport layer and an electron transport layer, respectively, and combine the holes and the electrons to emit light in a visible light region, and is preferably a material having high quantum efficiency for fluorescence or phosphorescence when the organic light emitting device of the present specification includes an additional light emitting layer in addition to a light emitting layer including the compound represented by Formula 1. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene; lubrene; and the like, but are not limited thereto.

The light emitting layer may include a host material and a dopant material. Examples of the host material include a fused aromatic ring derivative, a hetero ring-containing compound, or the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

Examples of the dopant material include aromatic amine derivatives, styrylamine compounds, boron complexes, fluoranthene compounds, pyrene derivatives, metal complexes, and the like. Specifically, the aromatic amine derivative is a fused aromatic ring derivative having a substituted or unsubstituted arylamine group, and examples thereof include pyrene, anthracene, chrysene, periflanthene, and the like having an arylamine group. Further, the styrylamine compound is a compound in which a substituted or unsubstituted arylamine is substituted with at least one arylvinyl group, and the substituted or unsubstituted arylamine means an arylamine group in which one or two or more substituents selected from the group consisting of an aryl group, a silyl group, an alkyl group, a cycloalkyl group, and an arylamine group are substituted or unsubstituted. Specific examples thereof include styrylamine, styryldiamine, styryltriamine, styryltetramine, and the like, but are not limited thereto. Further, examples of the metal complex include iridium complexes, platinum complexes, and the like, but are not limited thereto.

The electron injection layer is a layer which injects electrons from an electrode, and an electron injection material is preferably a material which has a capability of transporting electrons, an effect of injecting electrons from a cathode, and an excellent effect of injecting electrons into a light emitting layer or a light emitting material. In addition, the electron injection material is preferably a compound which prevents excitons produced from a light emitting layer from moving to a hole injection layer, and is excellent in the ability to form a thin film. Specific examples thereof include fluorenone, anthraquinodimethane, diphenoquinone, thiopyran dioxide, oxazole, oxadiazole, triazole, imidazole, benzoimidazole, perylenetetracarboxylic acid, fluorenylidene methane, anthrone, and derivatives thereof, metal complex compounds, nitrogen-containing 5-membered ring derivatives, and the like, but are not limited thereto.

The electron transport layer is a layer which accepts electrons from an electron injection layer and transports the electrons to a light emitting layer, and an electron transport material is suitably a material having high electron mobility which may proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. In addition, the electron transport layer may be used with any desired cathode material, as used according to the related art. In particular, an appropriate cathode material is a typical material which has a low work function, followed by an aluminum layer or a silver layer. Specific examples thereof include cesium, barium, calcium, ytterbium, and samarium, in each case followed by an aluminum layer or a silver layer.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples of a hole blocking material include oxadiazole derivatives or triazole derivatives, phenanthroline derivatives, BCP, aluminum complexes, and the like, but are not limited thereto.

The organic light emitting device according to the present specification may be a top emission type, a bottom emission type, or a dual emission type according to the materials to be used.

In an exemplary embodiment of the present specification, the compound may be included in an organic solar cell or an organic transistor in addition to the organic light emitting device.

The present specification also provides a method for manufacturing an organic light emitting device formed by using the coating composition.

Specifically, in an exemplary embodiment of the present specification, the method includes: preparing a substrate; forming a first electrode on the substrate; forming an organic material layer having one or more layers on the first electrode; and forming a second electrode on the organic material layer, in which the forming of the organic material layer includes forming an organic material layer having one or more layers by using the coating composition.

In an exemplary embodiment of the present specification, the forming of the organic material layer having one or more layers by using the coating composition uses a spin coating method.

In another exemplary embodiment, the forming of the organic material layer having one or more layers by using the coating composition uses a printing method.

In an exemplary embodiment of the present specification, examples of the printing method include inkjet printing, nozzle printing, offset printing, transfer printing, screen printing, and the like, but are not limited thereto.

The coating composition according to an exemplary embodiment of the present specification is suitable for a solution process due to the structural characteristics thereof, so that the organic material layer may be formed by a printing method, and as a result, there is an economic effect in terms of time and costs when a device is manufactured.

In an exemplary embodiment of the present specification, the forming of the organic material layer having one or more layers by using the coating composition includes: coating the first electrode with the coating composition; and drying and curing the coating composition.

In an exemplary embodiment of the present specification, the forming of the organic material layer having one or more layers by using the coating composition uses an inkjet coating method or a spin coating method.

According to an exemplary embodiment of the present specification, the organic material layer is a light emitting layer. The coating composition is included as a dopant of the light emitting layer.

In an exemplary embodiment of the present specification, the drying and curing of the coating composition may be performed through a heat treatment, and the heat treatment temperature in heat-treating and drying the coating composition may be 60° C. to 180° C., may be 80° C. to 180° C. according to an exemplary embodiment, and may be 120° C. to 180° C. in another exemplary embodiment.

In another exemplary embodiment, the heat treatment time in the heat-treating, drying and curing of the coating composition may be 1 minute to 1 hour, may be 1 minute to 30 minutes according to an exemplary embodiment, and may be 10 minutes to 30 minutes in another exemplary embodiment. When the heat treatment time satisfies the above range, the solvent may be perfectly removed.

When the forming of the organic material layer having one or more layers by using the coating composition includes the heat-treating, drying and curing of the coating composition, it is possible to prevent, when another layer is stacked on the surface of the organic material layer formed by using the coating composition, the another layer from being dissolved, morphologically affected, or decomposed by the solvent.

[Mode for Invention]

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

SYNTHESIS EXAMPLES

Synthesis Example 1. Synthesis of Compound BD-5

(1) Synthesis of Intermediate 1-B

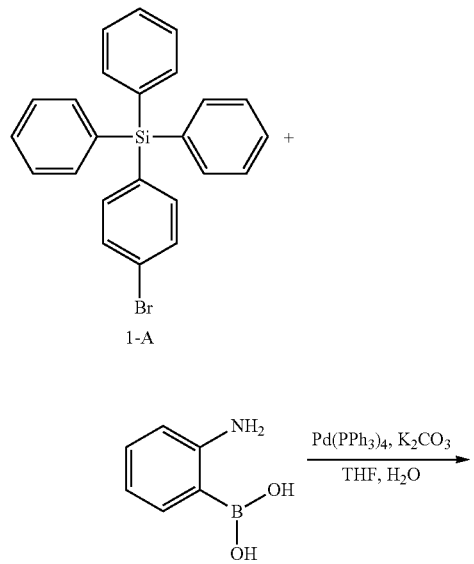

(2) Synthesis of Intermediate 1-C

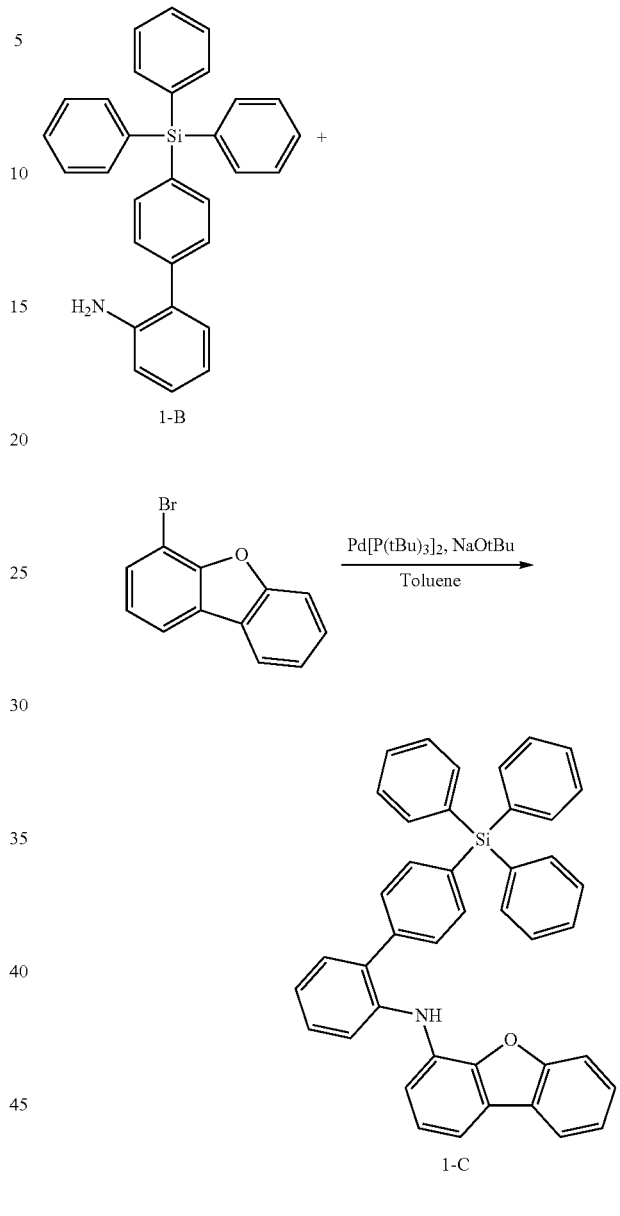

Intermediate 1-A (5 g, 12.04 mmol), 2-aminophenyl boronic acid (2 g, 14.44 mmol), Pd(PPh$_3$)$_4$ (700 mg, 0.602 mmol), and K$_2$CO$_3$ (7.3 g, 36.11 mmol) were put into a 250-mL round-bottom flask. 200 ml of tetrahydrofuran (THF) and 50 ml of H$_2$O were added thereto under a nitrogen condition, and the resulting solution was stirred for 8 hours by increasing the temperature up to 80° C. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 1-B was separated through recrystallization (methyl chloride/methanol).

Intermediate 1-B (2.4 g, 5.612 mmol), 4-bromodibenzofuran (1.16 g, 4.68 mmol), and sodium tert-butoxide (NaOtBu) (674 mg, 7.02 mmol) were put into a 250-ml round-bottom flask. 100 ml of toluene was added thereto under a nitrogen condition, and the temperature was increased up to 100° C. Pd(P(t-Bu$_3$))$_2$ (71.75 mg, 0.14 mmol) was added to the round-bottom flask, light was blocked, and then the resulting solution was stirred for 2 hours. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 1-C was separated through a column chromatography (methyl chloride/hexane).

(3) Synthesis of Compound BD-5

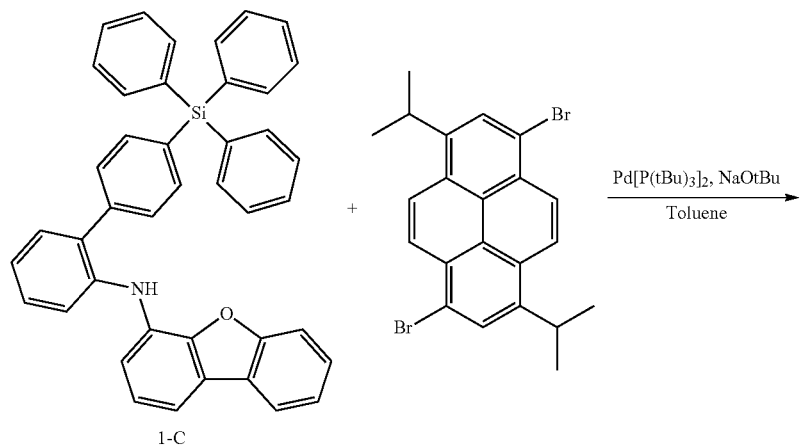

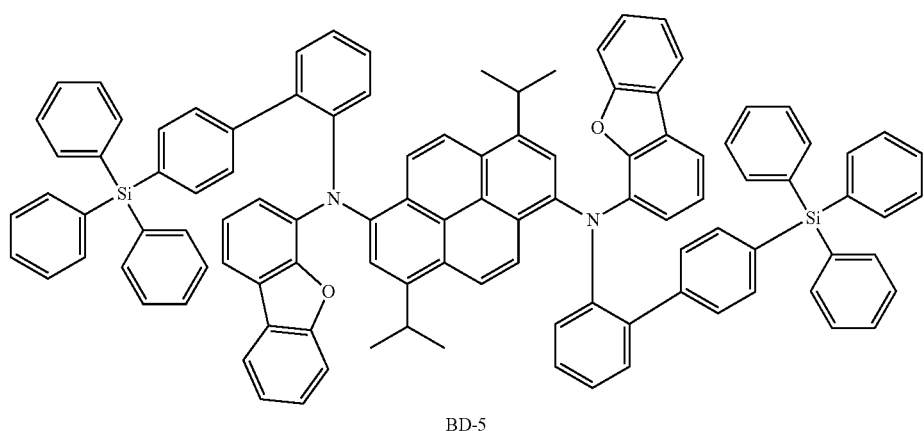
BD-5

Intermediate 1-C (2.4 g, 4.04 mmol), 1,6-dibromo-3,8-diisopropylpyrene (780 mg, 1.75 mmol), and sodium tert-butoxide (NaOt-Bu) (506.6 mg, 5.27 mmol) were put into a 250-ml round-bottom flask. 100 ml of toluene was added thereto under a nitrogen condition, and the temperature was increased up to 100° C. Pd(P(t-Bu$_3$))$_2$ (53.9 mg, 0.105 mmol) was added to the round-bottom flask, light was blocked, and then the resulting solution was stirred for 2 hours. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Compound BD-5 was separated through a column chromatography (methyl chloride/hexane).

MS (LC-MS): 1469.58 m/z [M$^+$]

FIG. 2 is a view illustrating LC-MS data of Compound BD-5.

Synthesis Example 2. Synthesis of Compound BD-10

(1) Synthesis of Intermediate 2-B

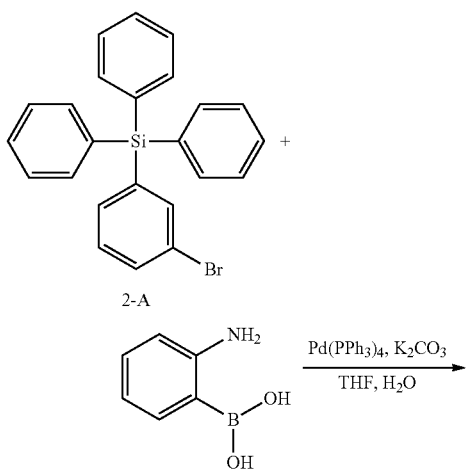

-continued

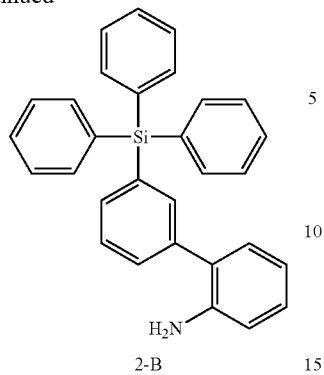

2-B

Intermediate 2-A (2.5 g, 6.08 mmol), 2-aminophenyl boronic acid (1 g, 7.3 mmol), Pd(PPh$_3$)$_4$ (351 mg, 0.304 mmol), and K$_2$CO$_3$ (2.515 g, 18.24 mmol) were put into a 250-mL round-bottom flask. 100 ml of tetrahydrofuran (THF) and 25 ml of H$_2$O were added thereto under a nitrogen condition, and the resulting solution was stirred for 8 hours by increasing the temperature up to 80° C. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 2-B was separated through recrystallization (methyl chloride/methanol).

(2) Synthesis of Intermediate 2-C

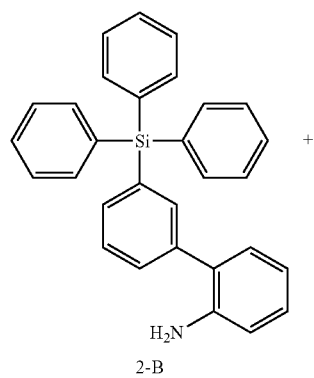

2-B

+

-continued

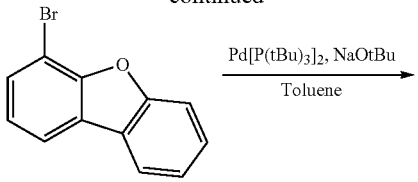

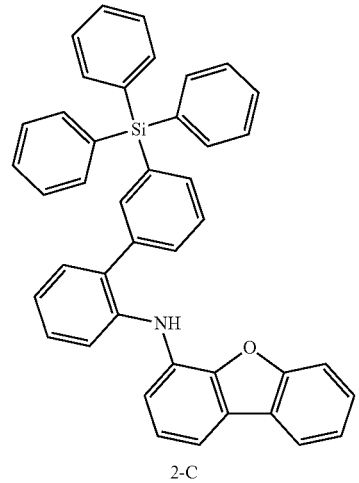

2-C

Intermediate 2-B (2.1 g, 3.5 mmol), 4-bromodibenzofuran (1.4 g, 2.9 mmol), and sodium tert-butoxide (NaOt-Bu) (421 mg, 4.38 mmol) were put into a 250-ml round-bottom flask. 100 ml of toluene was added thereto under a nitrogen condition, and the temperature was increased up to 100° C. Pd(P(t-Bu$_3$))$_2$ (44.8 mg, 0.1 mmol) was added to the round-bottom flask, light was blocked, and then the resulting solution was stirred for 2 hours. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 2-C was separated through a column chromatography (methyl chloride/hexane).

(3) Synthesis of Compound BD-10

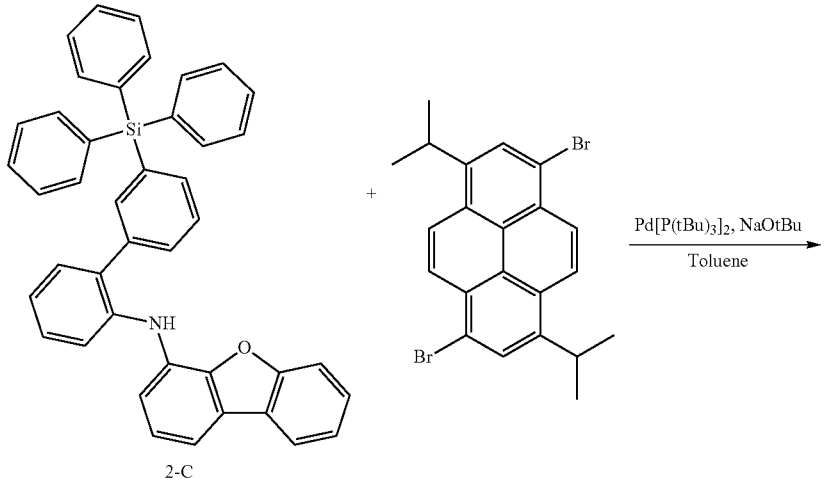

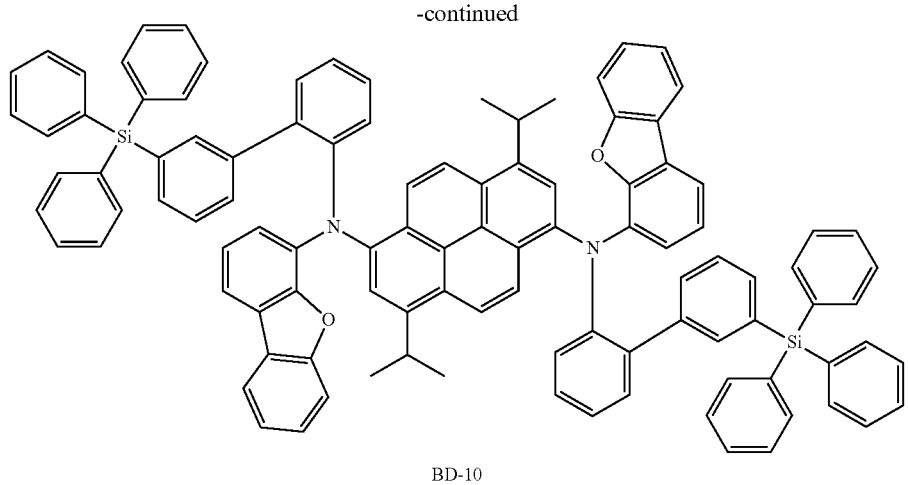

BD-10

Intermediate 2-C (2 g, 4.38 mmol), 1,6-dibromo-3,8-diisopropylpyrene (782 mg, 1.75 mmol), and sodium tert-butoxide (NaOt-Bu) (506.6 mg, 5.27 mmol) were put into a 250-ml round-bottom flask. 100 ml of toluene was added thereto under a nitrogen condition, and the temperature was increased up to 100° C. Pd(P(t-Bu$_3$))$_2$ (53.75 mg, 0.105 mmol) was added to the round-bottom flask, light was blocked, and then the resulting solution was stirred for 2 hours. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Compound BD-10 was separated through a column chromatography (methyl chloride/hexane).

MS (LC-MS): 1469.58 m/z [M$^+$]

FIG. 3 is a view illustrating LC-MS data of Compound BD-10.

Synthesis Example 3. Synthesis of Compound BD-24

(1) Synthesis of Intermediate 3-B

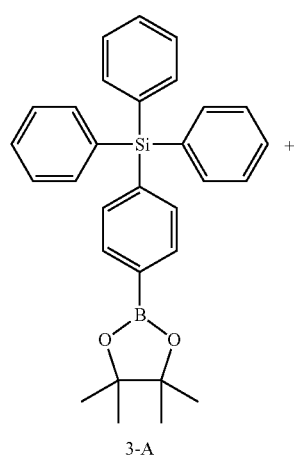

3-A

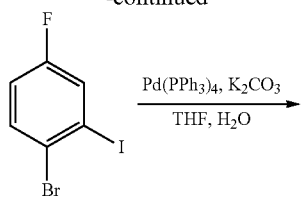

-continued

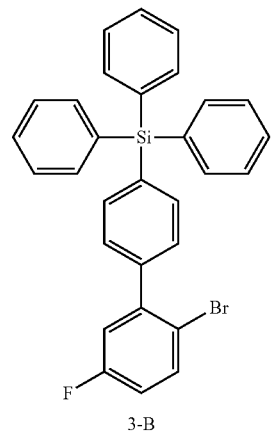

3-B

Intermediate 3-A (2.8 g, 7.35 mmol), 1-bromo-4-fluoro-2-iodobenzene (1.82 g, 7.3 mmol), Pd(PPh$_3$)$_4$ (424 mg, 0.37 mmol), and K$_2$CO$_3$ (2.47 g, 22.05 mmol) were put into a 250-mL round-bottom flask. 100 ml of tetrahydrofuran (THF) and 25 ml of H$_2$O were added thereto under a nitrogen condition, and the resulting solution was stirred for 8 hours by increasing the temperature up to 80° C. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 3-B was separated through recrystallization (methyl chloride/methanol).

(2) Synthesis of Intermediate 3-C

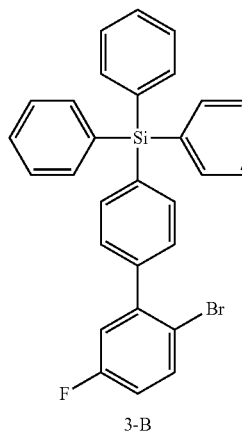

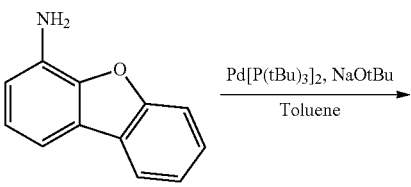

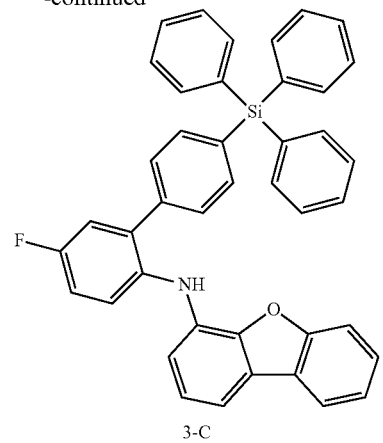

Intermediate 3-B (2.28 g, 4.49 mmol), 4-aminodibenzofuran (985 mg, 5.39 mmol), and sodium tert-butoxide (NaOt-Bu) (646 mg, 6.73 mmol) were put into a 250-ml round-bottom flask. 100 ml of toluene was added thereto under a nitrogen condition, and the temperature was increased up to 100° C. Pd(P(t-Bu$_3$))$_2$ (68.8 mg, 0.134 mmol) was added to the round-bottom flask, light was blocked, and then the resulting solution was stirred for 2 hours. After the temperature was lowered and the material was extracted by using dichloromethane (DCM) and water, MgSO$_4$ and acid clay were added thereto, and the resulting mixture was stirred. After the resulting product was allowed to pass through silica gel, the solvent was removed. Intermediate 3-C was separated through a column chromatography (methyl chloride/hexane).

(3) Synthesis of Compound BD-24

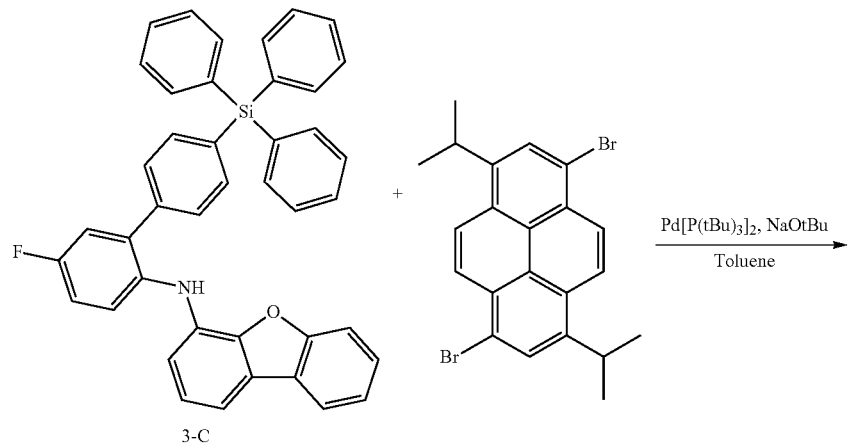

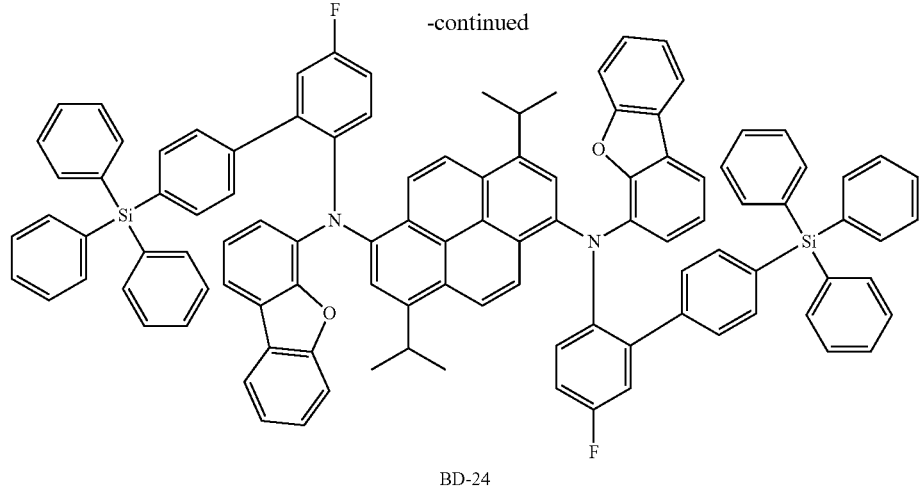

BD-24

Intermediate 3-C (2 g, 3.27 mmol), 1,6-dibromo-3,8-diisopropylpyrene (660 mg, 1.5 mmol), and sodium tert-butoxide (NaOt-Bu) (428 mg, 4.46 mmol) were put into a 250-ml round-bottom flask. 100 ml of toluene was added thereto under a nitrogen condition, and the temperature was increased up to 100° C. $Pd(P(t-Bu_3))_2$ (152 mg, 0.3 mmol) was added to the round-bottom flask, light was blocked, and then the resulting solution was stirred for 2 hours. After the temperature was lowered and the material was extracted by using dichloromethane (DCM) and water, $MgSO_4$ and acid clay were added thereto, and the resulting mixture was stirred. After the resulting product was allowed to pass through silica gel, the solvent was removed. Compound BD-24 was separated through a column chromatography (methyl chloride/hexane).

MS (LC-MS): 1,505.97 m/z [M⁺]

FIG. 4 is a view illustrating LC-MS data of Compound BD-24.

<Manufacture of Organic Light Emitting Device>

Example 1

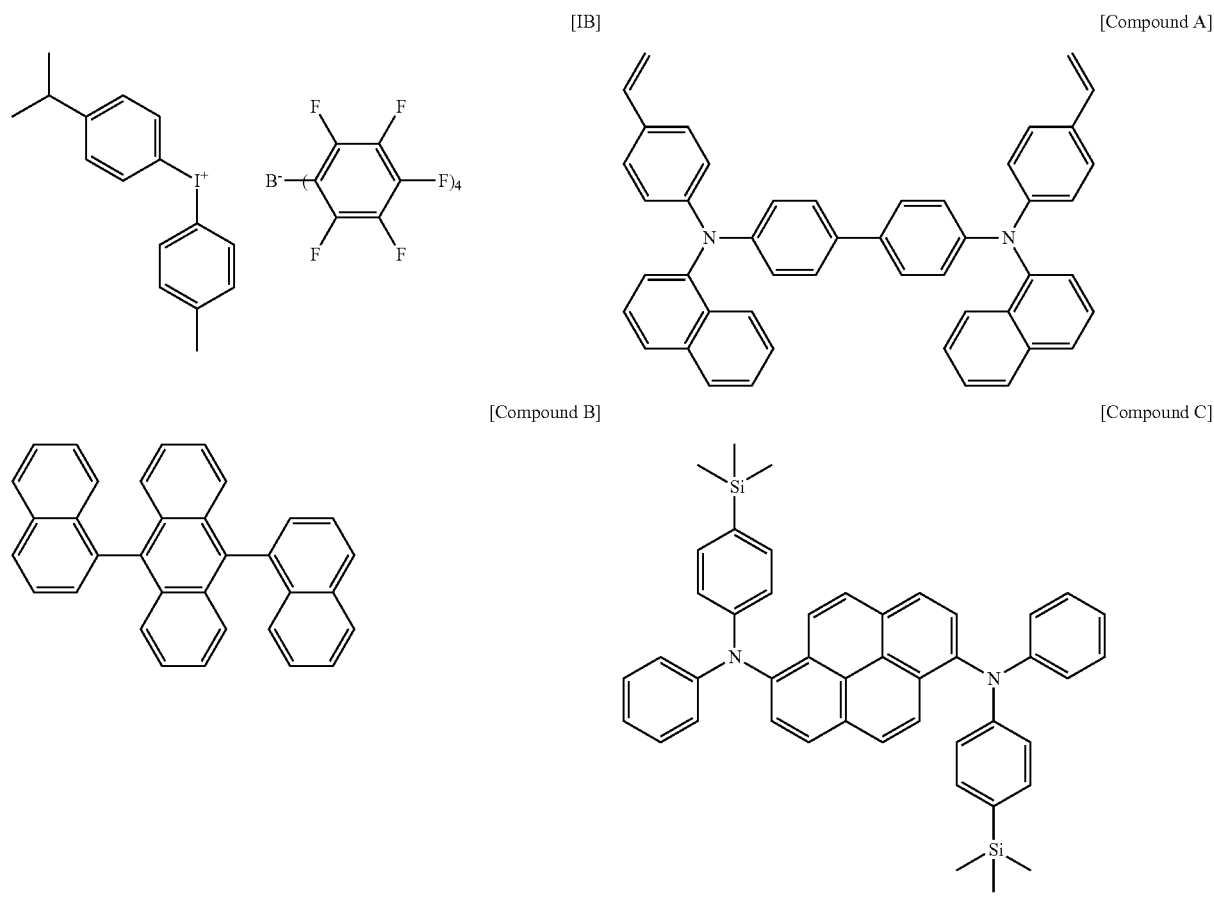

-continued

[Compound D]

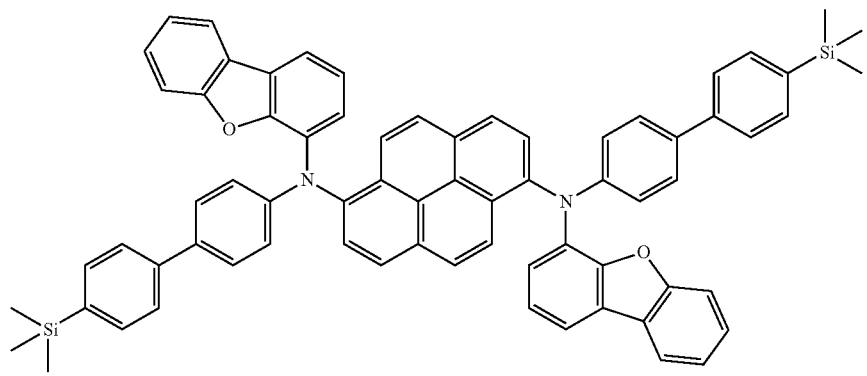

[Compound E] [Compound F]

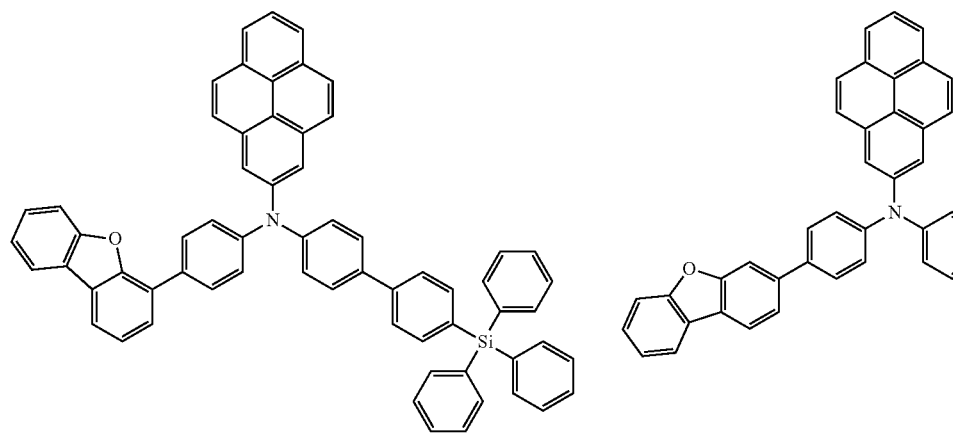

[Compound G]

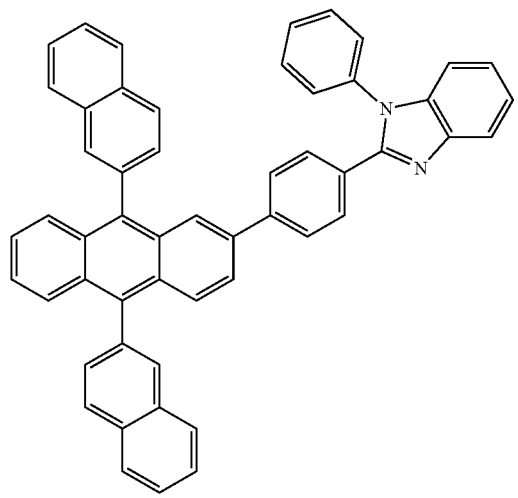

A glass substrate thinly coated with indium tin oxide (ITO) to have a thickness of 1,500 Å was put into distilled water in which a detergent was dissolved, and ultrasonically washed. The ITO was washed for 30 minutes. Thereafter, the glass substrate was ultrasonically washed for 10 minutes by repeating the washing with distilled water twice. After the washing using distilled water was completed, ultrasonic washing was conducted using isopropyl alcohol and acetone solvents for 30 minutes, respectively, the substrate was dried, and then the substrate was transported to a glove box. A hole injection layer having a thickness of 300 Å was formed by spin-coating the thus-prepared transparent ITO electrode with a coating composition in which Compound A and Compound IB as the p-dopant were mixed at a weight ratio of 8:2 with cyclohexanone, and the coating composition was cured on a hot plate in a nitrogen atmosphere under conditions of 220° C. and 30 minutes. The hole injection layer was spin-coated with a composition in which Compound A was dissolved at a weight ratio of 1% in an organic solvent (toluene), thereby forming a hole transport layer having a thickness of 400 Å. Thereafter, the coating composition was cured on a hot plate in a nitrogen atmosphere under conditions of 230° C. and 30 minutes. A light emitting layer having a thickness of 200 Å was formed by spin-coating the hole transport layer with a composition in which Compound B and Compound BD-5 (a concentration of 6%) were dissolved at a weight ratio of 0.6% in an organic solvent (toluene), and the coating composition was cured on a hot plate in a nitrogen atmosphere under conditions of 120° C. and 10 minutes.

Thereafter, the glass substrate was transferred to a vacuum deposition apparatus, and Compound G (an electron transport layer, 200 Å), LiF (a cathode, 12 Å), and Al (a cathode, 2,000 Å) were sequentially deposited thereon, thereby manufacturing an organic light emitting device. In the aforementioned procedure, the deposition rate of the organic material was maintained at 0.4 to 0.7 Å/sec, the deposition rates of LiF and aluminum of the cathode were maintained at 0.3 Å/sec and 2 Å/sec, respectively, and the degree of vacuum during the deposition was maintained at $2 \times 10^{-7}$ to $5 \times 10^{-8}$ torr.

Example 2

An organic light emitting device was manufactured in the same manner as in Example 1, except that Compound BD-10 was used instead of Compound BD-5 in Example 1.

Example 3

An organic light emitting device was manufactured in the same manner as in Example 1, except that Compound BD-24 was used instead of Compound BD-5 in Example 1.

Comparative Example 1

An organic light emitting device was manufactured in the same manner as in Example 1, except that Compound C was used instead of Compound BD-5 in Example 1.

Comparative Example 2

An organic light emitting device was manufactured in the same manner as in Example 1, except that Compound D was used instead of Compound BD-5 in Example 1.

Comparative Example 3

An organic light emitting device was manufactured in the same manner as in Example 1, except that Compound E was used instead of Compound BD-5 in Example 1.

Comparative Example 4

An organic light emitting device was manufactured in the same manner as in Example 1, except that Compound F was used instead of Compound BD-5 in Example 1.

Device Evaluation

The results in which the driving voltages and efficiencies of the organic light emitting devices manufactured in Examples 1 to 3 and Comparative Examples 1 to 4 are measured at a current density of 10 mA/cm² are shown in the following Table 1.

The method of measuring the solubility is as follows. First, after a compound was dissolved in a solvent, the resulting solution was left to stand for 1 day. Thereafter, by passing a laser through the solution, it was observed whether a precipitate was formed through the Tyndall effect, and the solubility was measured.

TABLE 1

| Classification | Dopant | Solubility (wt %) | Driving voltage (V) | Emission wavelength (nm) | Current Efficiency (cd/A) | Power efficiency (lm/W) |
| --- | --- | --- | --- | --- | --- | --- |
| Example 1 | Compound BD-5 | 0.5 | 5.45 | 457 | 4.76 | 2.36 |
| Example 2 | Compound BD-10 | 1.3 | 5.54 | 458 | 4.56 | 2.45 |
| Example 3 | Compound BD-24 | 2 | 5.66 | 458 | 4.46 | 2.85 |
| Comparative Example 1 | Compound C | 0.1 | 6.22 | 465 | 3.02 | 1.94 |
| Comparative Example 2 | Compound D | 0.05 | 5.74 | 459 | 3.48 | 1.51 |
| Comparative Example 3 | Compound E | 2 | 7.64 | 436 | 1.75 | 0.86 |
| Comparative Example 4 | Compound F | 2 | 7.59 | 435 | 1.46 | 0.79 |

As seen in Table 1, it could be confirmed that the organic light emitting devices in Examples 1 to 3 in which the coating composition including the compound represented by Formula 1 of the present specification is used show low voltage and high efficiency characteristics as compared to Comparative Examples 1 and 2 in which Ar1 to Ar 6 of Formula 1 are an alkyl group, and can be applied to an organic light emitting device. Specifically, it can be seen that in the case of Examples 1 to 3 where the coating composition including the compound in which Ar1 to Ar6 of Formula 1 are a substituted or unsubstituted aryl group is used as a dopant of the light emitting layer, the solubility is improved and the emission wavelength is close to deep blue as compared to Comparative Examples 1 and 2 in which the coating composition including the compound in which Ar1 to Ar6 of Formula 1 are an alkyl group is used as a dopant of the light emitting layer. Furthermore, it can be seen that when an organic light emitting device is manufactured by a solution process and the device performance is evaluated, the driving voltage is lowered and the power efficiency is increased, due to the improved solubility.

In the case of Comparative Examples 3 and 4 in which Compound E and Compound F in the form of monoamine are used as a dopant, the driving voltage is high and the power efficiency is low as compared to Examples 1 to 3. From the viewpoint of electro-optical characteristics, it can be seen that the compounds are not appropriate to be used as a dopant, and accordingly, energy is not transferred well from the host to the dopant.

Although the preferred exemplary embodiments of the present invention have been described above, the present invention is not limited thereto, and various modifications can be made and carried out within the scopes of the claims and the detailed description of the invention, and also fall within the scope of the invention.

The invention claimed is:

1. A compound represented by the following Formula 1-1:

[Formula 1-1]

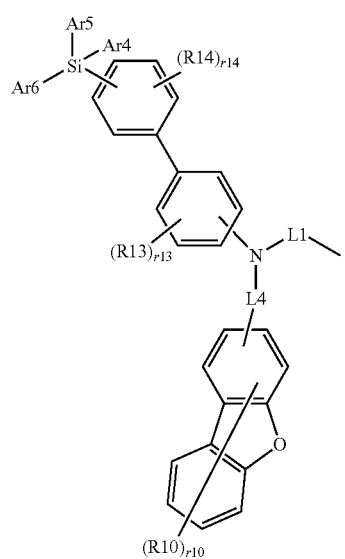

-continued

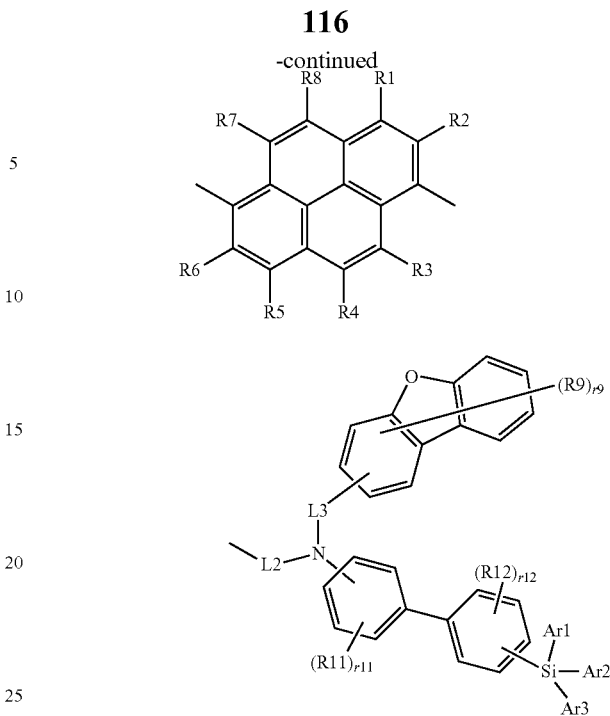

in Formula 1-1,
L1 to L4 are the same as or different from each other, and are each independently a direct bond; or a substituted or unsubstituted arylene group,
Ar1 to Ar6 are the same as or different from each other, and are each independently a substituted or unsubstituted aryl group,
R1 to R10 are the same as or different from each other, and are each independently hydrogen; or a substituted or unsubstituted alkyl group,
r9 and r10 are the same as or different from each other, and are each an integer from 1 to 7,
when r9 is 2 or more, two or more R9's are the same as or different from each other, and
when r10 is 2 or more, two or more R10's are the same as or different from each other,
R11 to R14 are the same as or different from each other, and are each independently hydrogen; a halogen group; a cyano group; a hydroxyl group; a carboxyl group; a haloalkyl group; or a haloalkoxy group,
r11 to r14 are the same as or different from each other, and are each an integer from 1 to 4,
when r11 is 2 or more, two or more R11's are the same as or different from each other,
when r12 is 2 or more, two or more R12's are the same as or different from each other,
when r13 is 2 or more, two or more R13's are the same as or different from each other, and
when r14 is 2 or more, two or more R14's are the same as or different from each other.

2. The compound of claim 1, wherein L1 to L4 are the same as or different from each other, and are each independently a direct bond; or a substituted or unsubstituted monocyclic or polycyclic arylene group having 6 to 10 carbon atoms.

3. The compound of claim 1, wherein Ar1 to Ar6 are the same as or different from each other, and are each independently a monocyclic or polycyclic aryl group having 6 to 10 carbon atoms, which is unsubstituted or substituted with a straight-chained or branched alkyl group having 1 to 10 carbon atoms.
4. The compound of claim 1, wherein R1 and R5 are the same as or different from each other, and are each independently a substituted or unsubstituted straight-chained or branched alkyl group having 1 to 10 carbon atoms.
5. The compound of claim 1, wherein Formula 1-1 is selected from the following compounds:
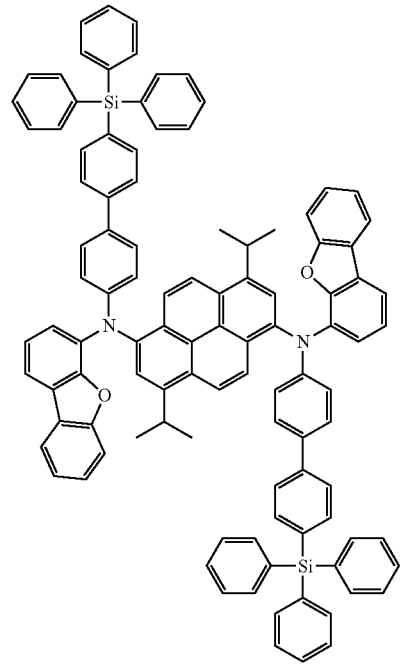
BD1
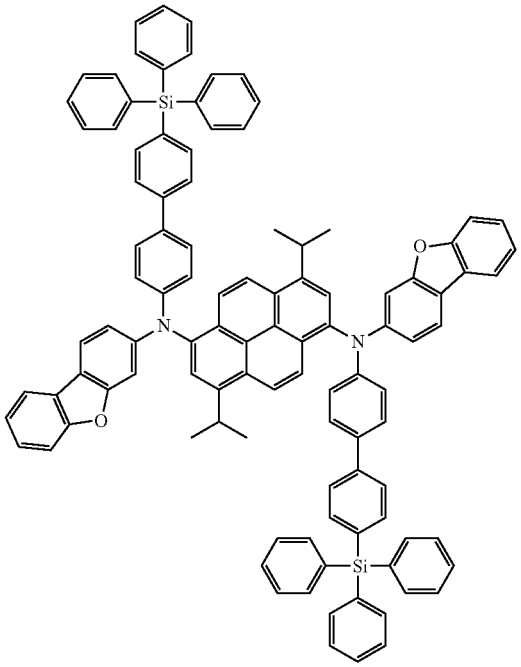
BD2
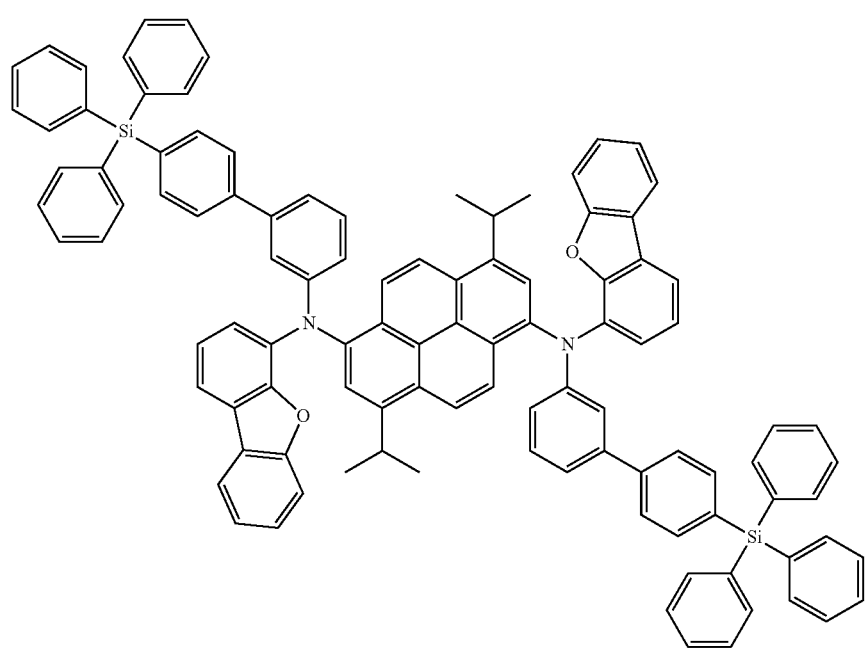
BD3

BD4
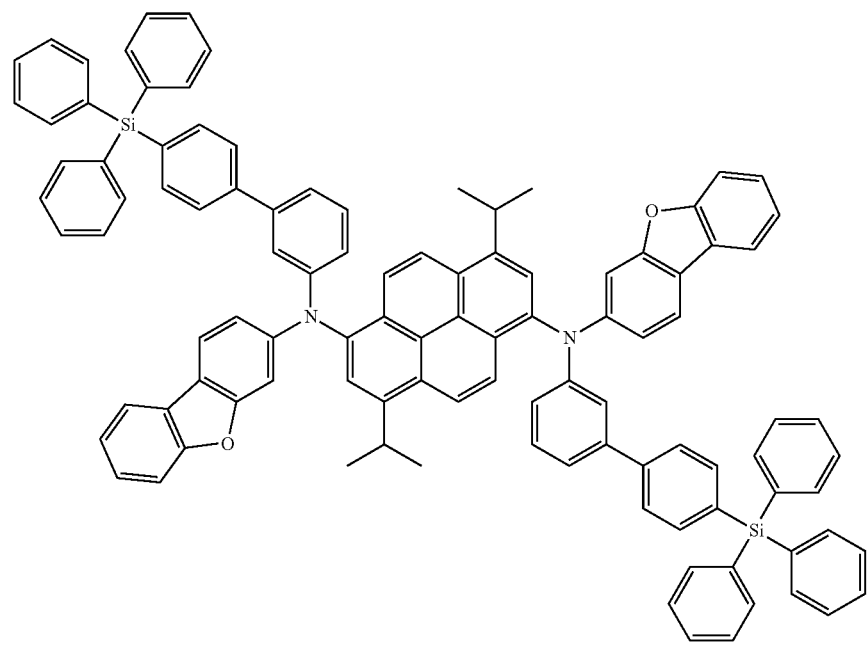
BD5
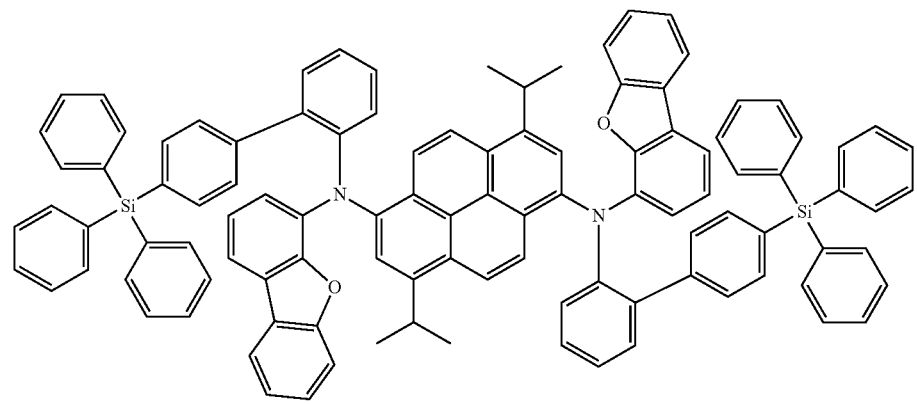

-continued
BD6
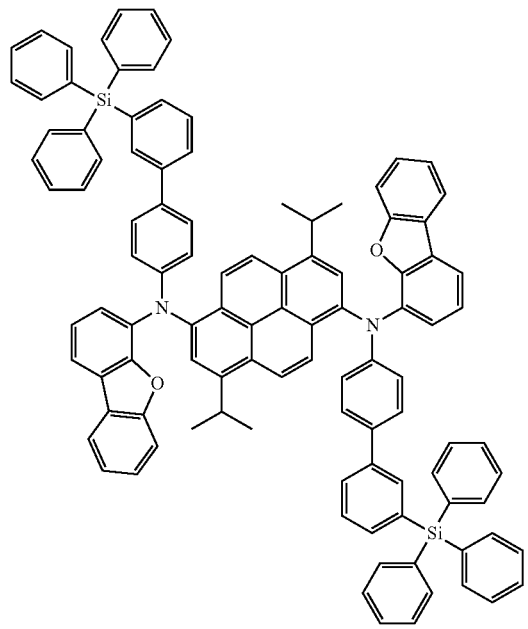
BD7
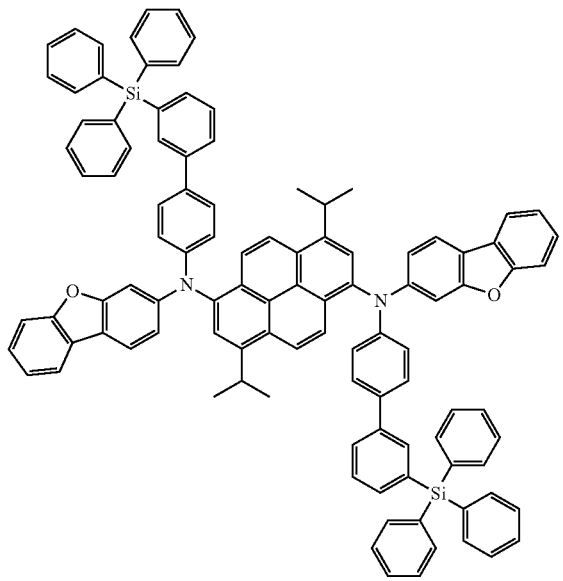
BD8
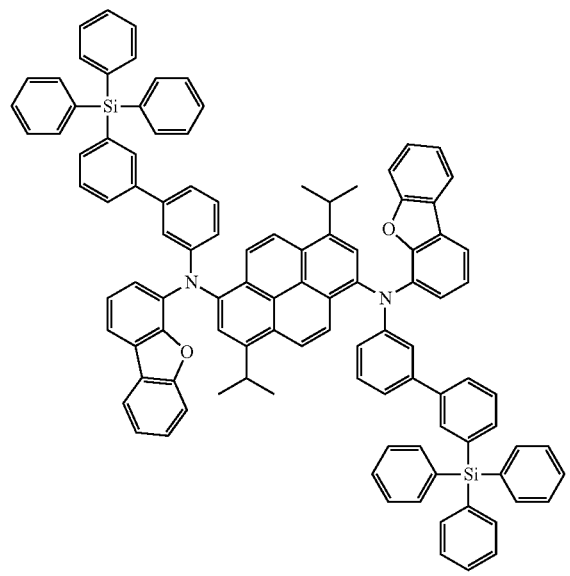
BD9
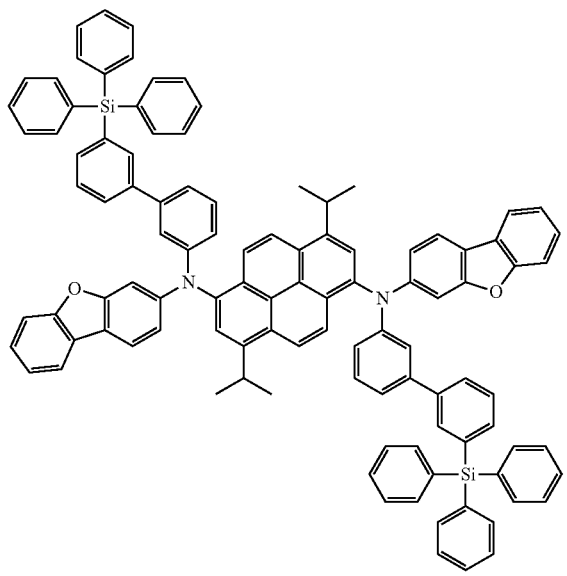
BD10
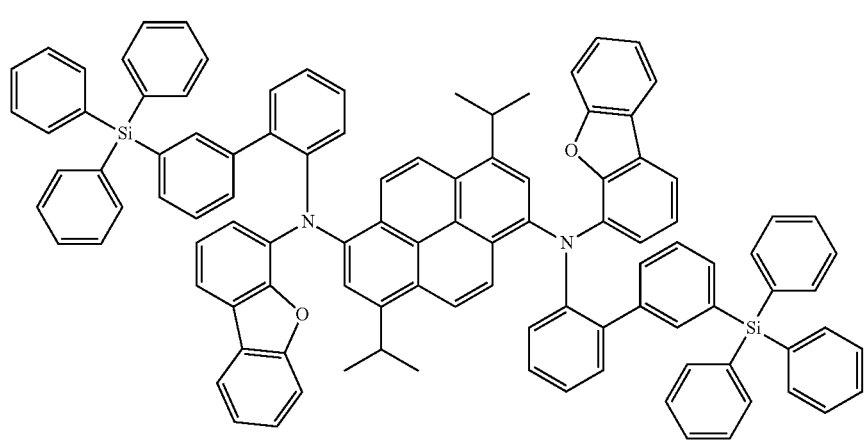

BD11
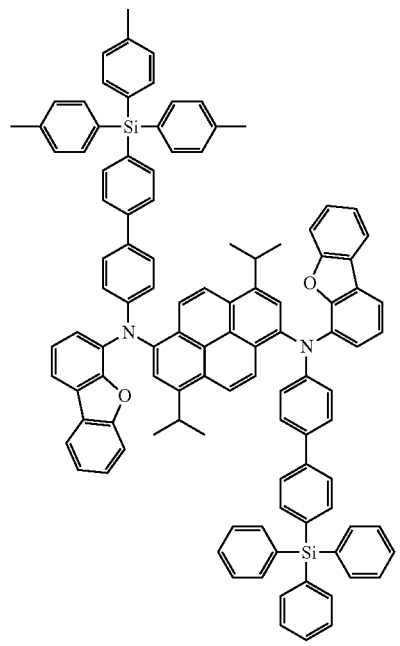
BD12
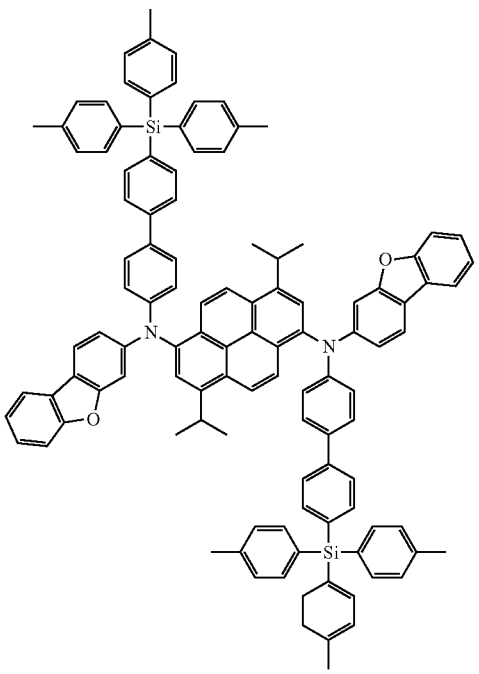
BD13
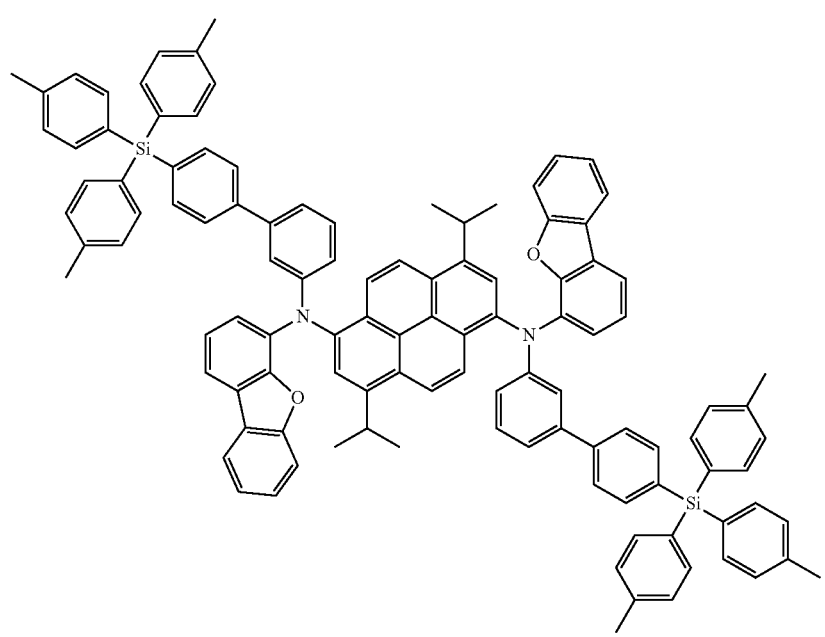

BD14
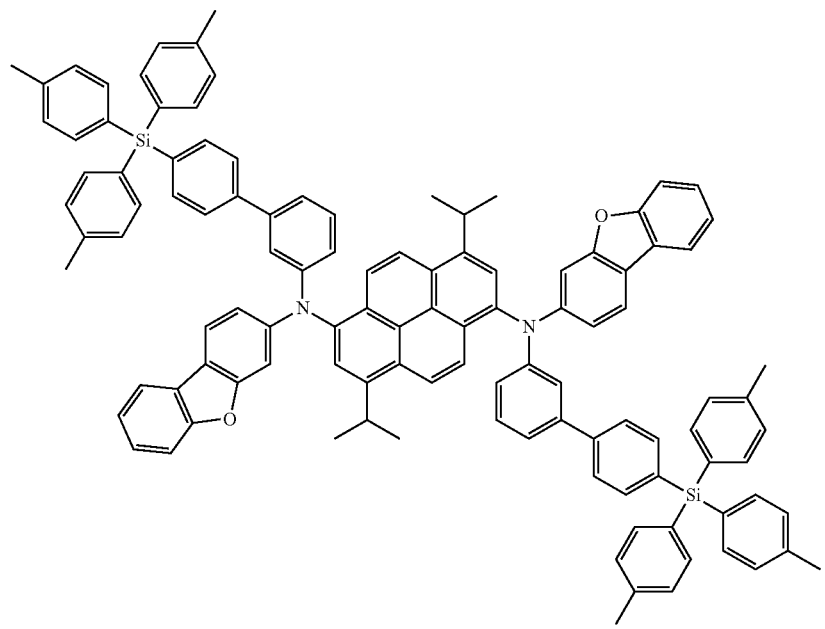
BD15
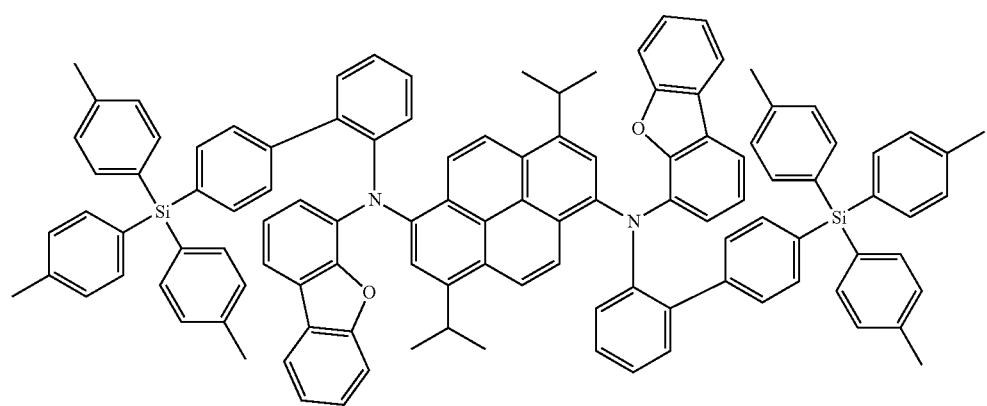

-continued
BD16
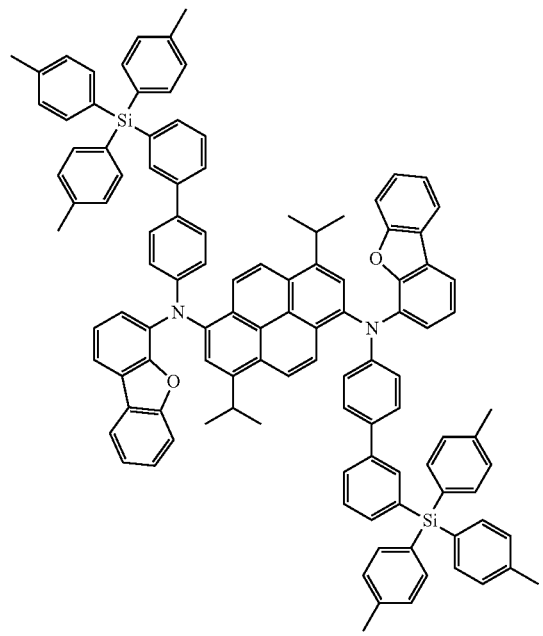
BD17
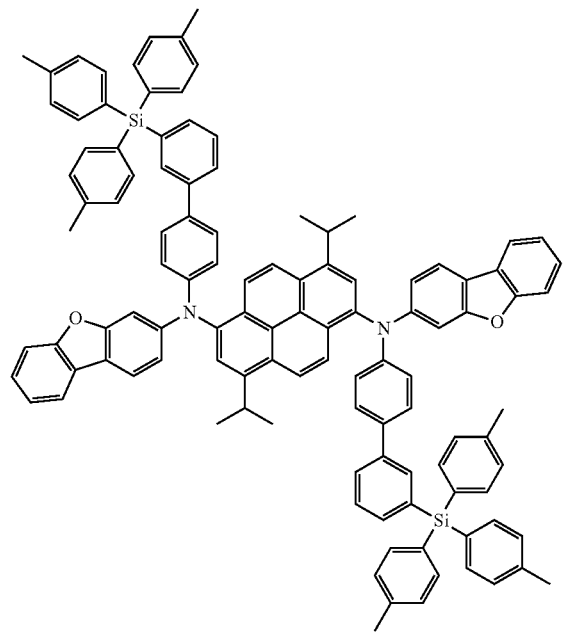
BD18
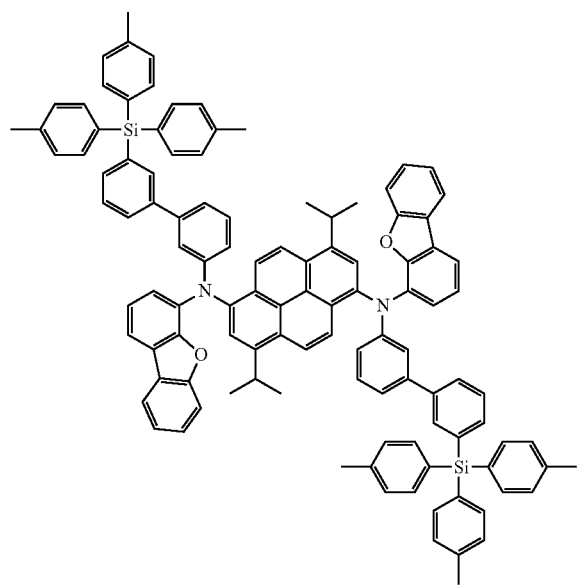
BD19
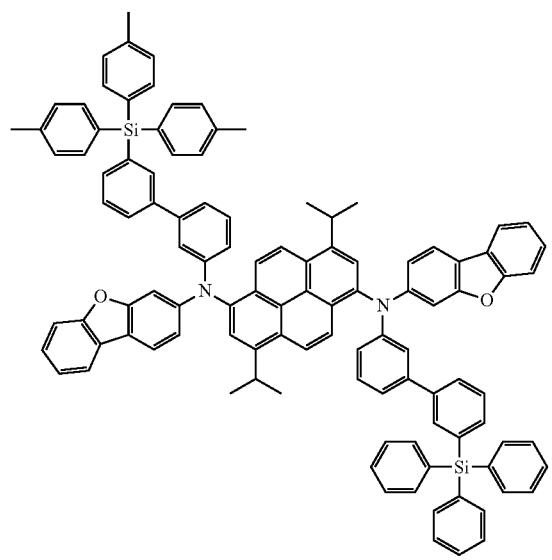

-continued
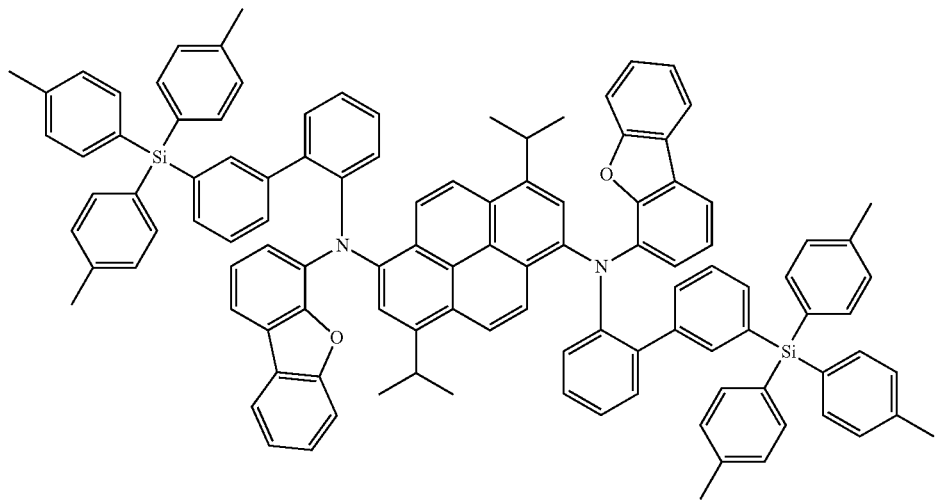
BD20
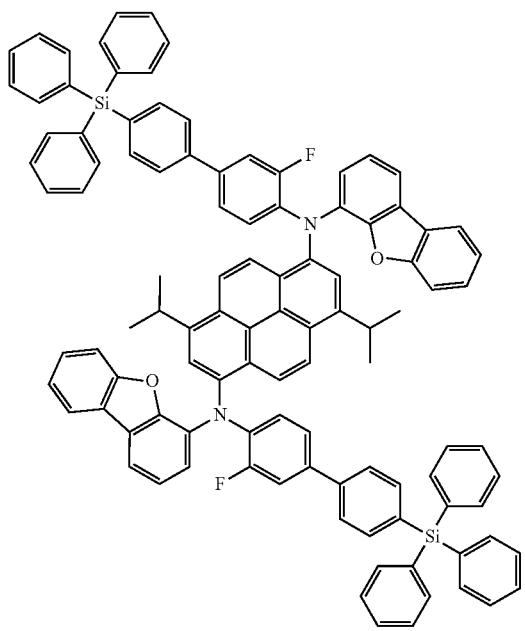
BD21
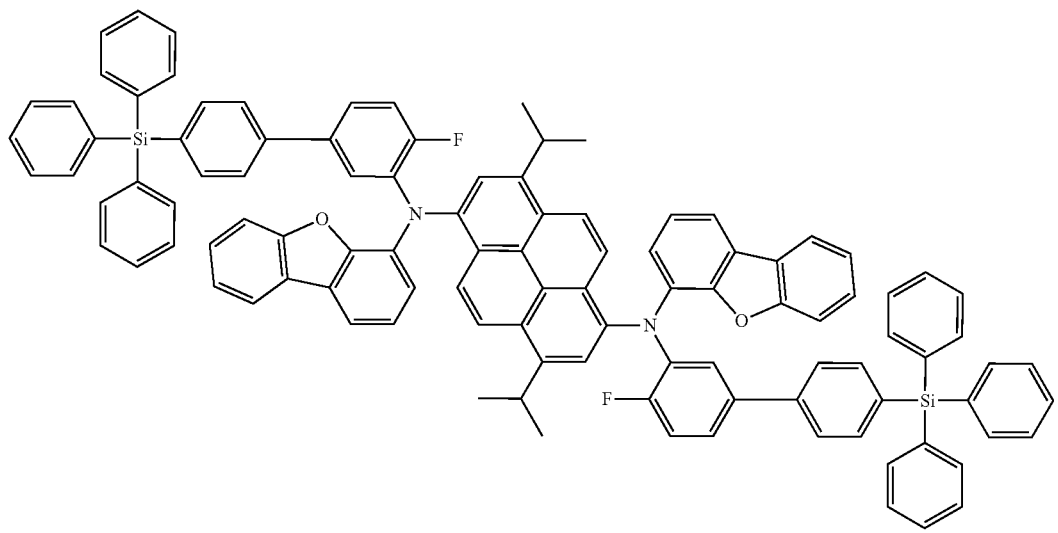
BD22

-continued
BD23
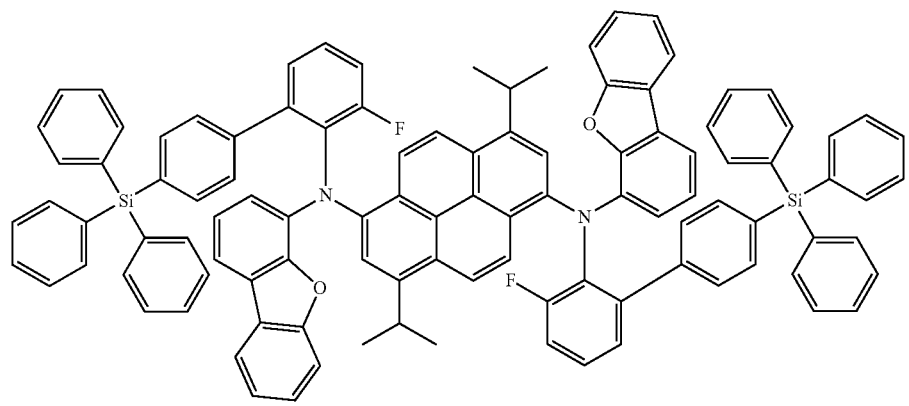
BD24
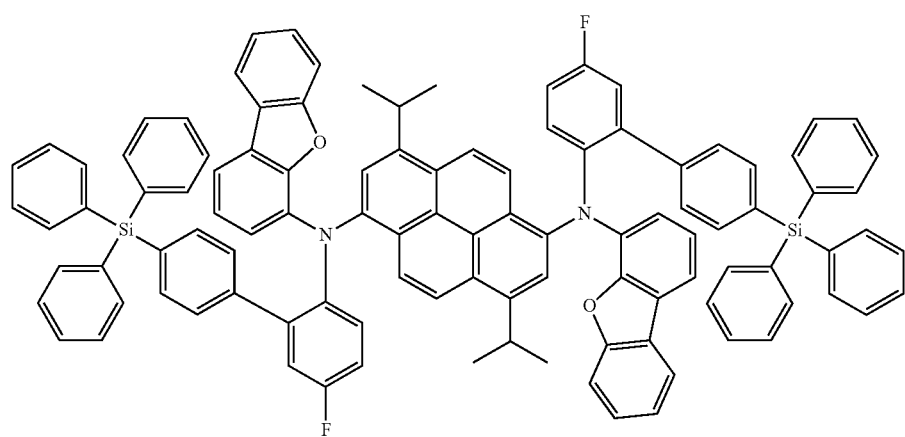
BD25
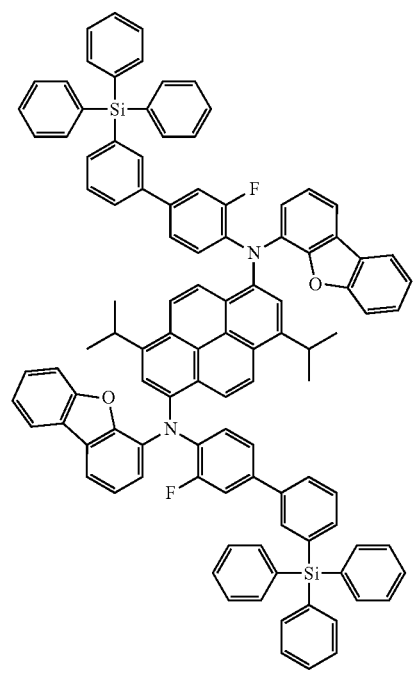
BD26
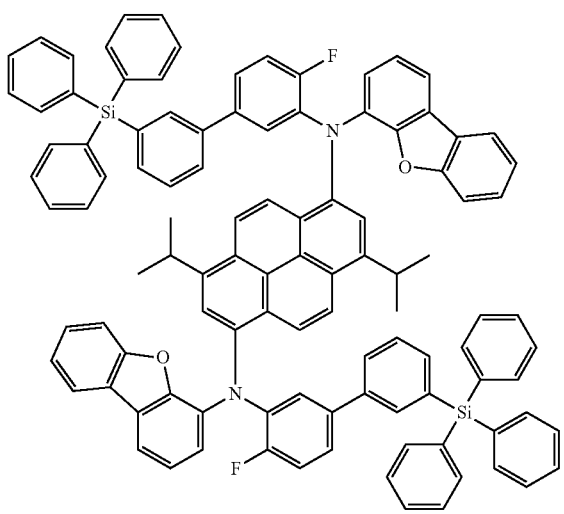

-continued
BD27
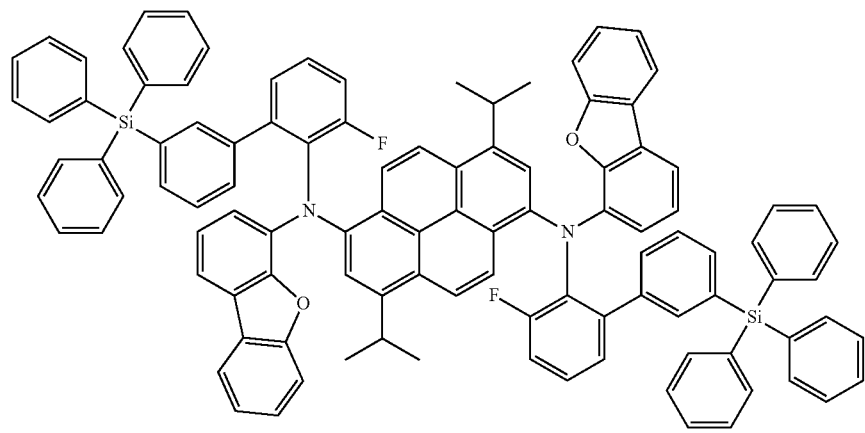
BD28
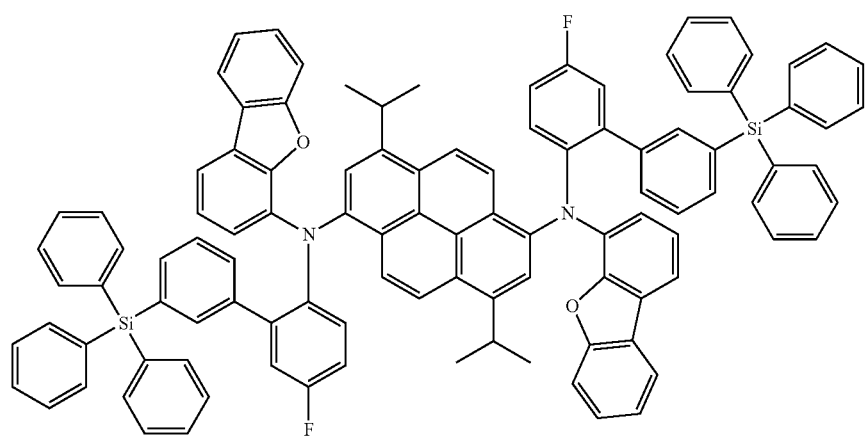
BD29
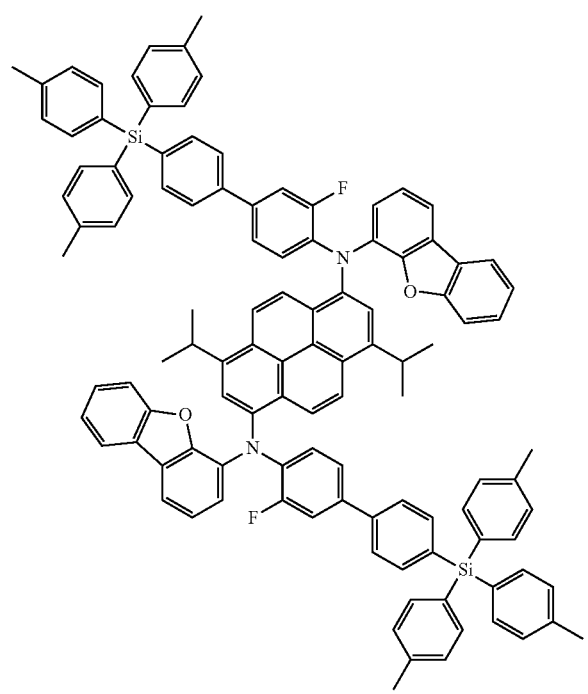

BD30
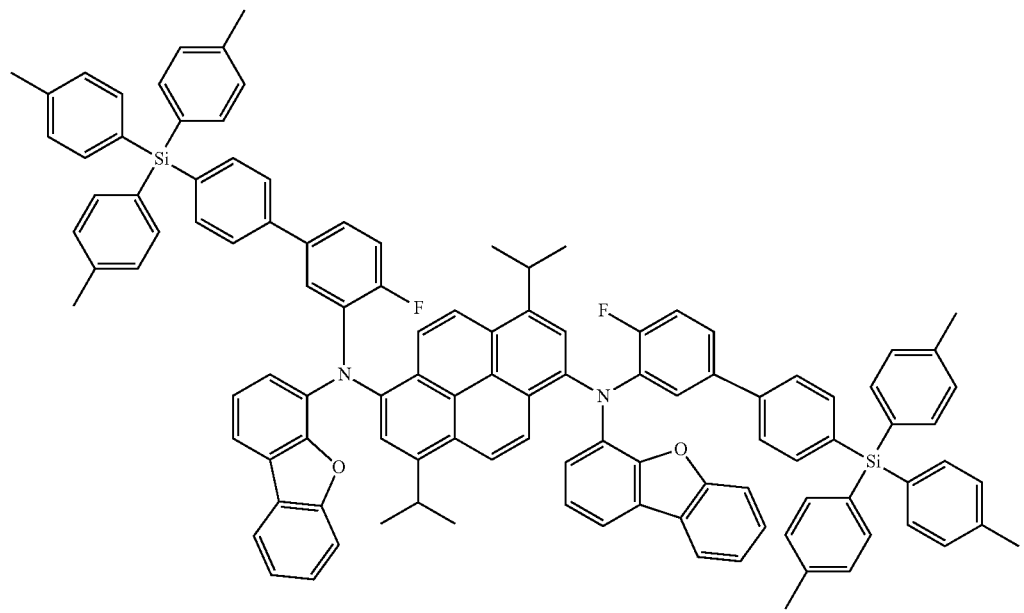
BD31
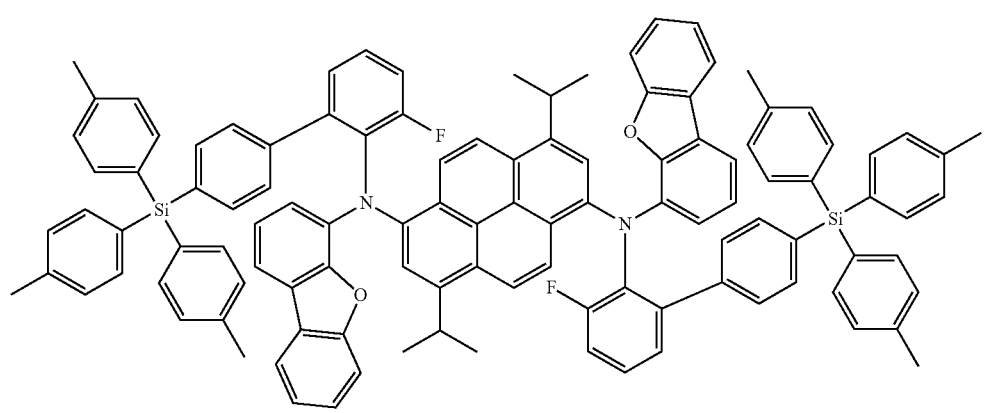
BD32
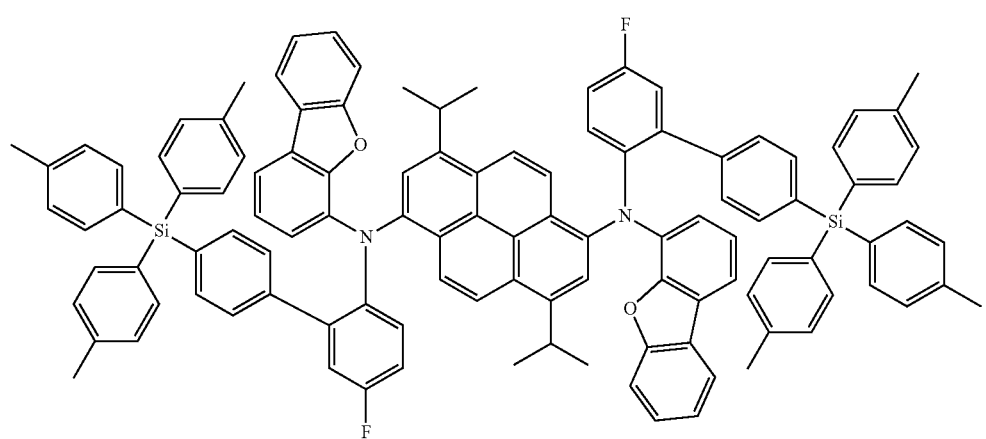

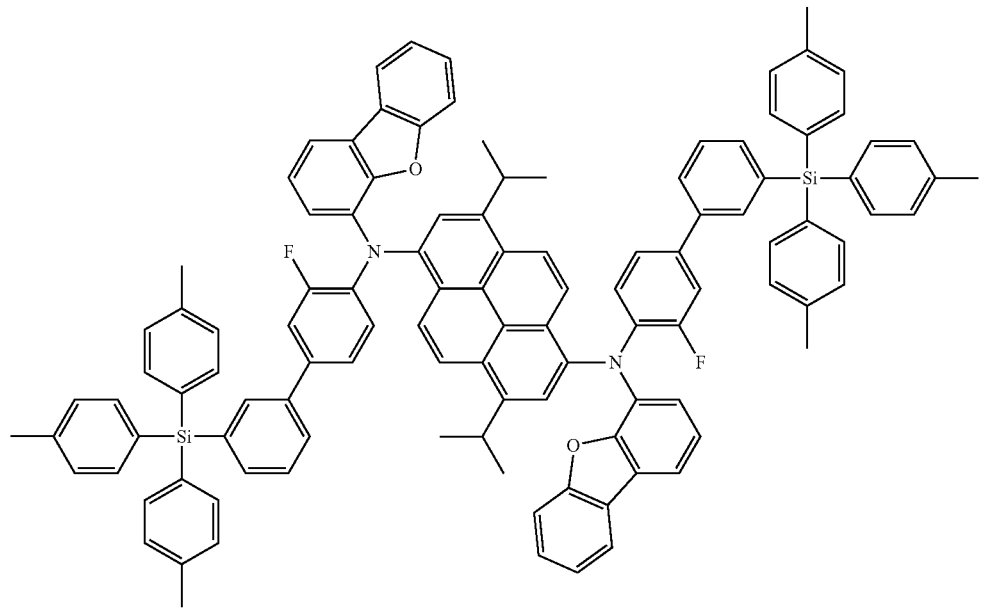
BD33
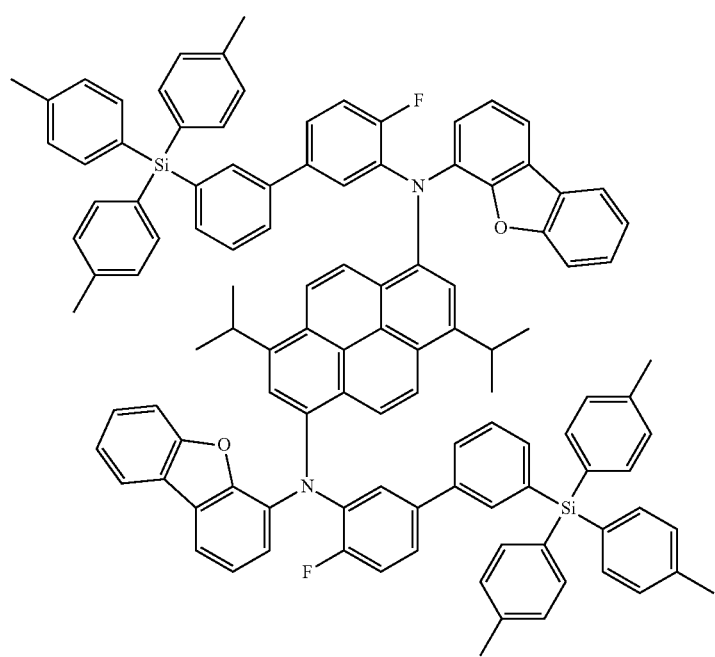
BD34

BD35
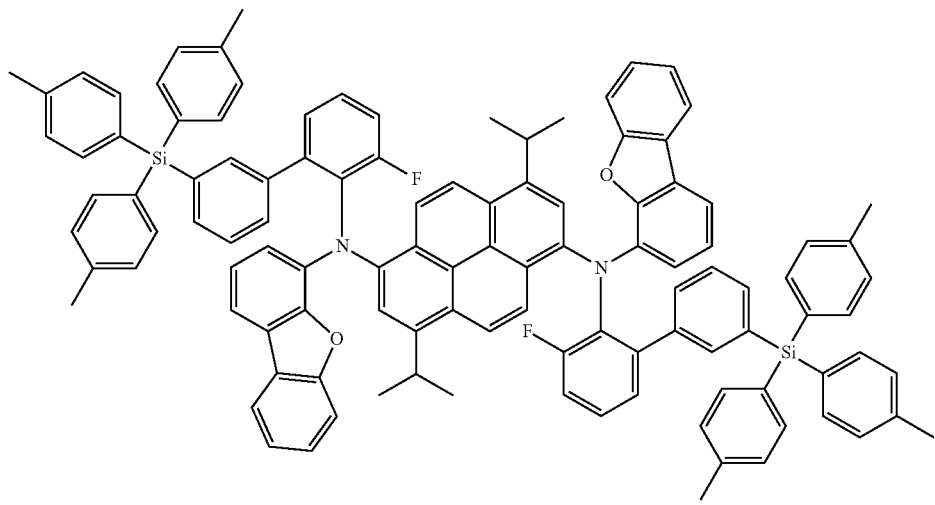
BD36
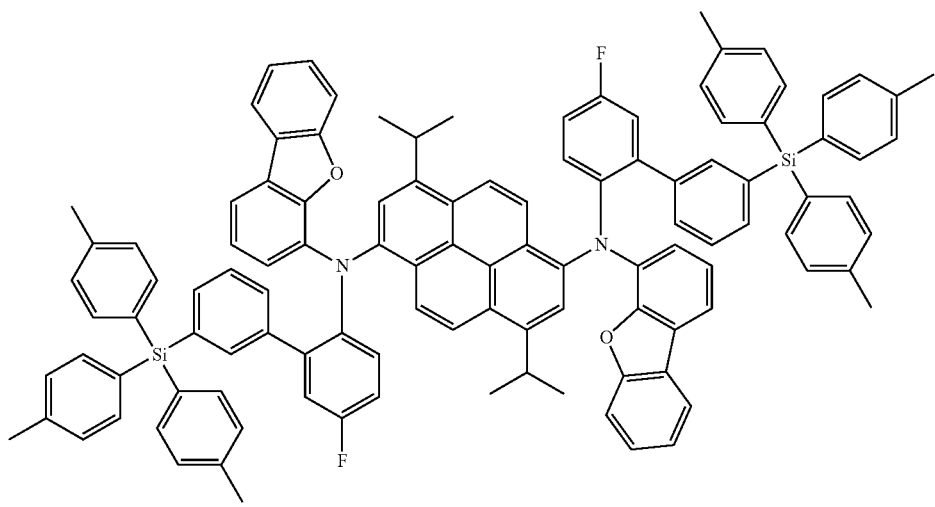
BD37
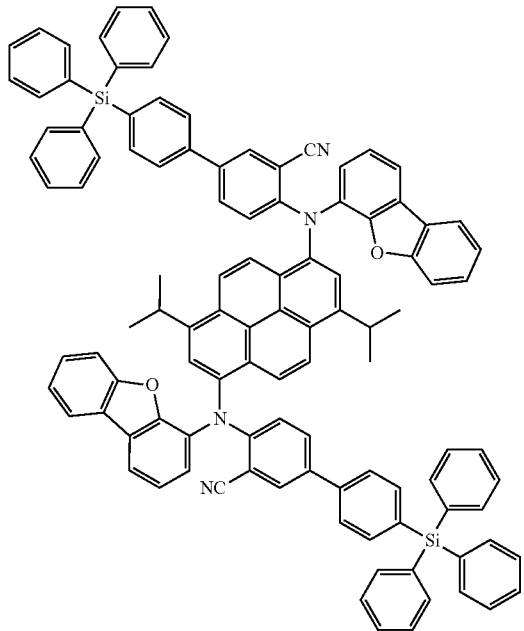

-continued
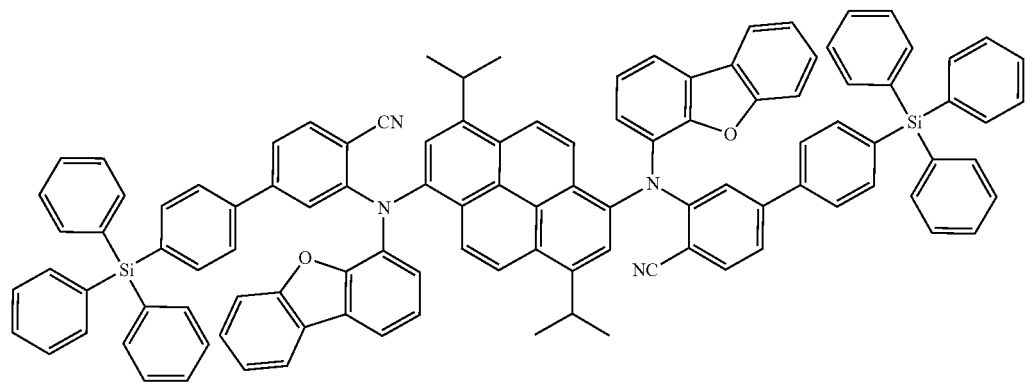
BD38
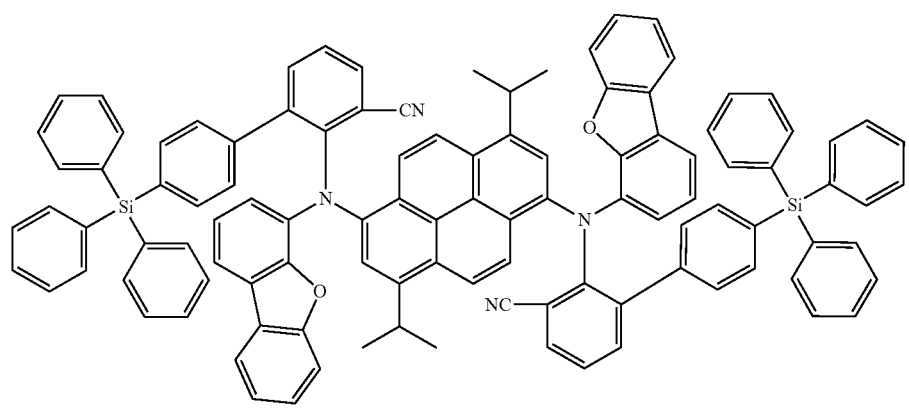
BD39
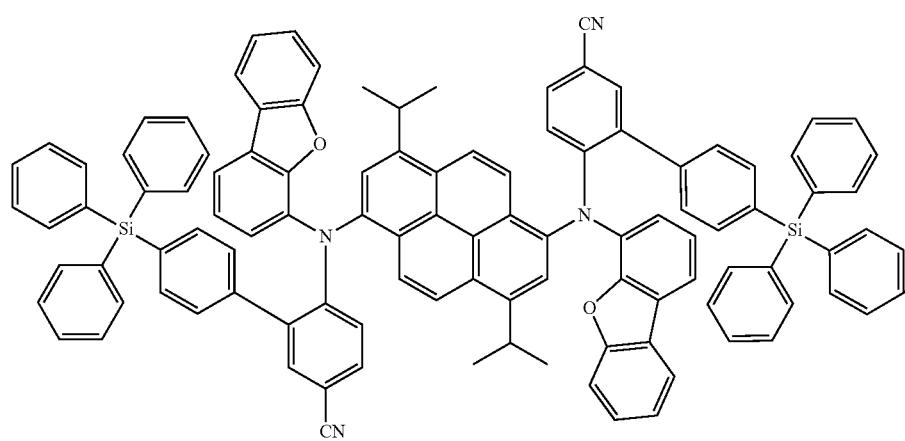
BD40

BD41
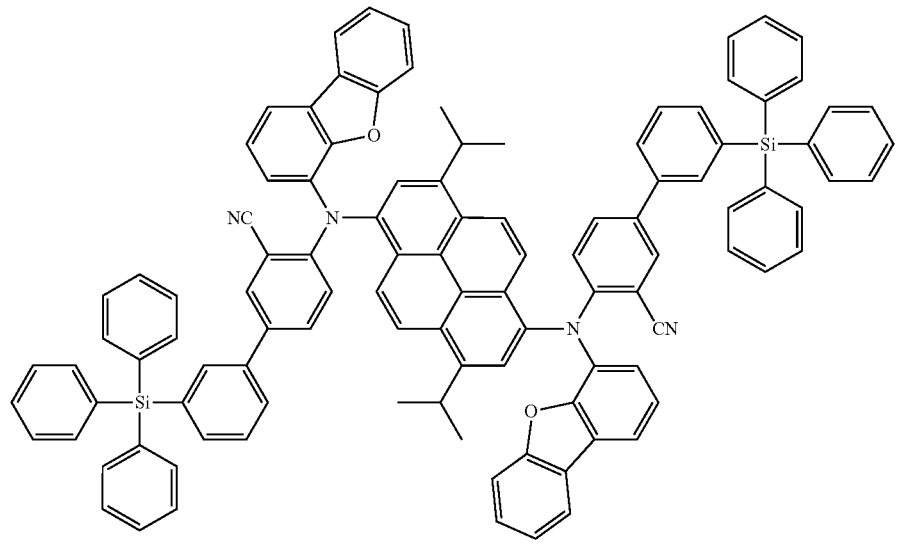
BD42
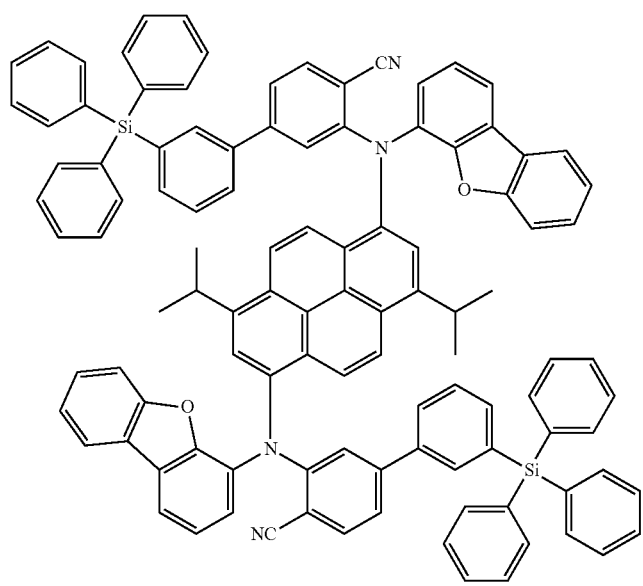
BD43
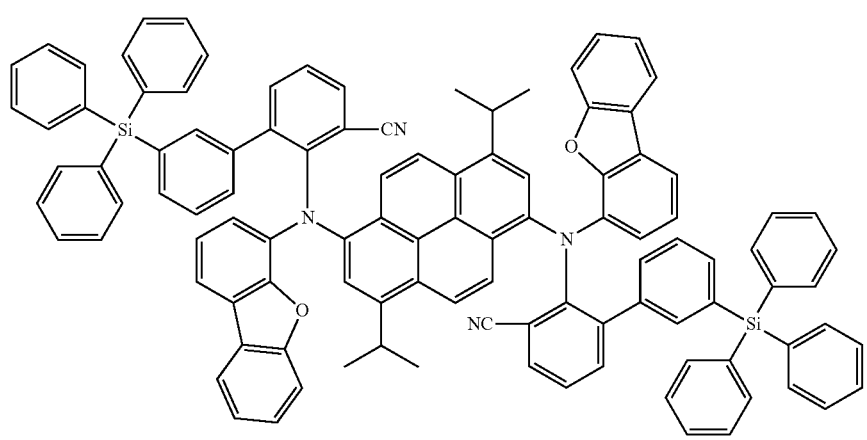

-continued
BD44
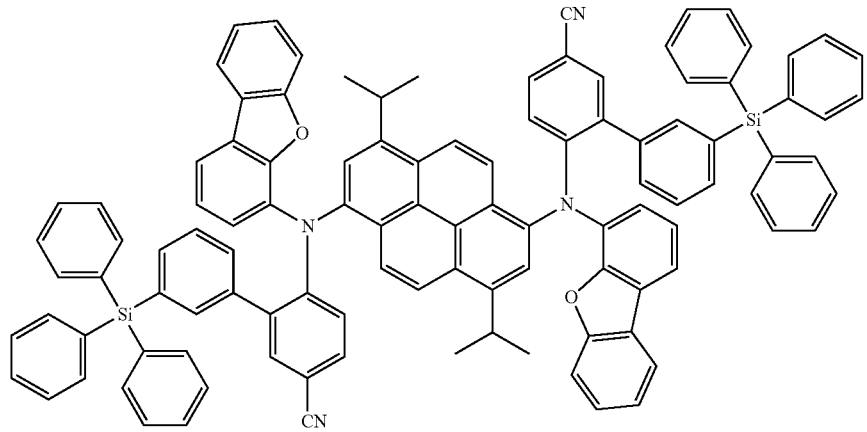
BD45
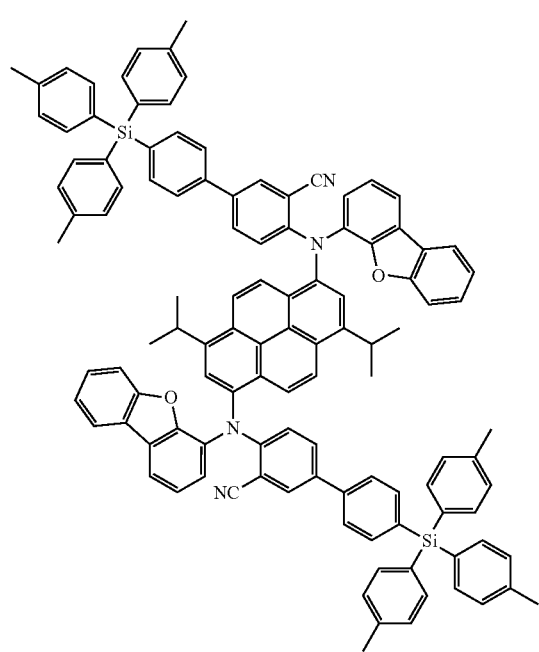

BD46
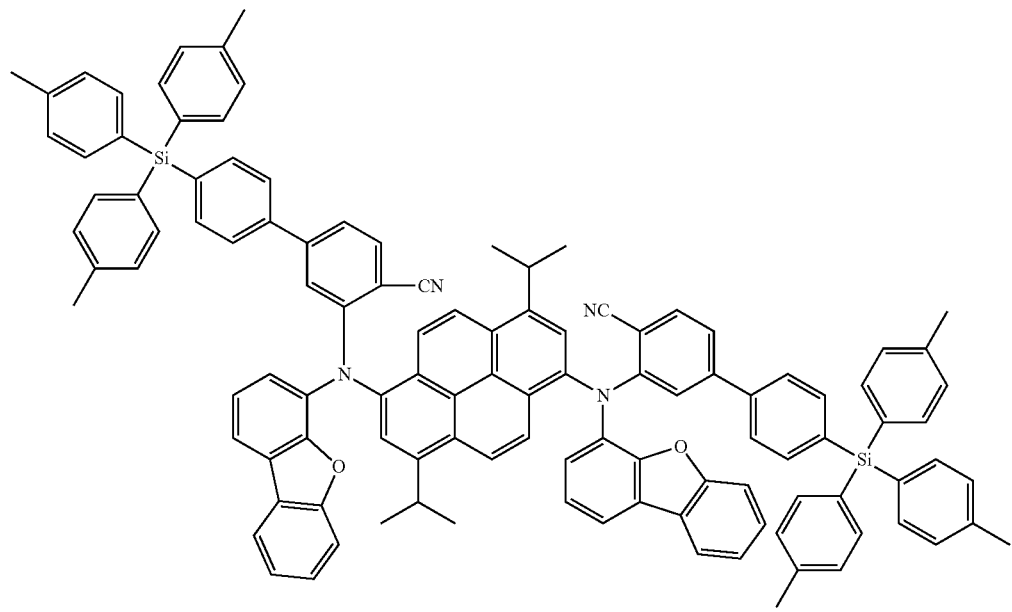
BD47
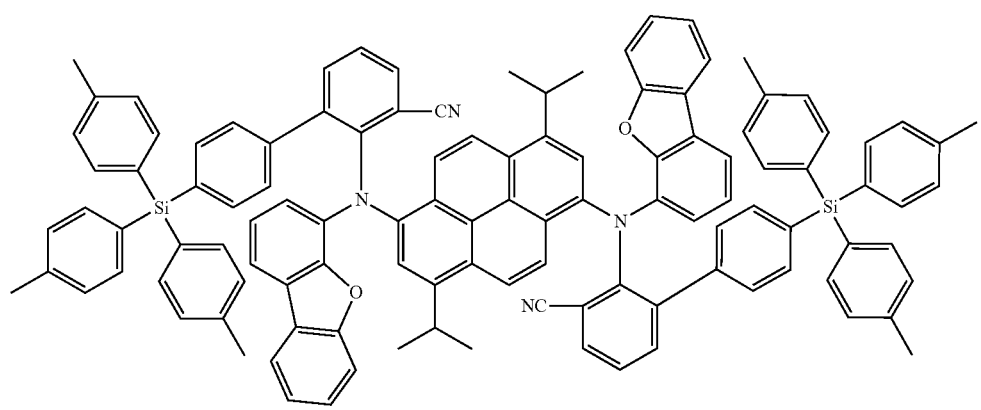
BD48
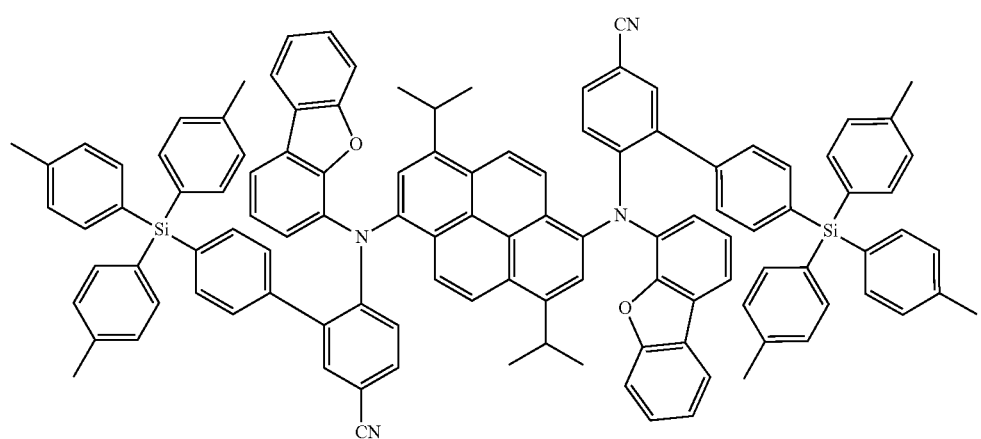

-continued
BD49
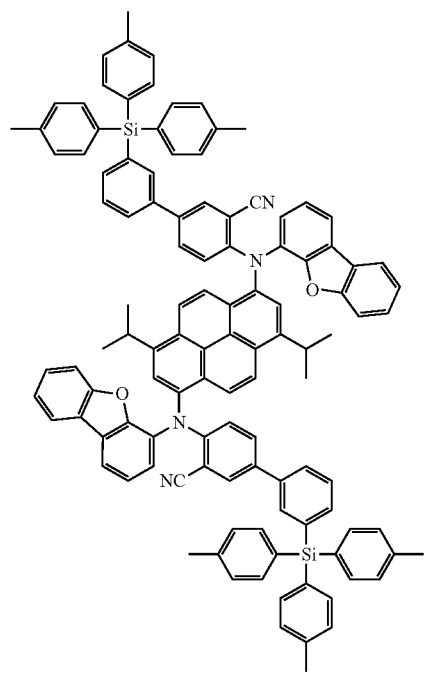
BD50
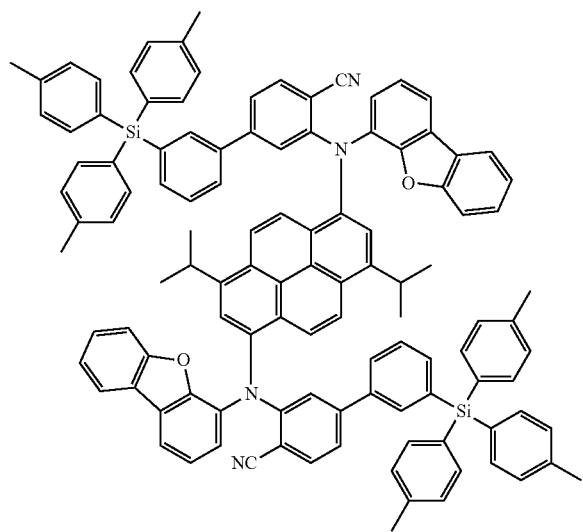
BD51
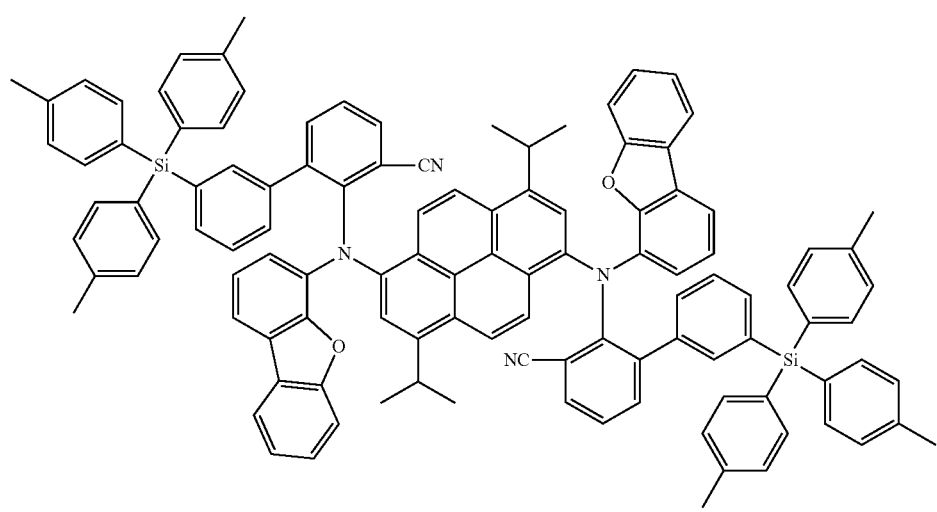

-continued
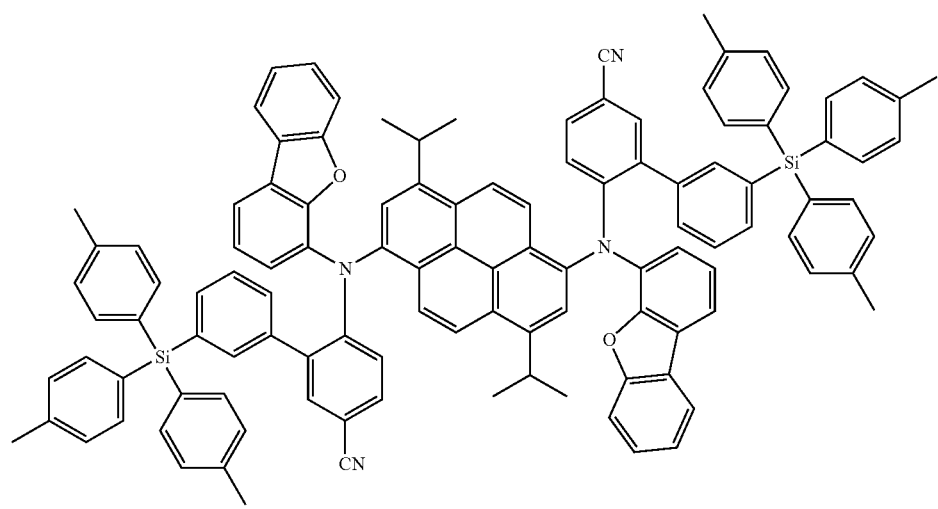
BD52
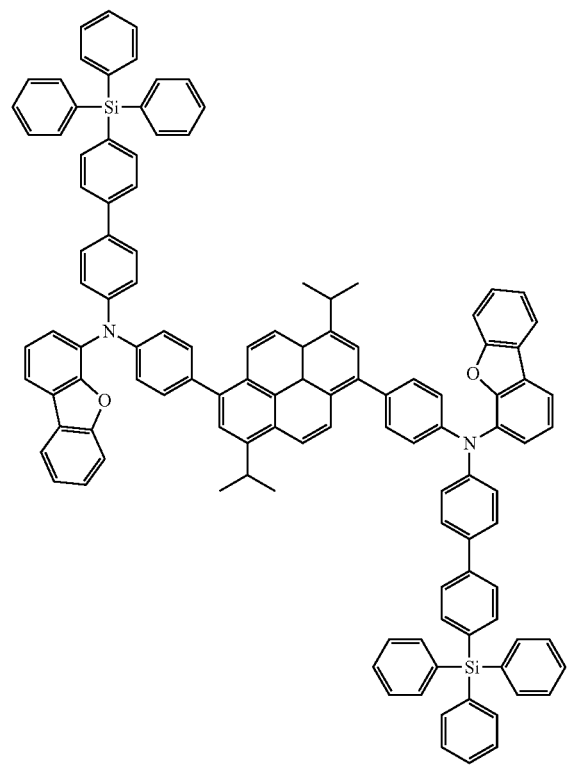
BD53

-continued
BD54
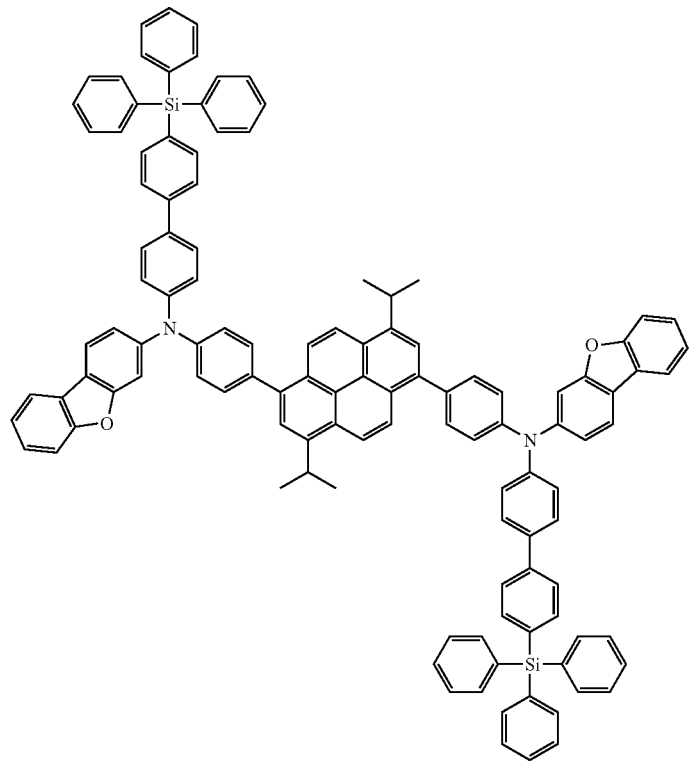
BD55
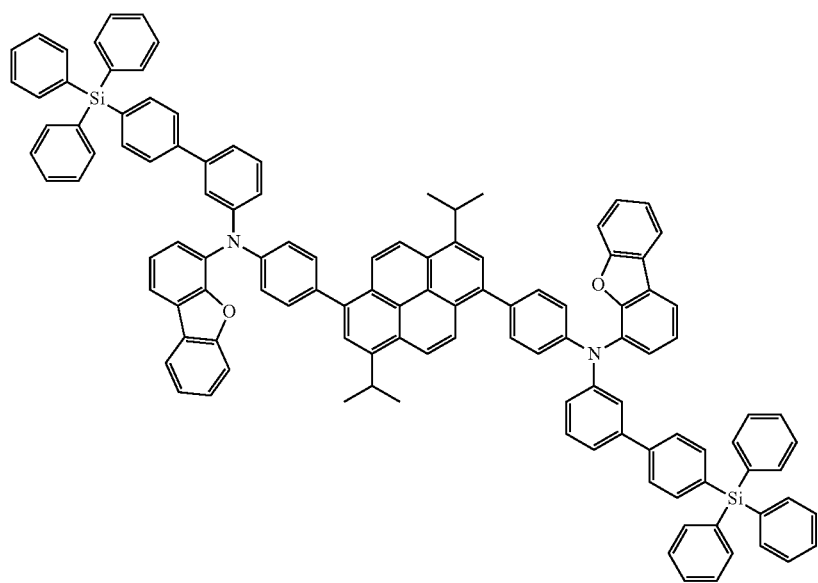

BD56
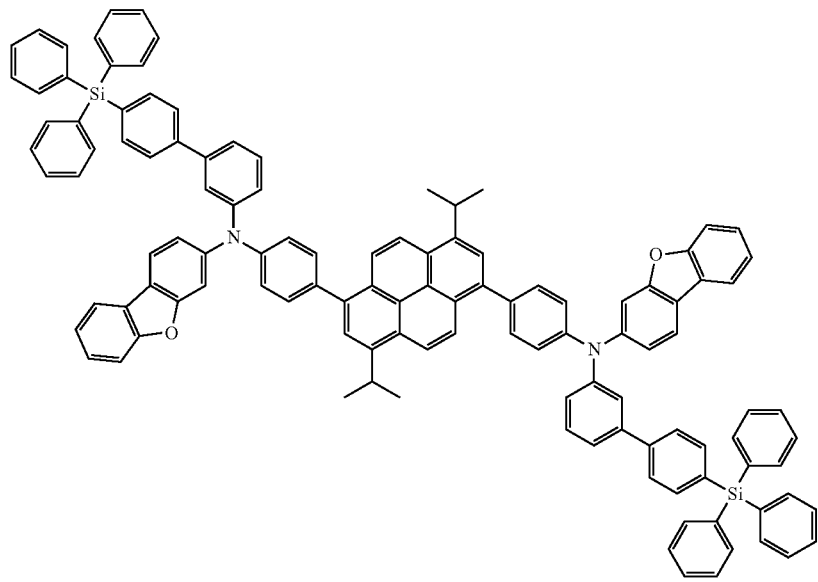
BD57
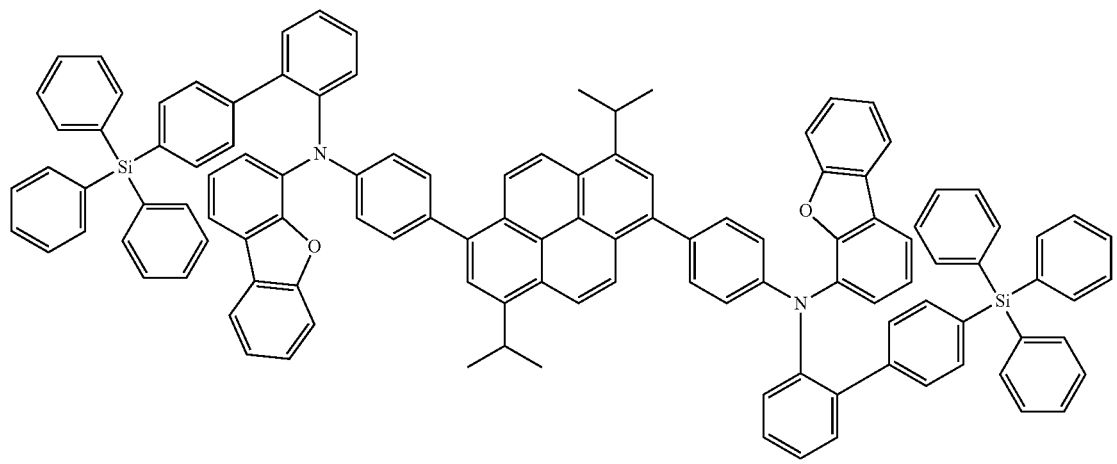
BD58
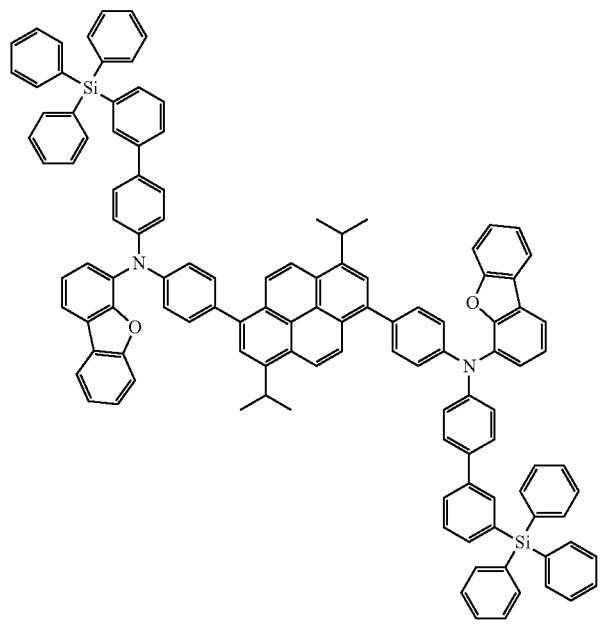

BD59
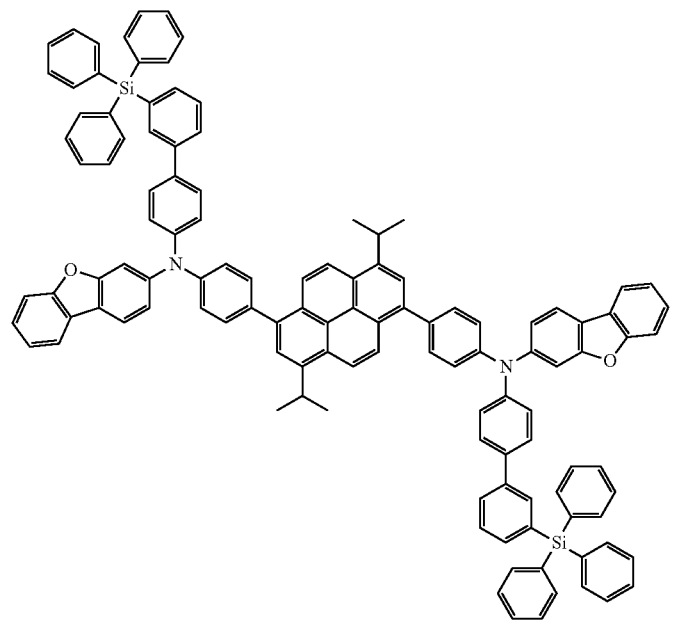
BD60
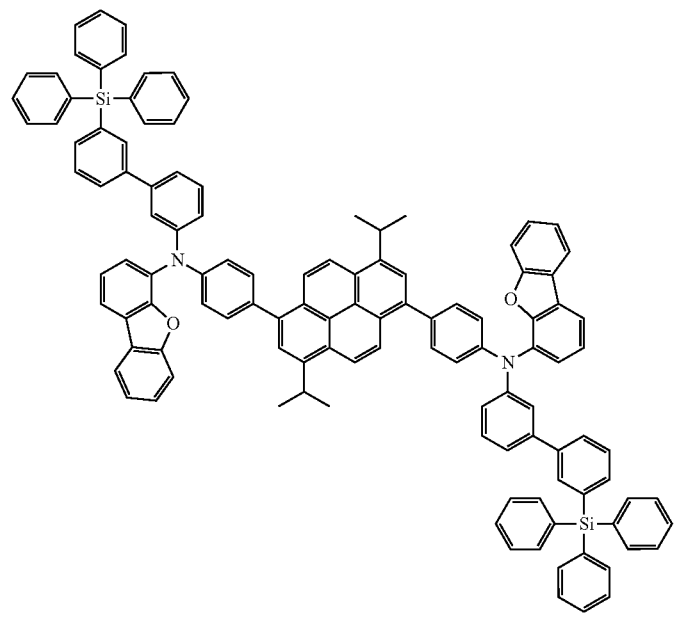

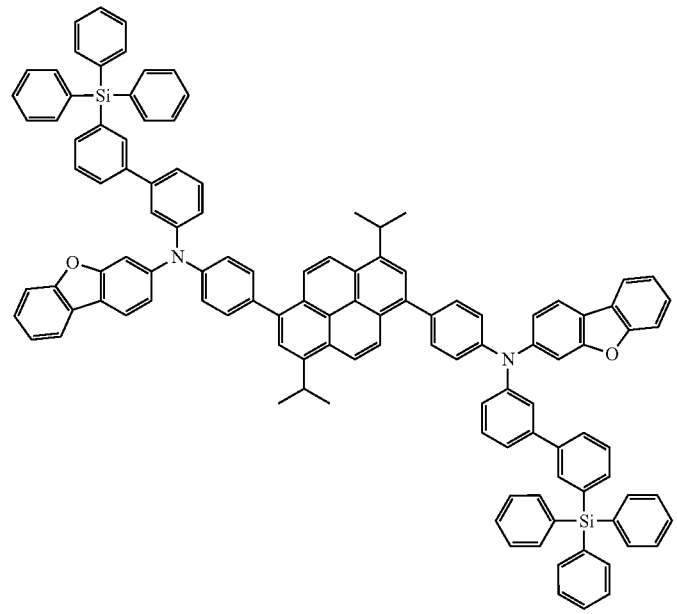
BD61
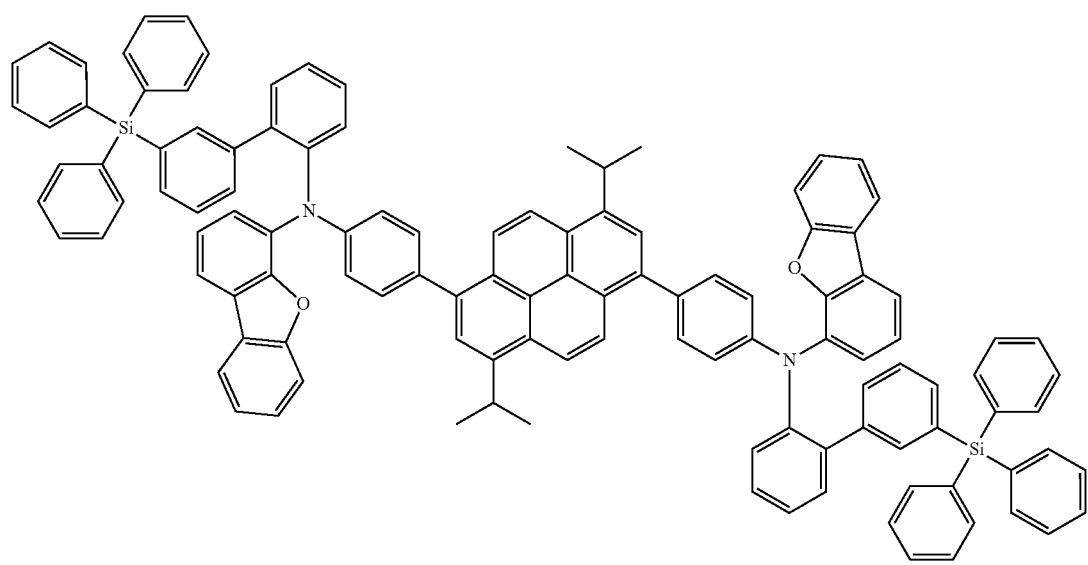
BD62

BD63
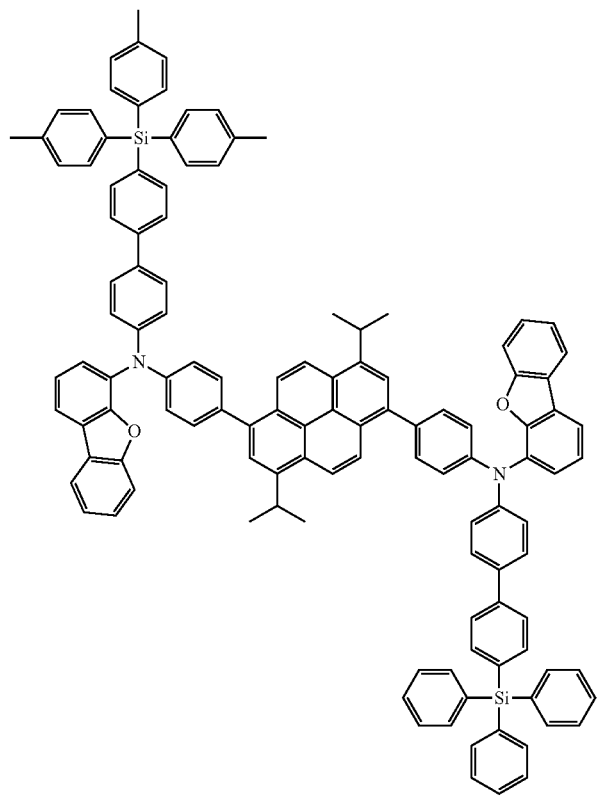
BD64
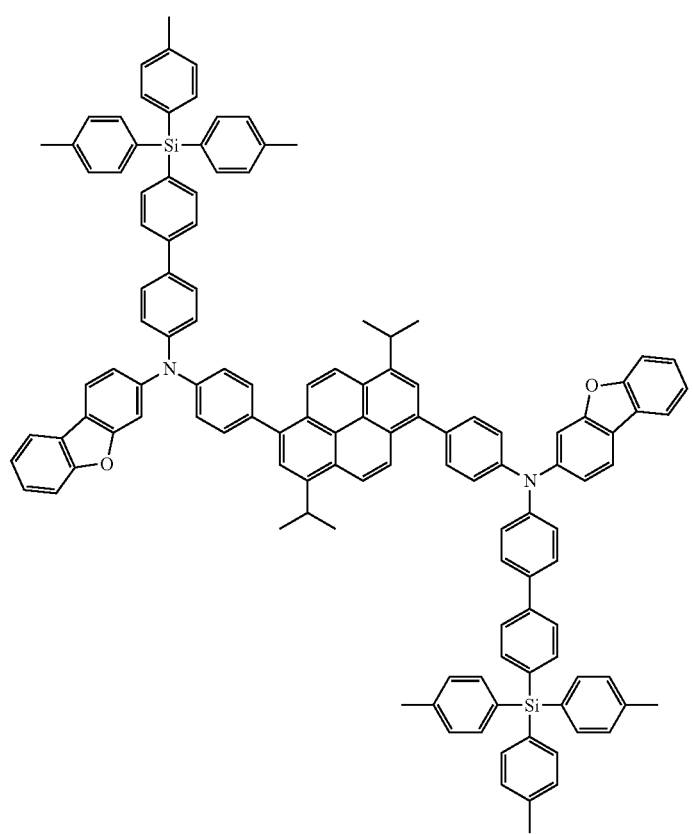

BD65
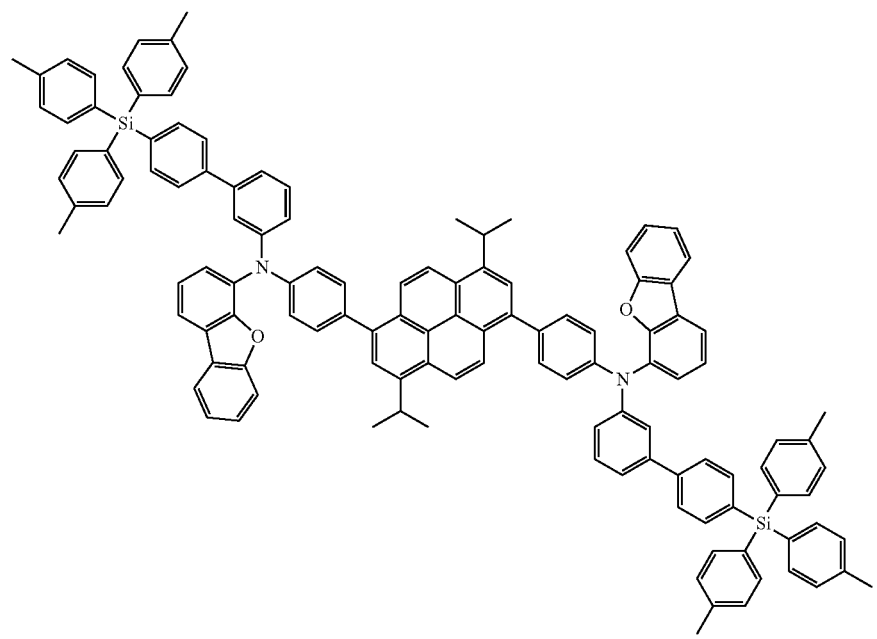
BD66
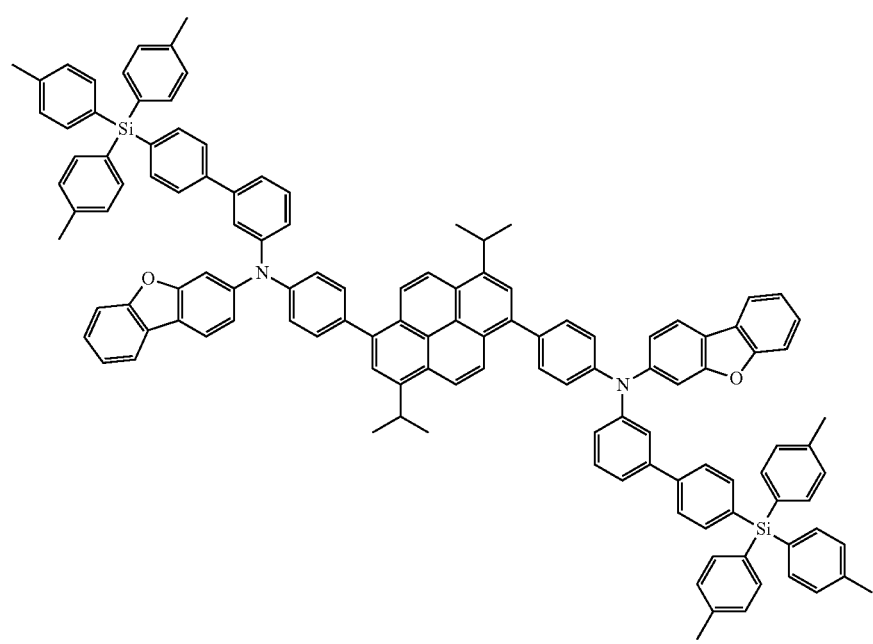

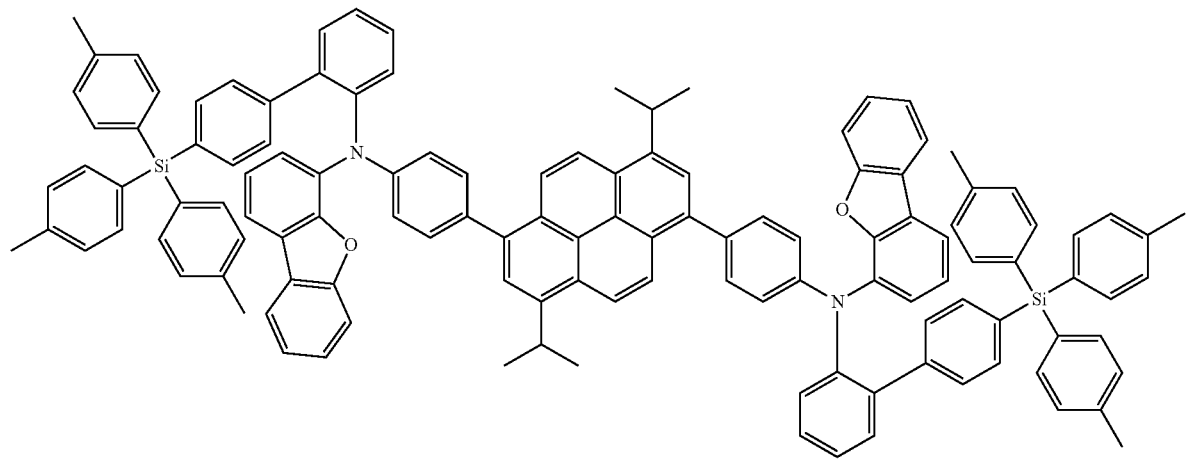
BD67
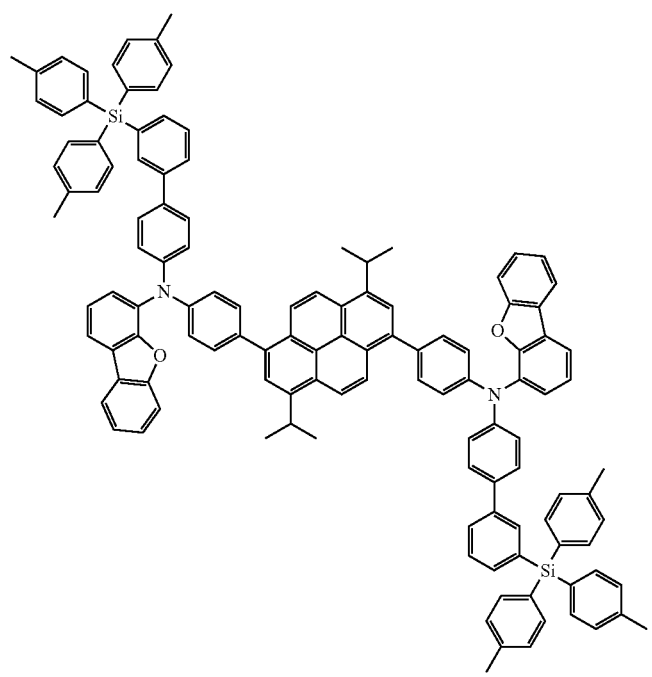
BD68

-continued
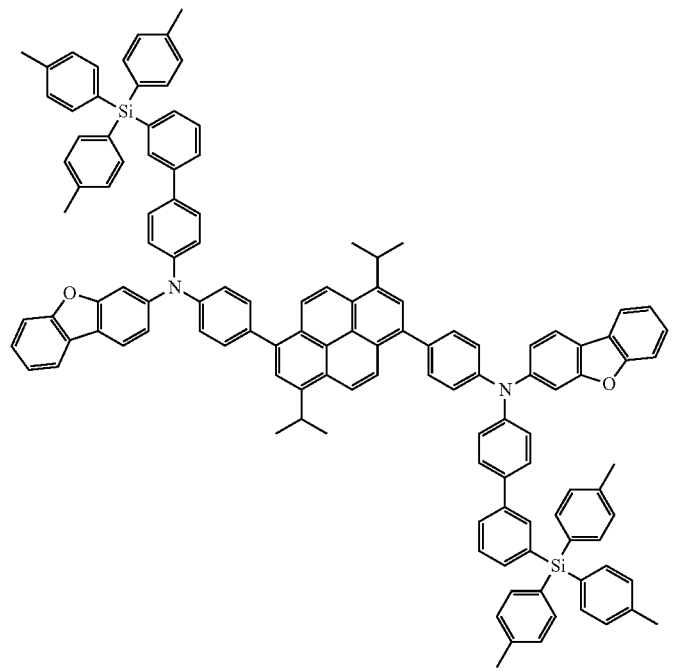
BD69
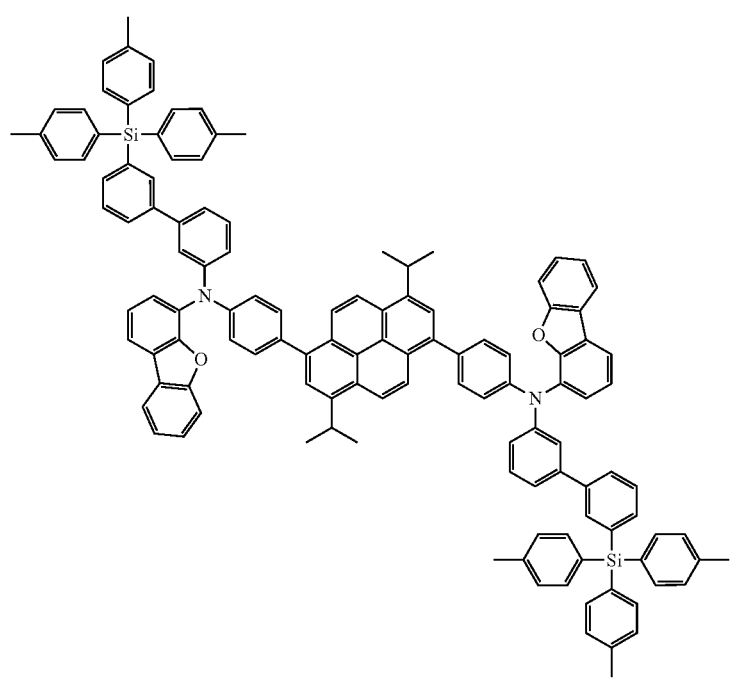
BD70

BD71
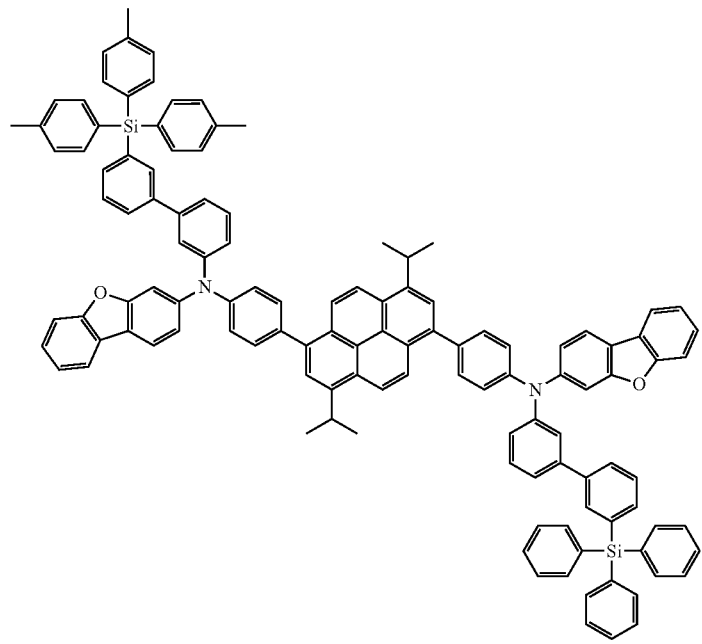
BD72

6. A coating composition comprising the compound according to claim 1.

7. The coating composition of claim 6, wherein the coating composition further comprises a compound represented by the following Formula H:

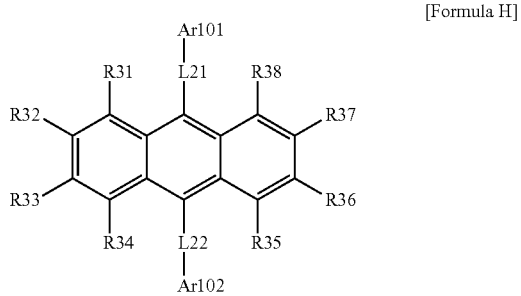

[Formula H]

in Formula H,

L21 and L22 are the same as or different from each other, and are each independently a direct bond; a substituted or unsubstituted arylene group; or a substituted or unsubstituted heteroarylene group, R31 to R38 are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted phosphine oxide group; a substituted or unsubstituted aryl group; or a substituted or unsubstituted heteroaryl group, and Ar101 and Ar102 are the same as or different from each other, and are each independently a substituted or unsubstituted aryl group; or a substituted or unsubstituted heteroaryl group.

8. An organic light emitting device comprising:
a first electrode;
a second electrode provided to face the first electrode; and
an organic material layer having one or more layers provided between the first electrode and the second electrode,
wherein the one or more layers of the organic material layer comprise a cured product of the coating composition of claim 6.

9. The organic light emitting device of claim 8, wherein the cured product of the coating composition is in a state in which the coating composition is cured by a heat treatment or a light treatment.

10. The organic light emitting device of claim 8, wherein the organic material layer comprises a light emitting layer, and the light emitting layer comprises the cured product of the coating composition.

11. The organic light emitting device of claim 8, wherein the organic material layer comprises a light emitting layer, and the light emitting layer comprises the compound represented by Formula 1 as a dopant of the light emitting layer.

12. A method for manufacturing an organic light emitting device, the method comprising:
preparing a substrate;
forming a first electrode on the substrate;
forming an organic material layer having one or more layers on the first electrode; and
forming a second electrode on the organic material layer,
wherein the forming of the organic material layer having one or more layers is performed by using the coating composition of claim 6.

13. The method of claim 12, wherein the forming of the organic material layer having one or more layers by using the coating composition uses an inkjet coating method or a spin coating method.

14. The method of claim 12, wherein the forming of the organic material layer having one or more layers by using the coating composition comprises:
coating the first electrode with the coating composition; and
drying and curing the coating composition.

15. The compound of claim 1, wherein Formula 1-1 is represented by the following Formulas 1-2-1 to 1-4-1:

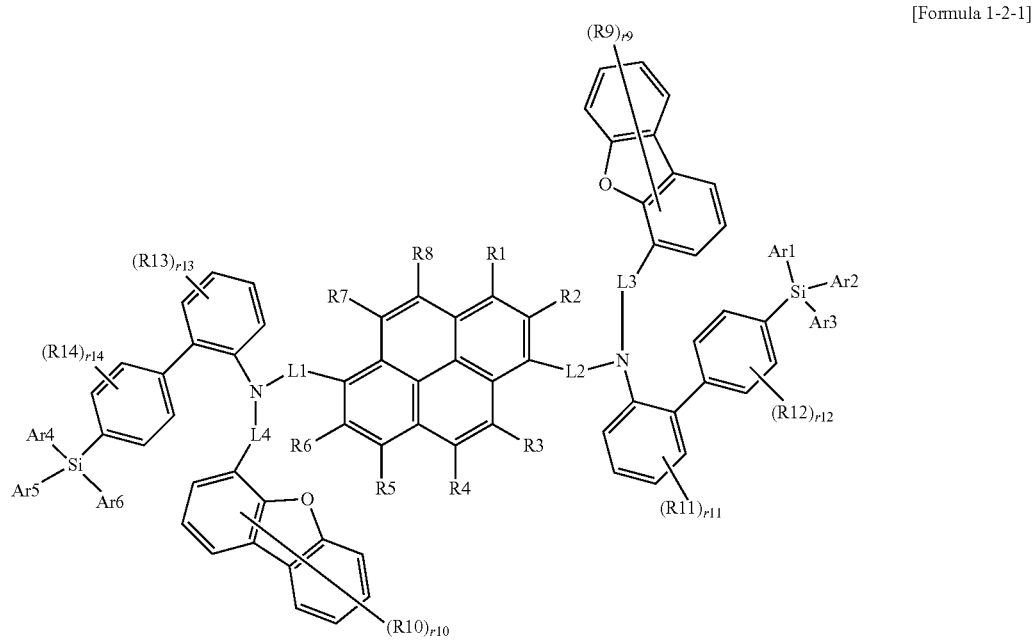

[Formula 1-2-1]

[Formula 1-3-1]

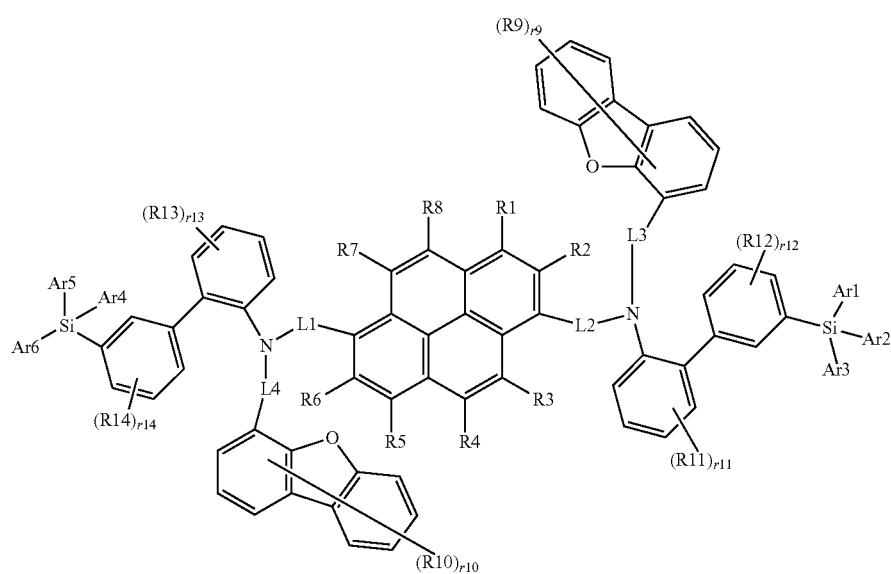

[Formula 1-4-1]

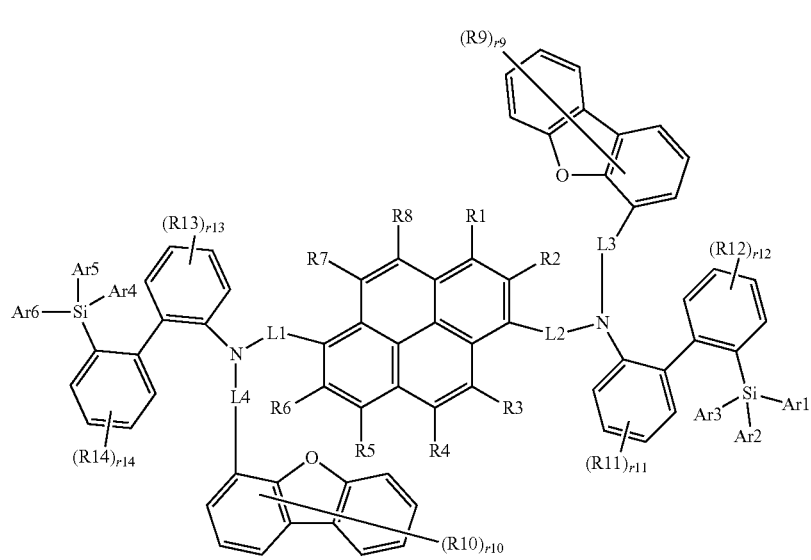

in Formulas 1-2-1 to 1-4-1, the definitions of L1 to L4, Ar1 to Ar6, R1 to R14, and r9 to r14 are the same as those defined in Formula 1-1.

16. The compound of claim 1, wherein L1 to L4 are the same as or different from each other, and are each independently a direct bond; or a phenylene group; Ar1 to Ar6 are the same as or different from each other, and are each independently a phenyl group which is unsubstituted or substituted with a methyl group; R1 and R5 are each an i-propyl group; R2 to R4 and R6 to R10 are each hydrogen; and R11 to R14 is fluorine; a cyano group; a hydroxyl group; a carboxyl group; —$CF_3$; or —$OCF_3$.

17. The organic light emitting device of claim 11, wherein the compound represented by Formula 1 is included as a blue dopant of the light emitting layer.

18. The coating composition of claim 7, wherein the compound represented by Formula 1 is included as a dopant, and the compound represented by Formula H is included as a host; and a mass ratio of the host to the dopant is 80:20 to 99:1.

* * * * *